United States Patent
Chen et al.

(10) Patent No.: US 10,727,346 B2
(45) Date of Patent: Jul. 28, 2020

(54) FINFET DEVICE AND METHOD OF FORMING

(71) Applicant: Taiwan Semiconductor Manufacturing Company, Ltd., Hsinchu (TW)

(72) Inventors: Xi-Zong Chen, Tainan (TW); Te-Chih Hsiung, Taipei (TW); Cha-Hsin Chao, Taipei (TW); Yi-Wei Chiu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/201,266

(22) Filed: Nov. 27, 2018

(65) Prior Publication Data

US 2019/0097038 A1    Mar. 28, 2019

Related U.S. Application Data

(60) Continuation of application No. 15/830,742, filed on Dec. 4, 2017, now Pat. No. 10,153,373, which is a
(Continued)

(51) Int. Cl.
*H01L 21/768* (2006.01)
*H01L 29/78* (2006.01)
(Continued)

(52) U.S. Cl.
CPC ........ *H01L 29/785* (2013.01); *H01L 21/0273* (2013.01); *H01L 21/31051* (2013.01);
(Continued)

(58) Field of Classification Search
CPC .......... H01L 29/785; H01L 21/823431; H01L 21/823871; H01L 29/66545; H01L 21/845; H01L 21/823821; H01L 21/823475; H01L 23/535; H01L 21/31144; H01L 21/32115; H01L 21/31051; H01L 21/76877;
(Continued)

(56) References Cited

U.S. PATENT DOCUMENTS 7,667,271 B2    2/2010   Yu et al.
7,910,453 B2    3/2011   Xu et al.
(Continued)

*Primary Examiner* — David Vu
(74) *Attorney, Agent, or Firm* — Slater Matsil, LLP

(57) ABSTRACT

A finFET device and a method of forming are provided. The device includes a transistor comprising a gate electrode and a first source/drain region next to the gate electrode, the gate electrode being disposed over a first substrate. The device also includes a first dielectric layer extending along the first source/drain region, and a second dielectric layer overlying the first dielectric layer. The device also includes a contact disposed in the first dielectric layer and in the second dielectric layer, the contact contacting the gate electrode and the first source/drain region. A first portion of the first dielectric layer extends between the contact and the gate electrode. The contact extends along a sidewall of the first portion of the first dielectric layer and a first surface of the first portion of the first dielectric layer, the first surface of the first portion being farthest from the first substrate.

20 Claims, 46 Drawing Sheets

Related U.S. Application Data division of application No. 15/363,273, filed on Nov. 29, 2016, now Pat. No. 9,837,539.

(51) Int. Cl.

| | | |
|---|---|---|
| *H01L 21/3105* | (2006.01) | |
| *H01L 21/321* | (2006.01) | |
| *H01L 21/311* | (2006.01) | |
| *H01L 21/027* | (2006.01) | |
| *H01L 29/66* | (2006.01) | |
| *H01L 29/08* | (2006.01) | |
| *H01L 23/535* | (2006.01) | |
| *H01L 21/8234* | (2006.01) | |
| *H01L 21/8238* | (2006.01) | |
| *H01L 21/84* | (2006.01) | |

(52) U.S. Cl.
CPC .. *H01L 21/31144* (2013.01); *H01L 21/32115* (2013.01); *H01L 21/76802* (2013.01); *H01L 21/76877* (2013.01); *H01L 21/823431* (2013.01); *H01L 21/823475* (2013.01); *H01L 21/823821* (2013.01); *H01L 21/823871* (2013.01); *H01L 21/845* (2013.01); *H01L 23/535* (2013.01); *H01L 29/0847* (2013.01); *H01L 29/66545* (2013.01); *H01L 29/66795* (2013.01)

(58) Field of Classification Search
CPC ........... H01L 21/76802; H01L 29/0847; H01L 29/66795; H01L 21/0273
See application file for complete search history.

(56) References Cited

U.S. PATENT DOCUMENTS

| | | | |
|---|---|---|---|
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Vann et al. |
| 8,823,065 | B2 | 9/2014 | Wang et al. |
| 8,860,148 | B2 | 10/2014 | Hu et al. |
| 9,064,931 | B2 * | 6/2015 | Hung ................... H01L 23/485 |
| 9,105,490 | B2 | 8/2015 | Wang et al. |
| 9,190,404 | B2 * | 11/2015 | Lee ..................... H01L 27/088 |
| 2011/0294292 | A1 * | 12/2011 | Adetutu ........... H01L 21/76807 |
| | | | 438/675 |
| 2014/0001574 | A1 | 1/2014 | Chen et al. |
| 2014/0110755 | A1 | 4/2014 | Colinge |
| 2014/0151812 | A1 | 6/2014 | Liaw |
| 2014/0346575 | A1 | 11/2014 | Chen et al. |
| 2015/0060960 | A1 | 3/2015 | Xie et al. |
| 2015/0137194 | A1 | 5/2015 | Wei |

\* cited by examiner

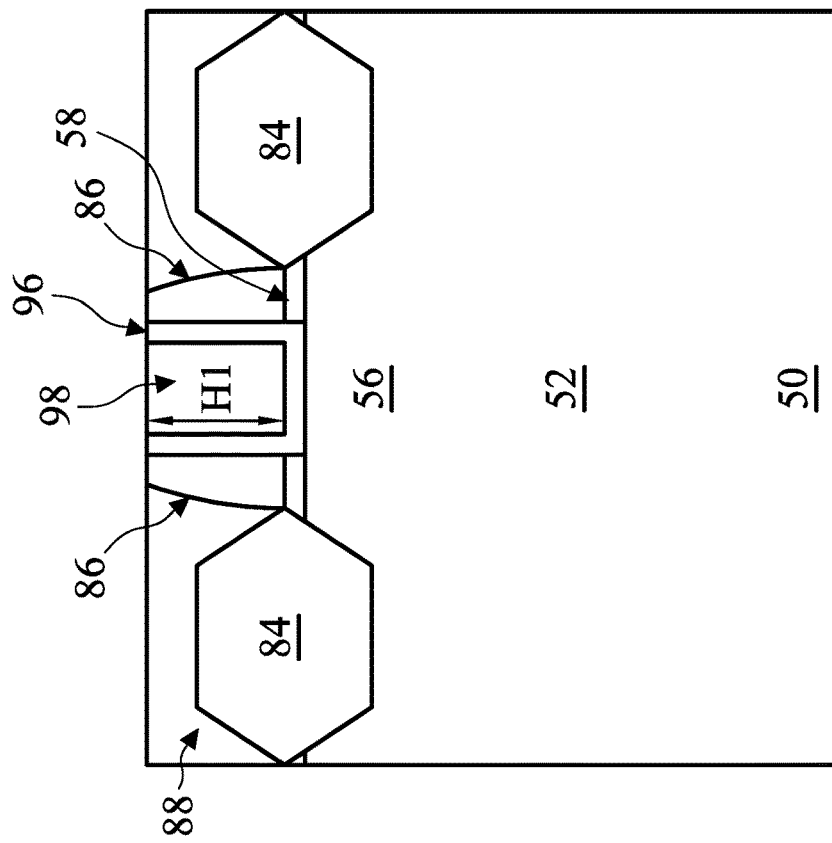
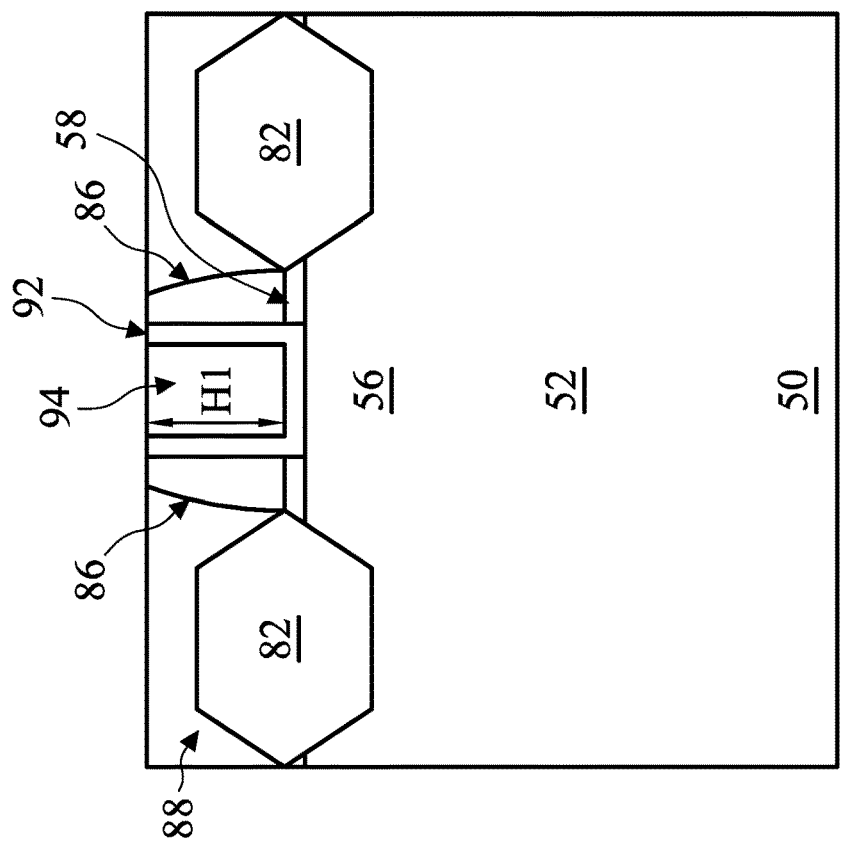
Figure 14C
Figure 14B

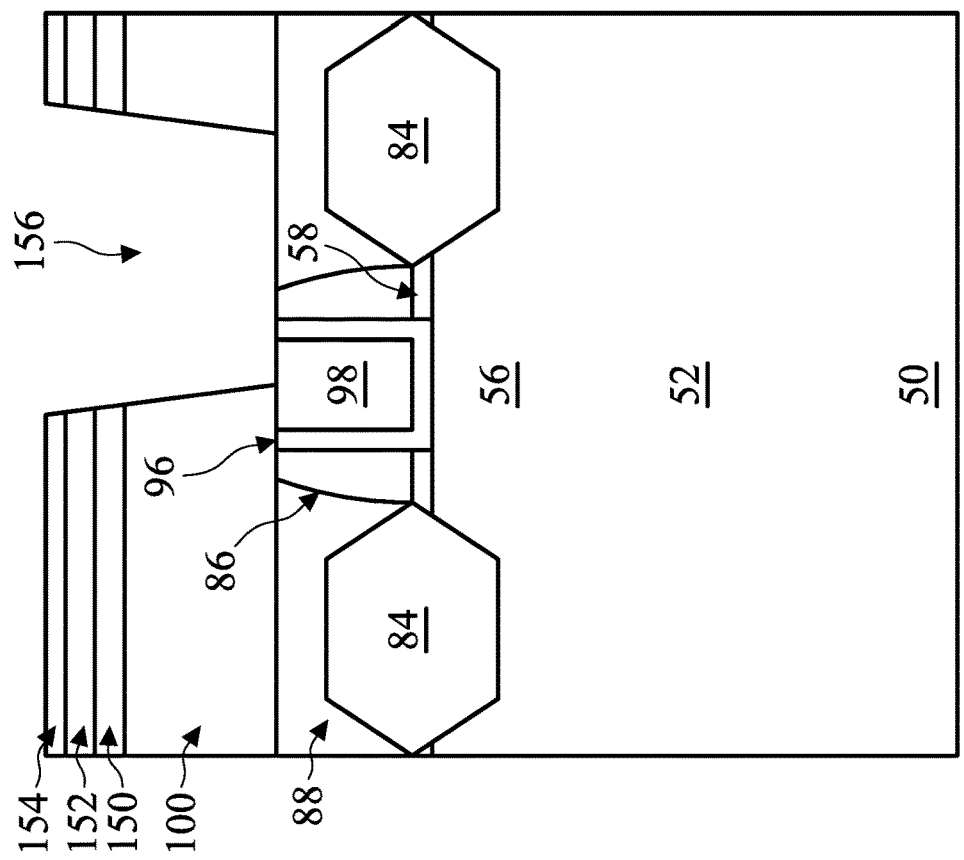
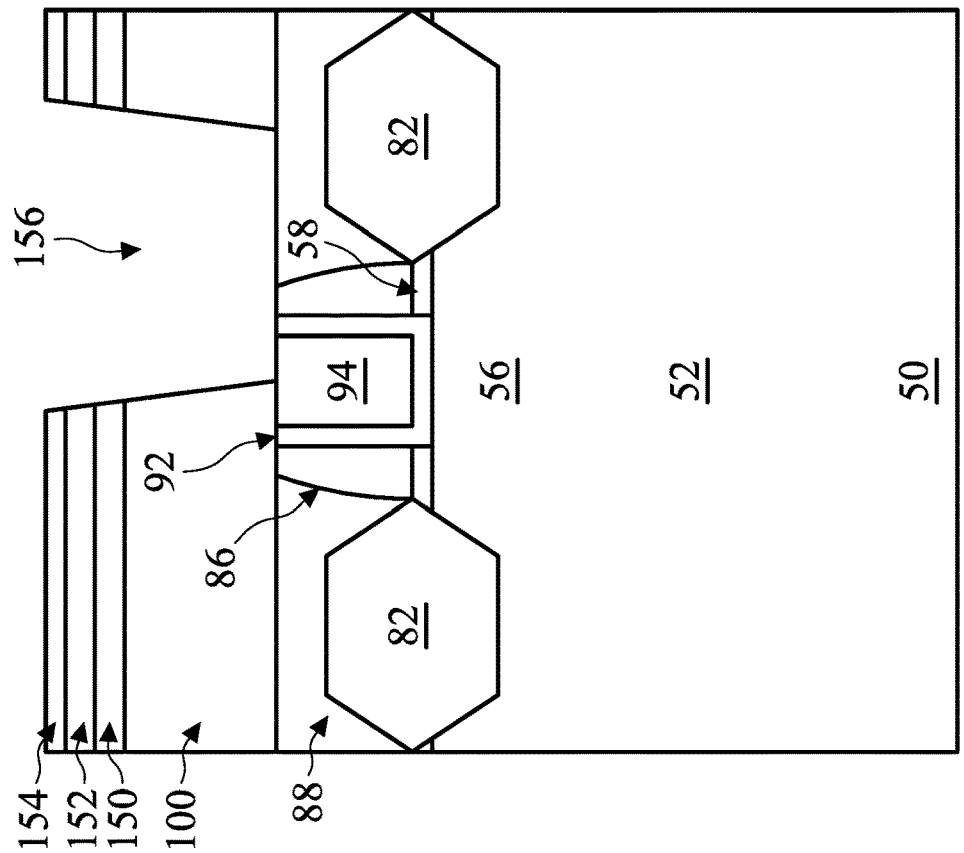
Figure 18B
Figure 18C

FINFET DEVICE AND METHOD OF FORMING

CROSS-REFERENCE TO RELATED APPLICATIONS

This application is a continuation of U.S. patent application Ser. No. 15/830,742, filed on Dec. 4, 2017, which is a divisional of U.S. patent application Ser. No. 15/363,273, filed on Nov. 29, 2016, now U.S. Pat. No. 9,837,539, issued Dec. 5, 2017, which applications are hereby incorporated herein by reference.

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its k-value, and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7C, 8A-8C, 9A-9C, 10A-10C, 11A-11C, 12A-12C, 13A-13C, 14A-14C, 15A-15C, 16A-16C, 17A-17C, 18A-18C, 19A-19C, 20A-20C, 21A-21C, 22A-22C, 23A-23C, 24A-24C, 25A-25C, and 26A-26C, are cross sectional views of intermediate stages of forming a finFET device in accordance with some embodiments.

DETAILED DESCRIPTION

Figure 1:
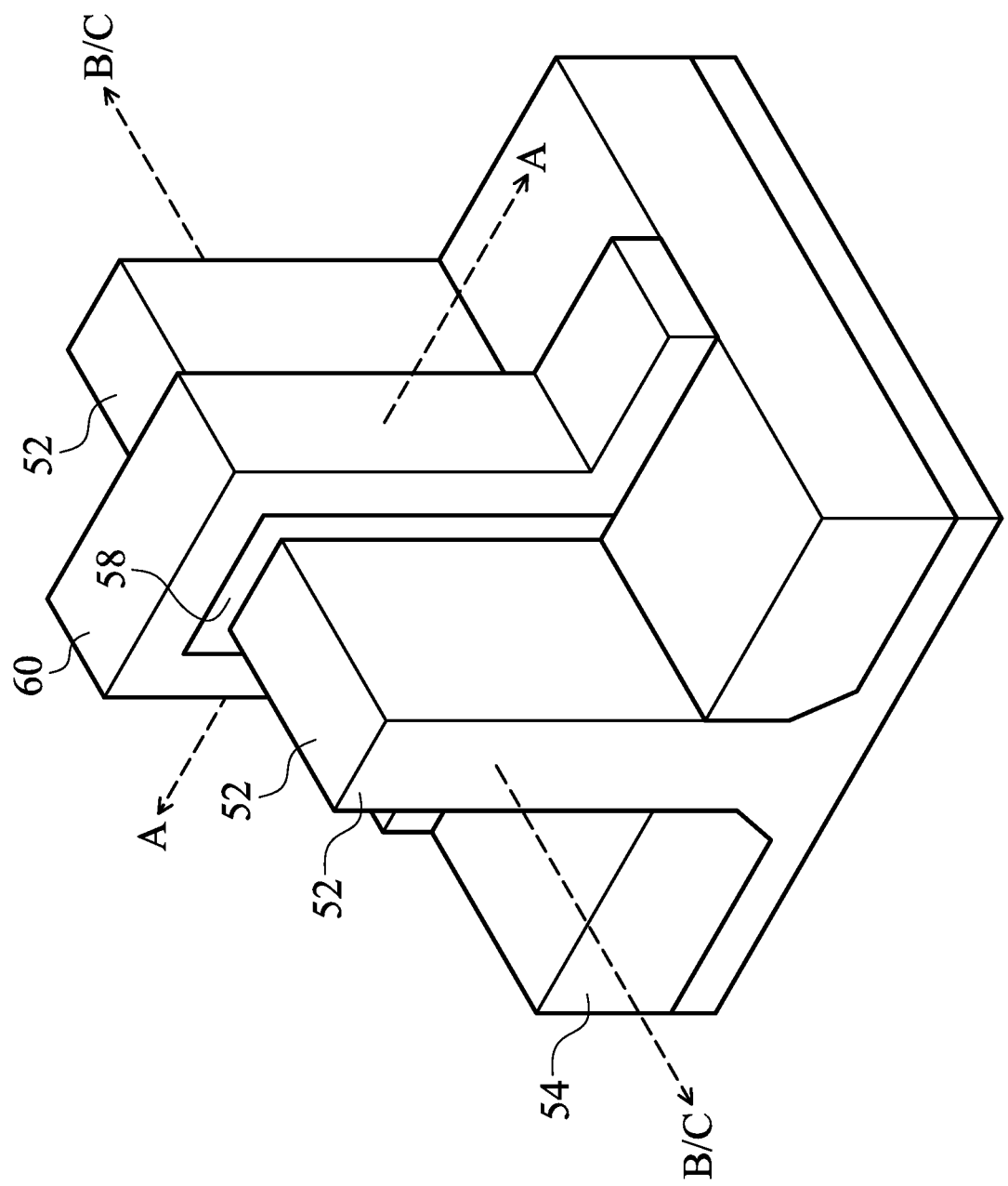
FIG. 1 is a perspective view of a fin field effect transistor (finFET) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 2 through 26A-C are cross-sectional views of intermediate stages in the manufacturing of FinFETs in accordance with exemplary embodiments. FIGS. 2 through 6 illustrate reference cross-section A-A illustrated in FIG. 1, except for multiple FinFETs. In FIGS. 7 through 26A-C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
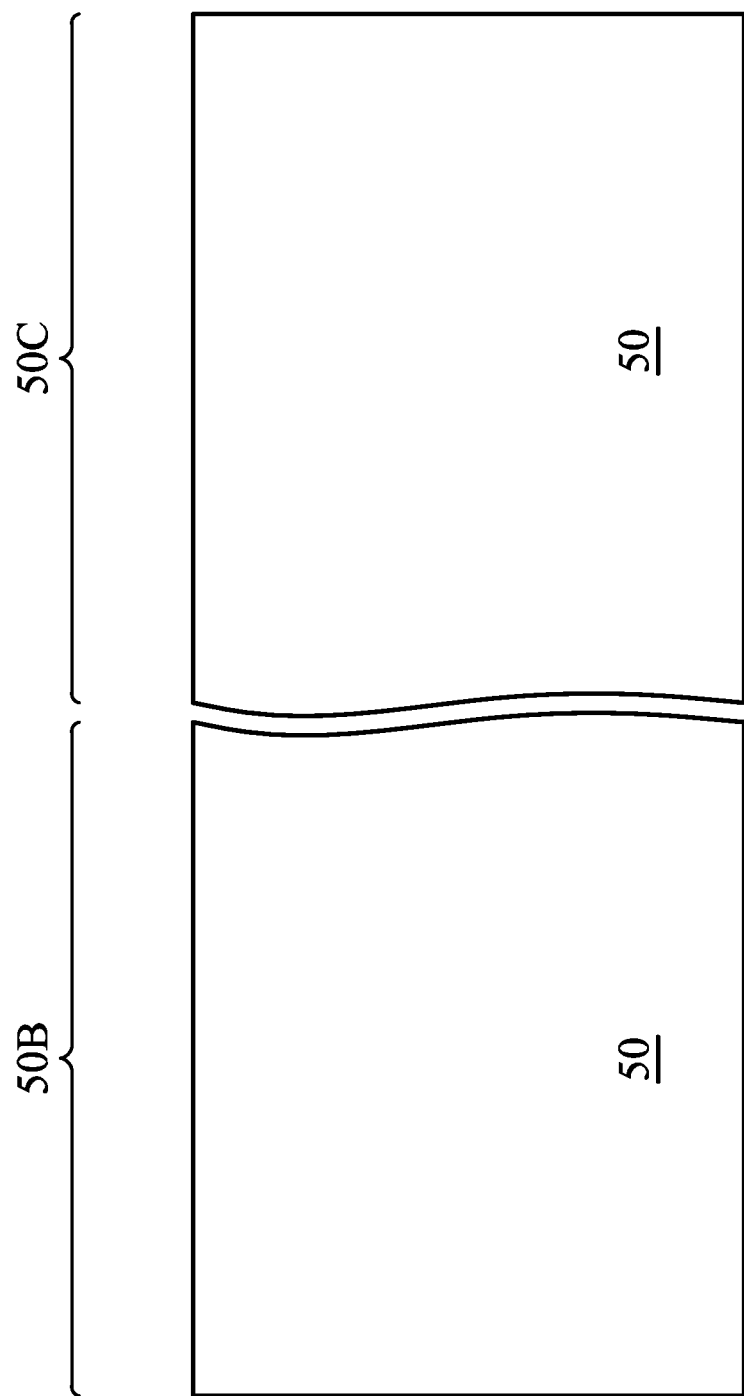
FIGS. 2-6 are cross sectional views of intermediate stages of forming a finFET device in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 3:
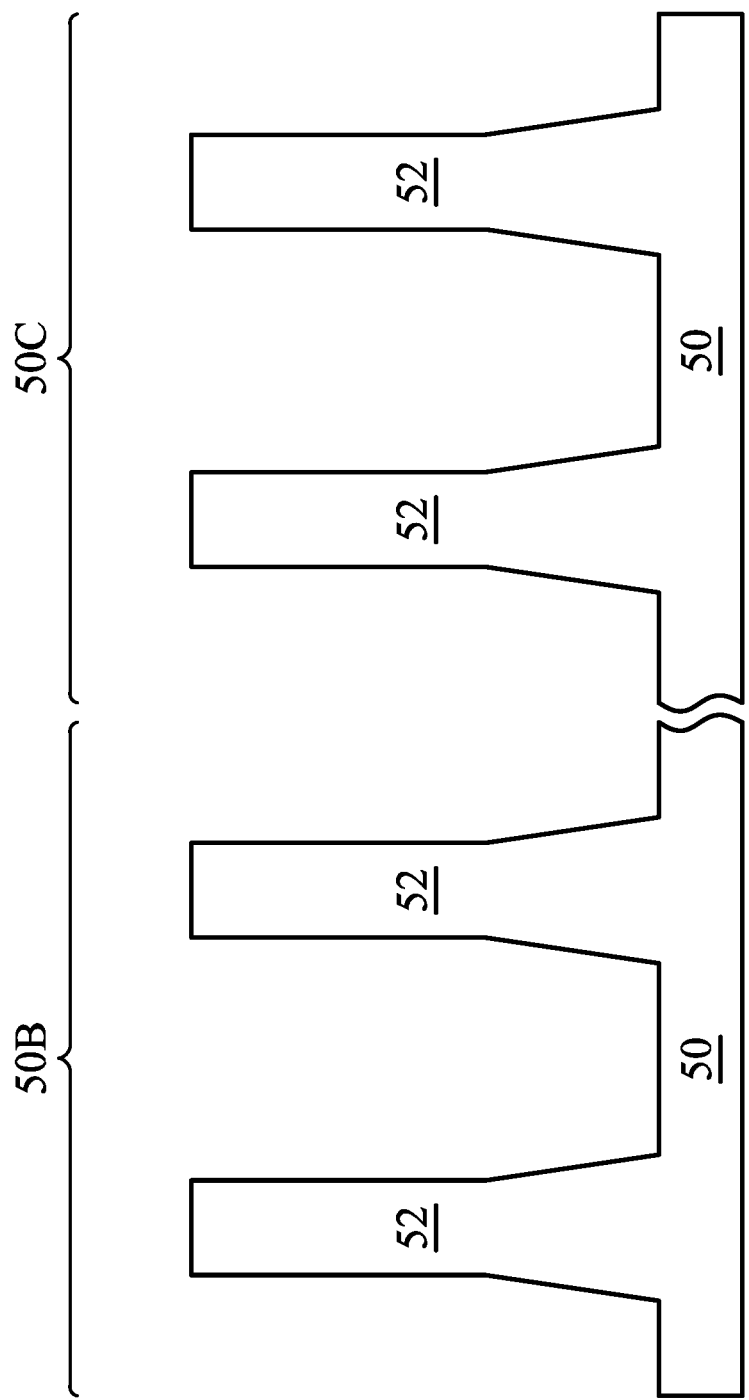
Figure 4:
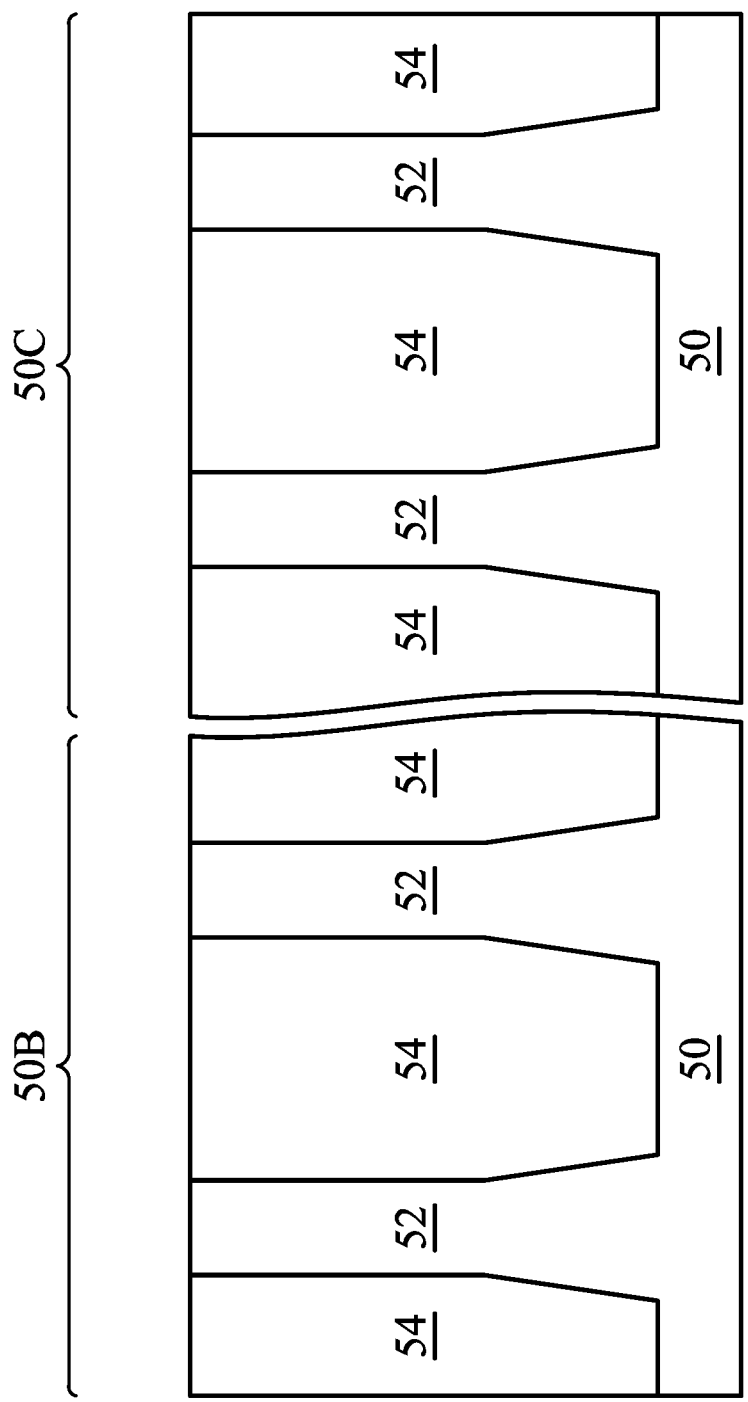

FIGS. 3 and 4 illustrate the formation of fins 52 and isolation regions 54 between neighboring fins 52. In FIG. 3 fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4 an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) method (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. Further in FIG. 5, a planarization process, such as a chemical mechanical polish (CMP), may remove any excess insulation material 54 and form top surfaces of the isolation regions 54 and top surfaces of the fins 52 that are coplanar.

Figure 5:
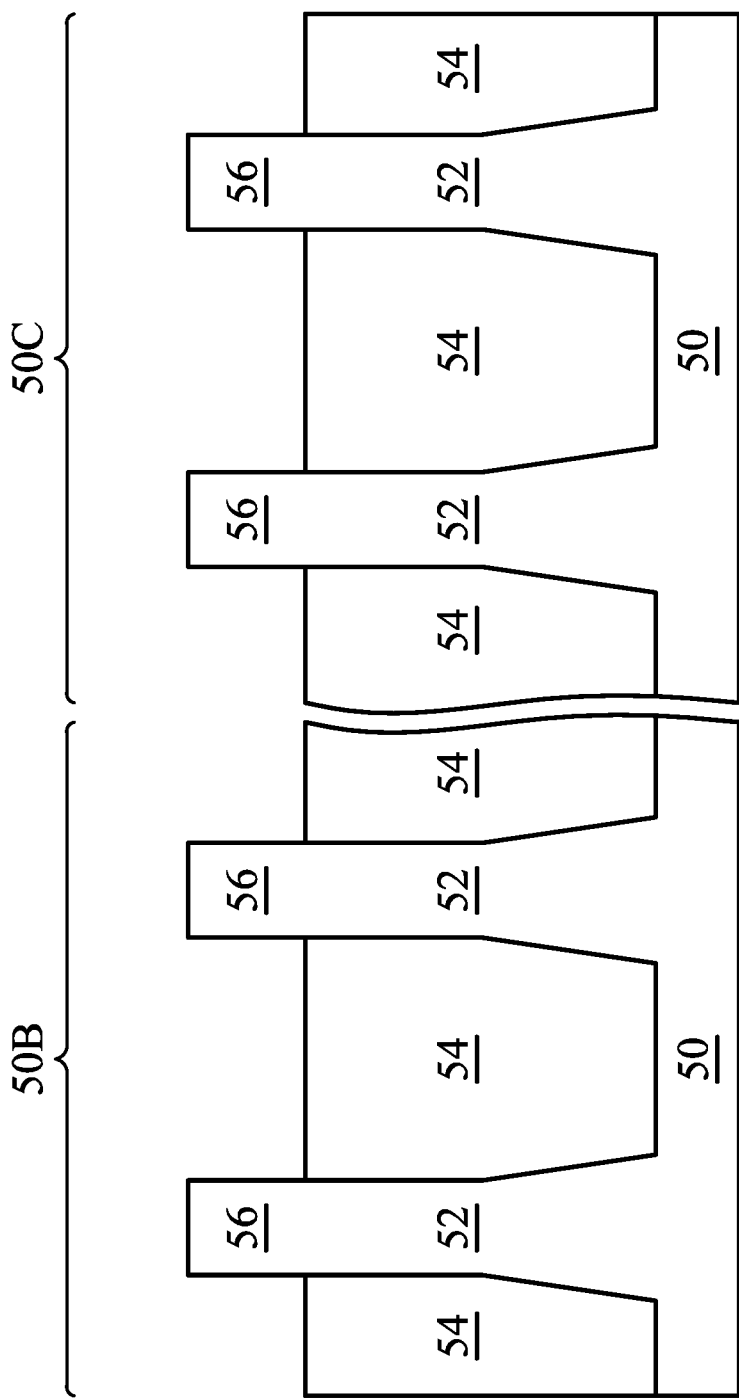

FIG. 5 illustrates the recessing of the isolation regions 54 to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 5, appropriate wells may be formed in the fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 6:
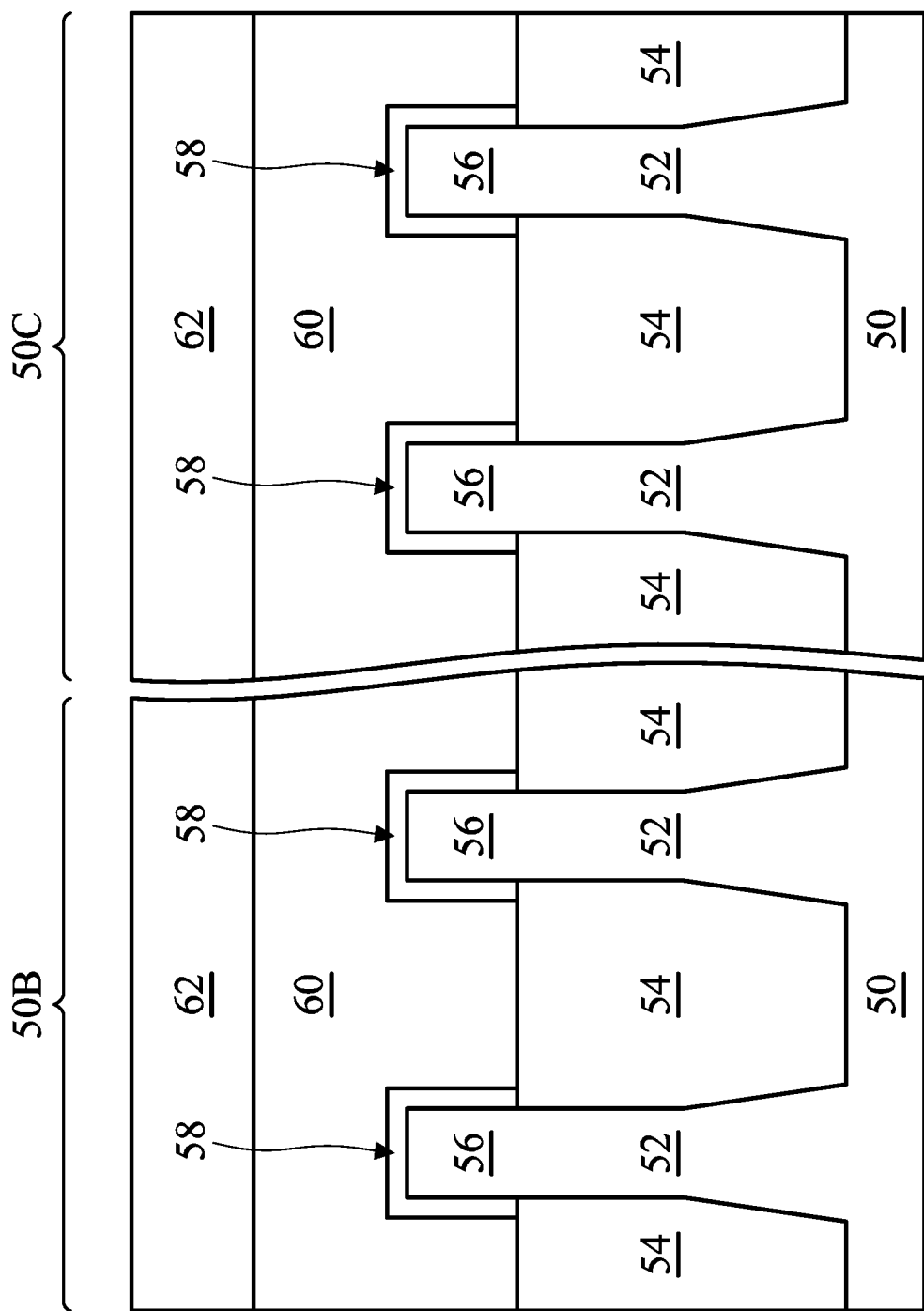

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 7A:
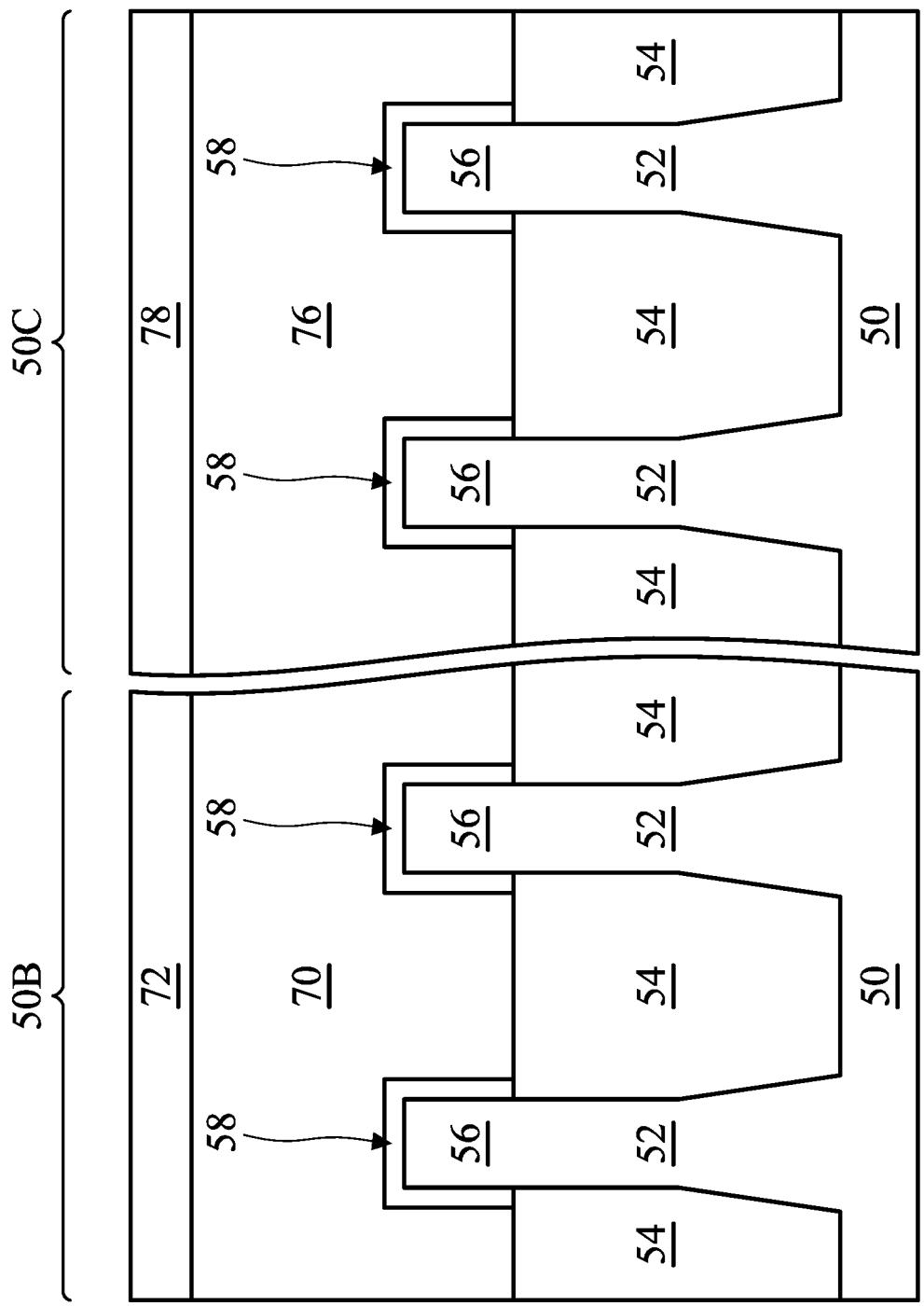
Figure 7C:
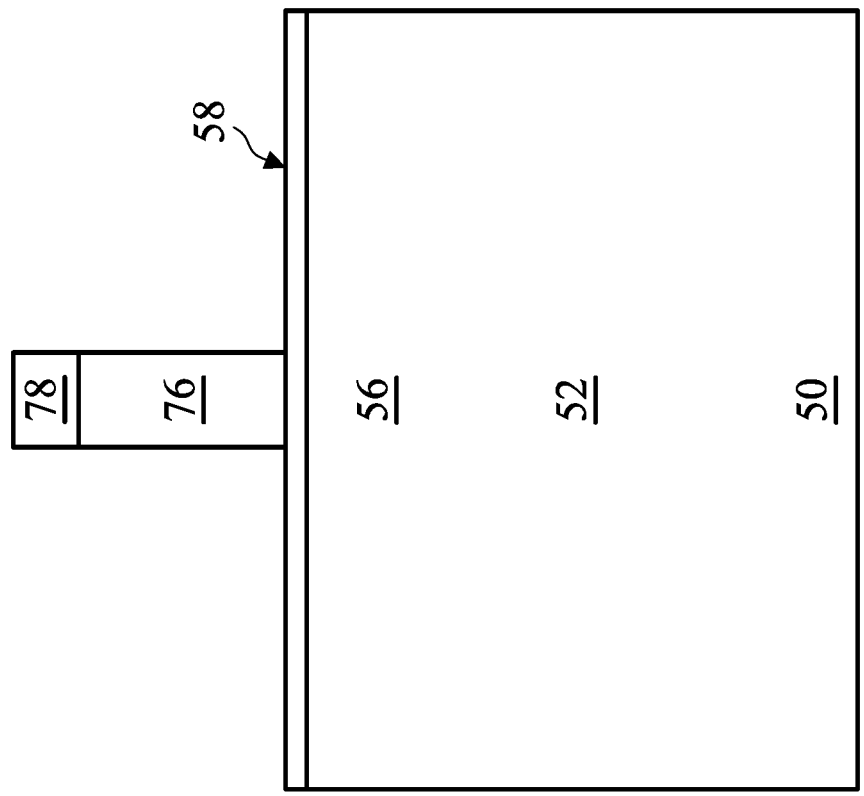
Figure 7B:
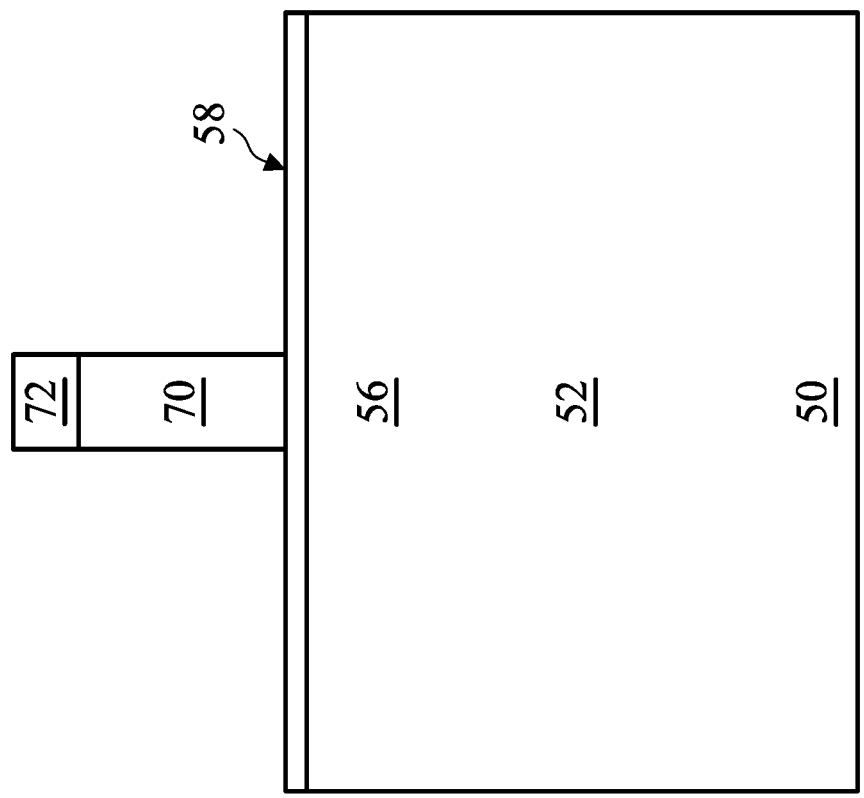

In FIGS. 7A, 7B, and 7C, the mask layer 62 may be patterned using acceptable photolithography and etching techniques to form masks 72 in the first region 50B and masks 78 in the second region 50C. The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 8A:
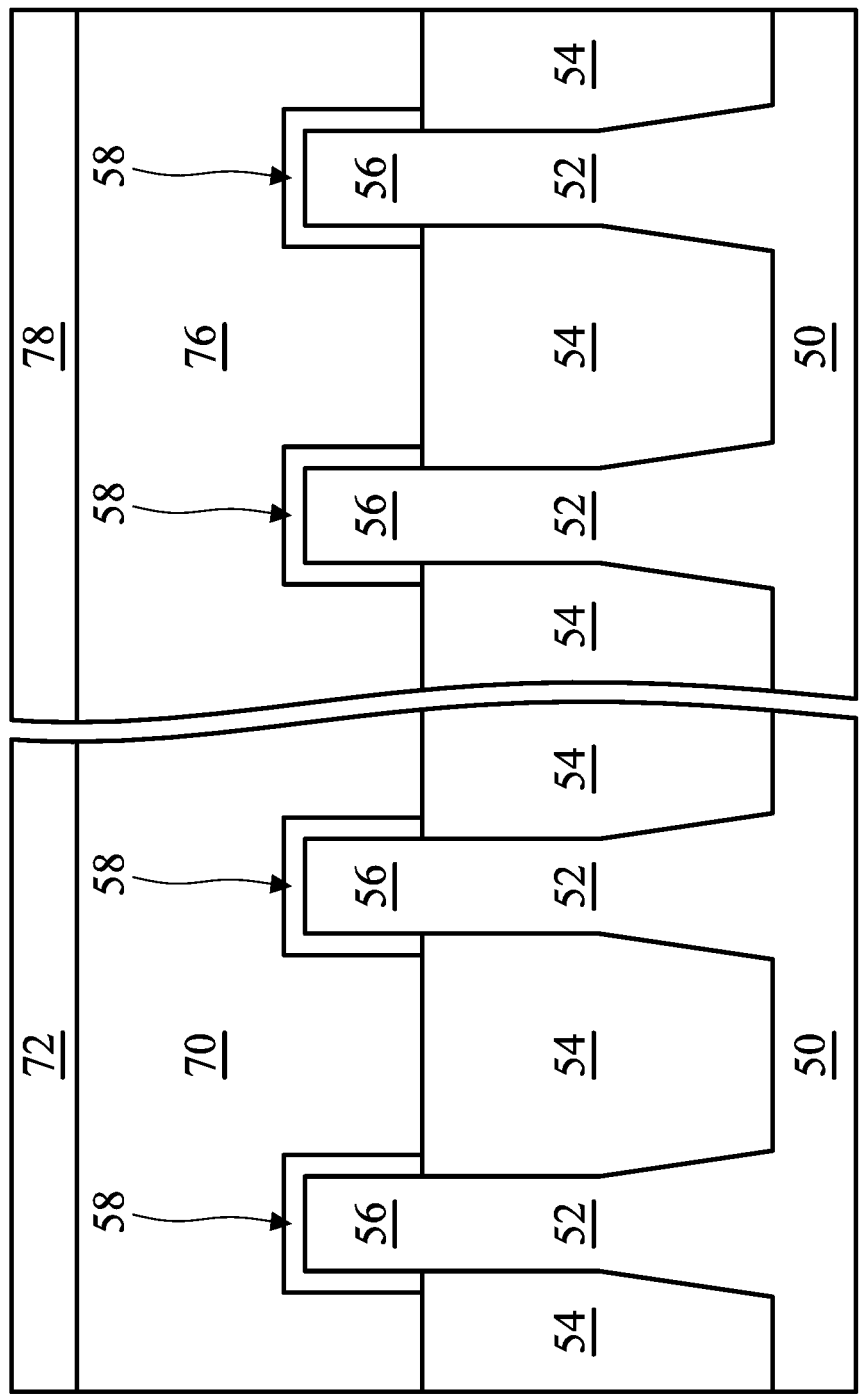
Figure 8C:
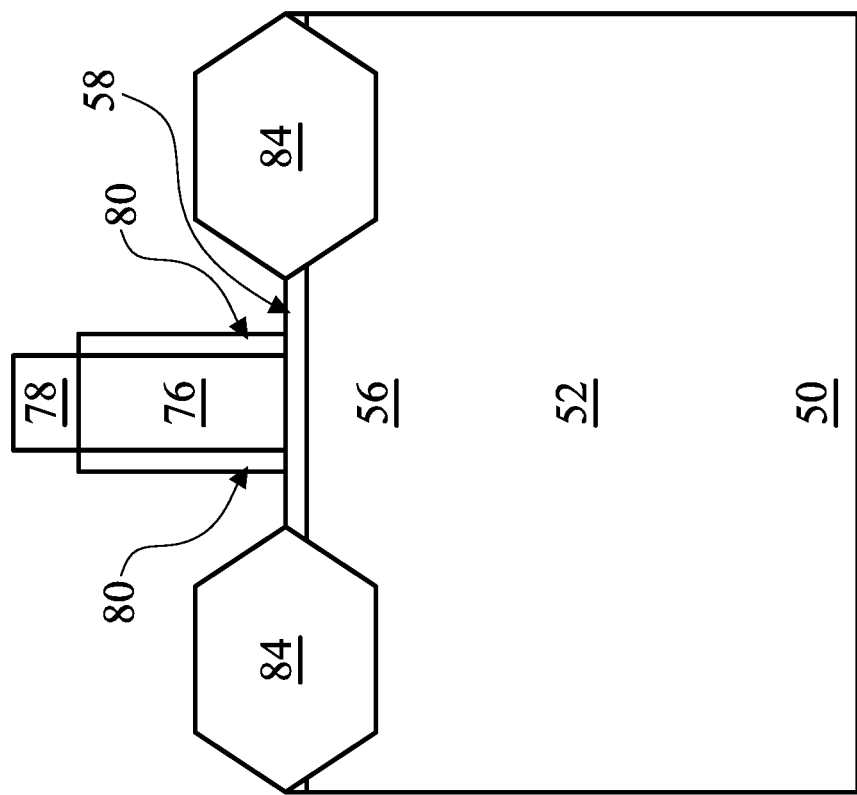
Figure 8B:
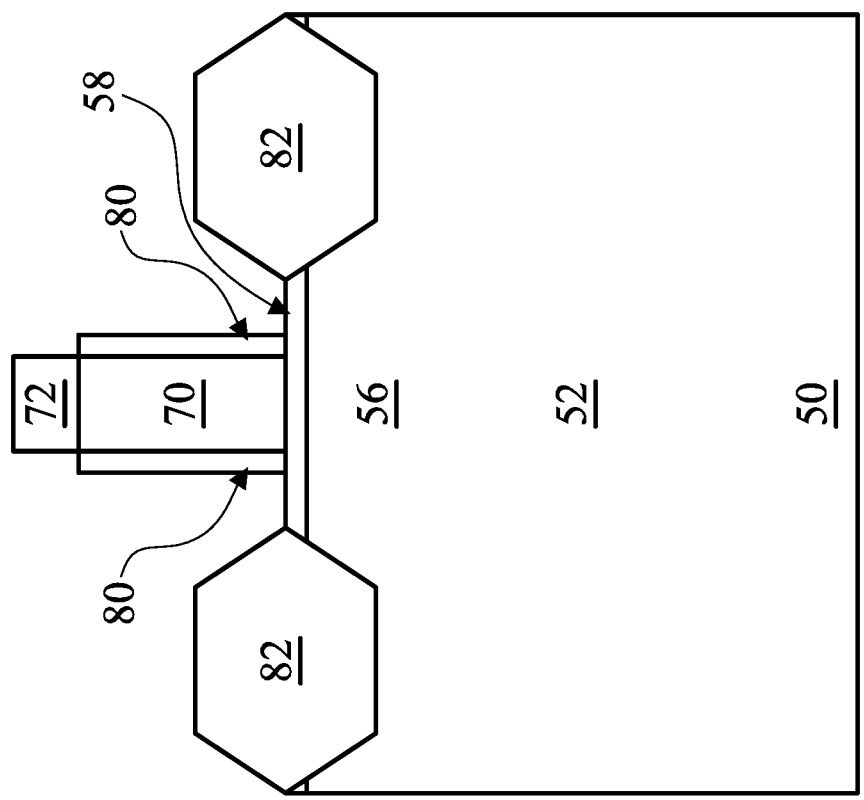

In FIGS. 8A, 8B, and 8C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 5, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 8A, 8B, and 8C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 9A:
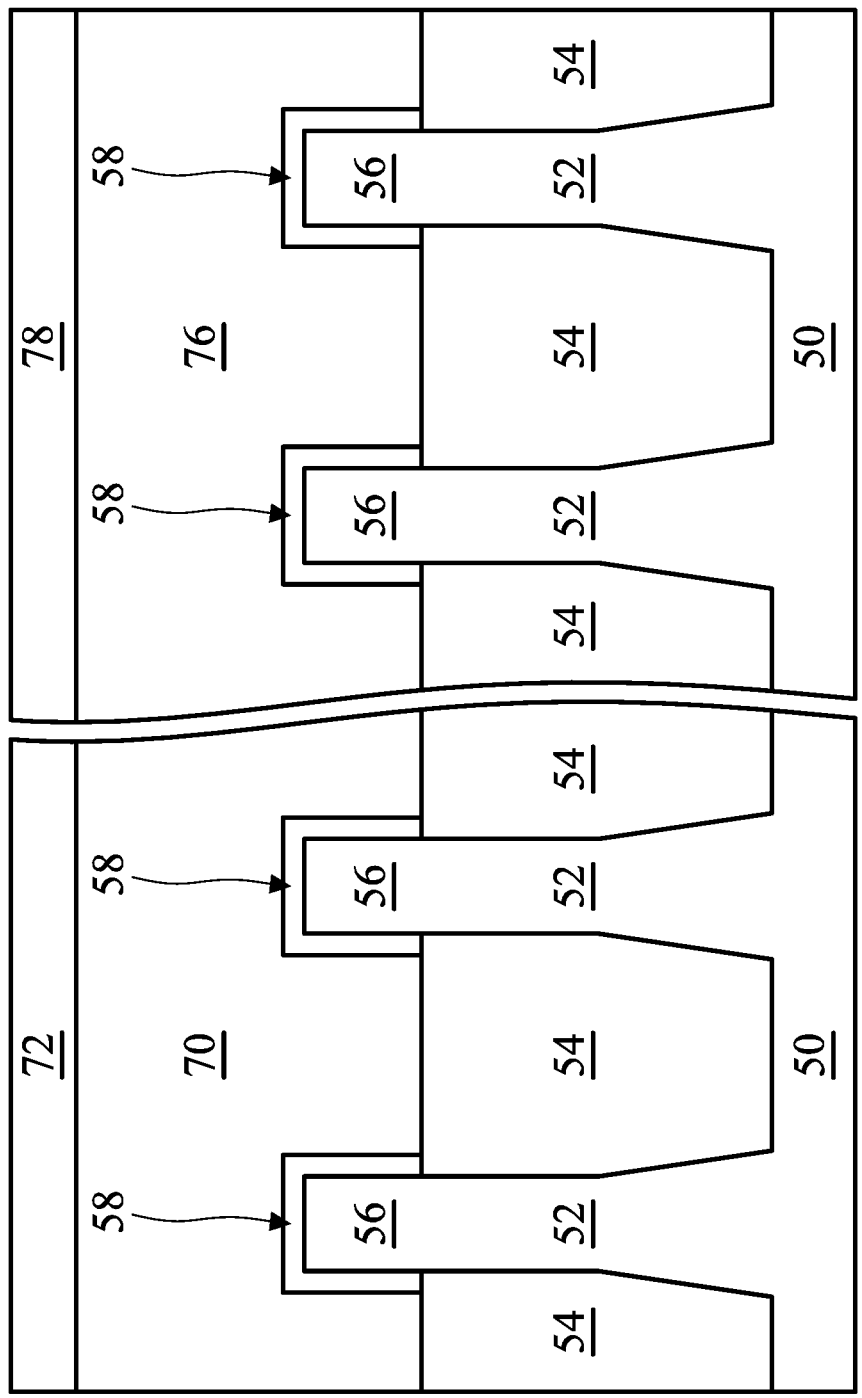
Figure 9C:
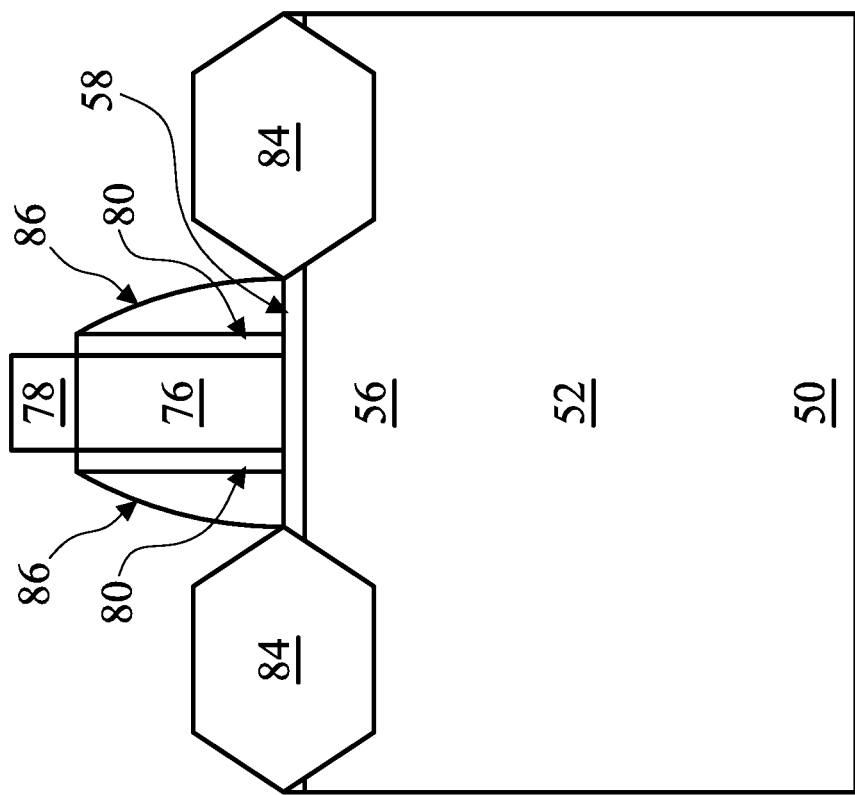
Figure 9B:
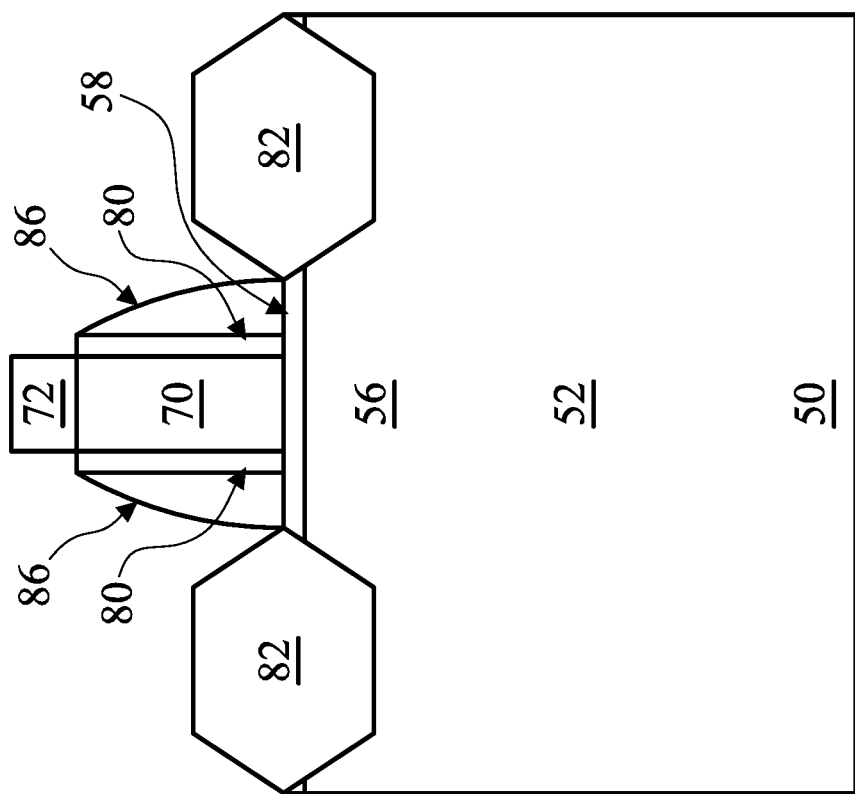

In FIGS. 9A, 9B, and 9C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 10A:
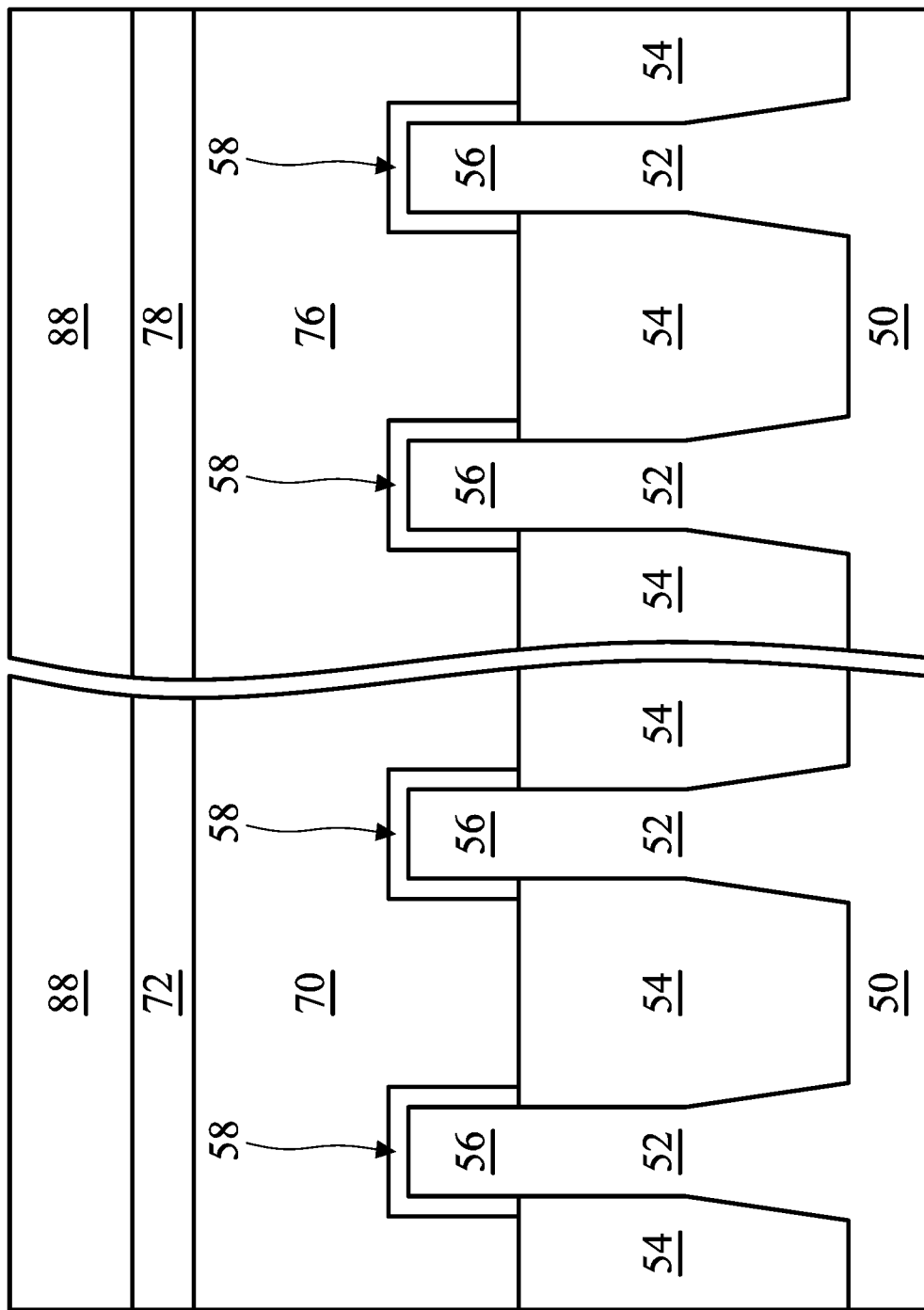
Figure 10C:
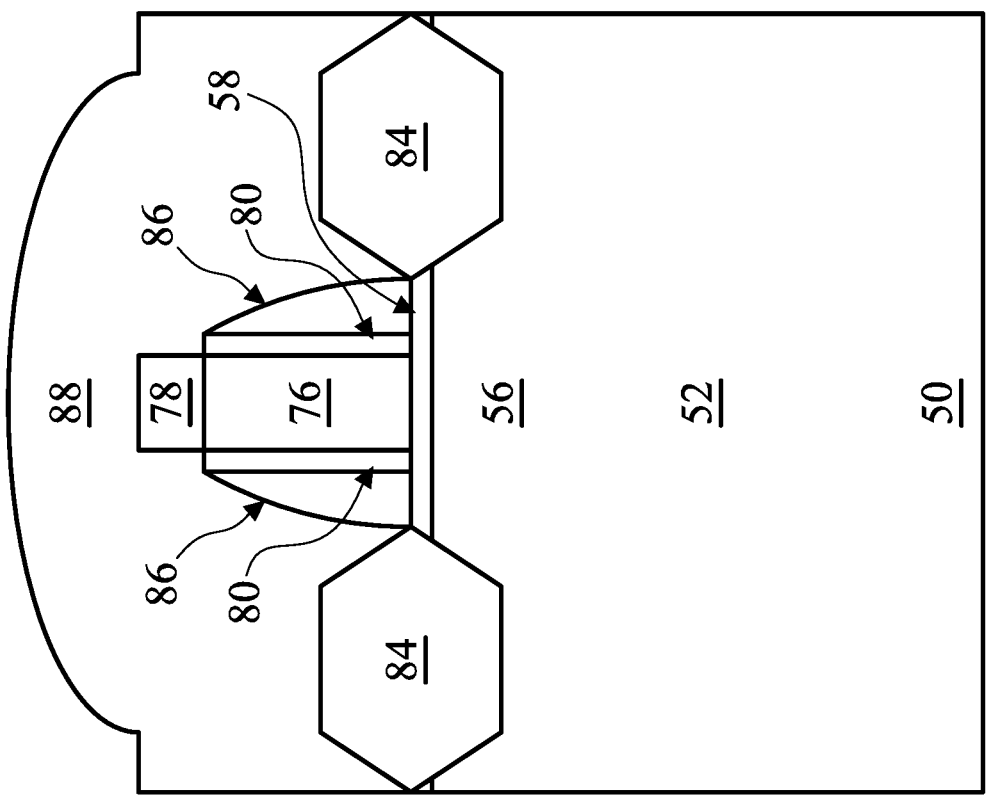
Figure 10B:
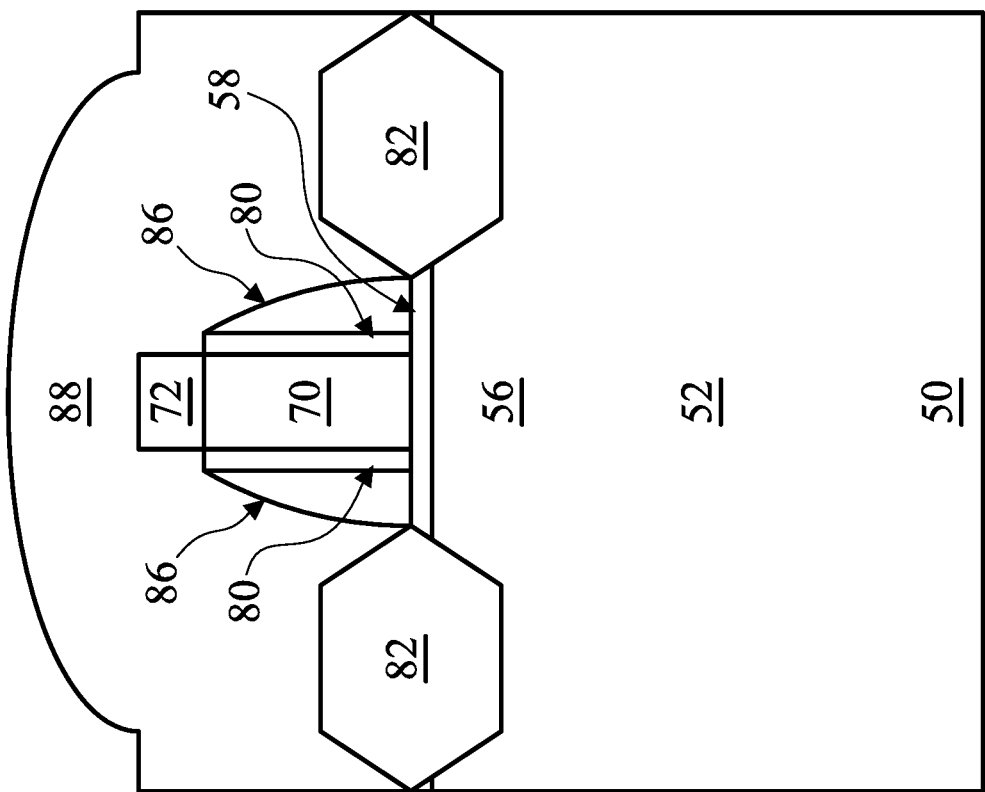

In FIGS. 10A, 10B, and 10C, an ILD 88 is deposited over the structure illustrated in FIGS. 9A, 9B and 9C. In an embodiment, the ILD 88 is a film formed by a flowable CVD method. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 11A:
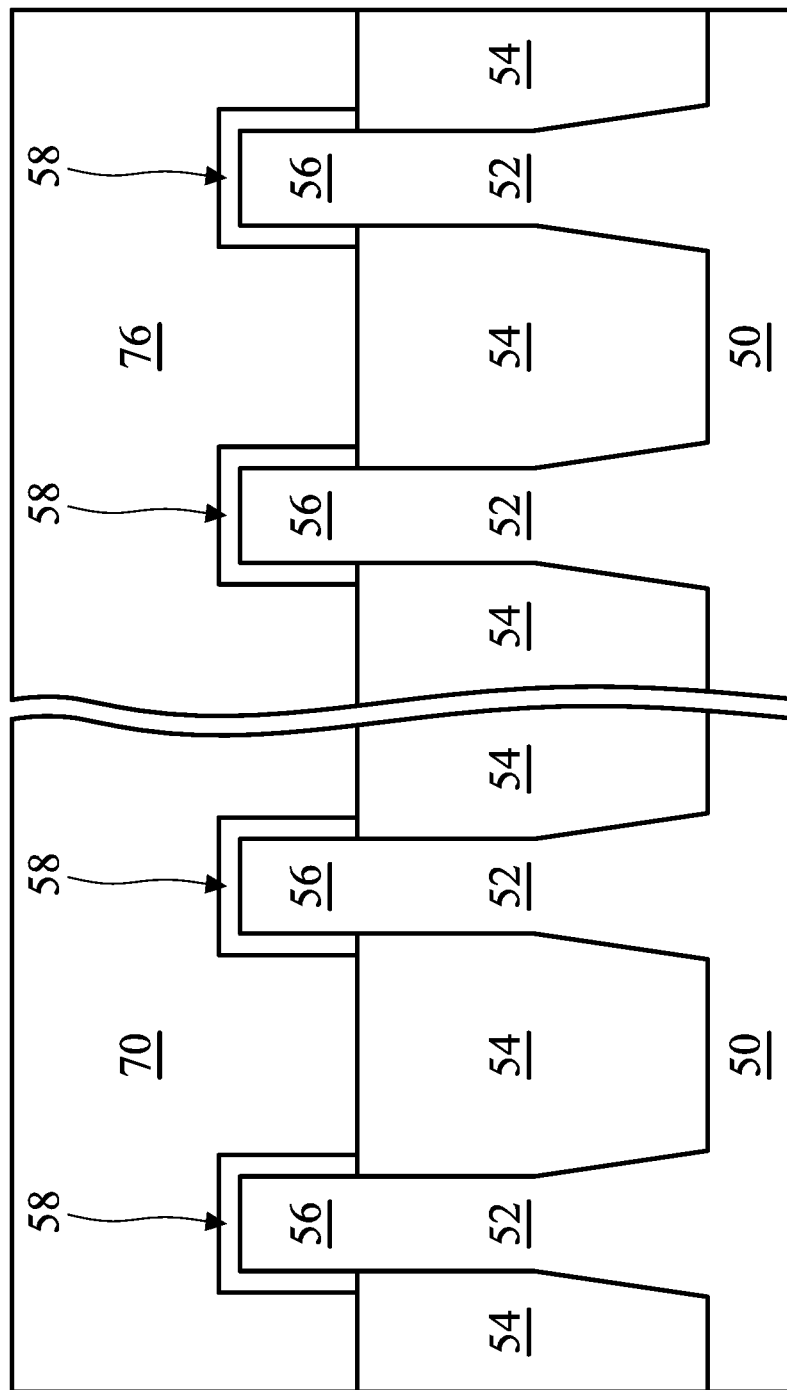
Figure 11C:
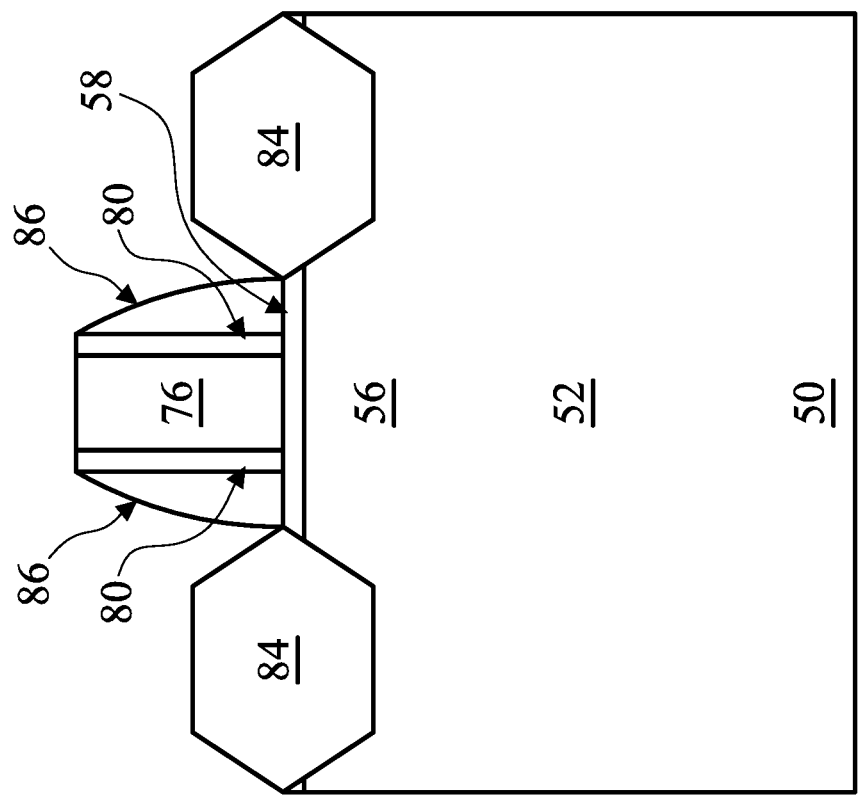
Figure 11B:
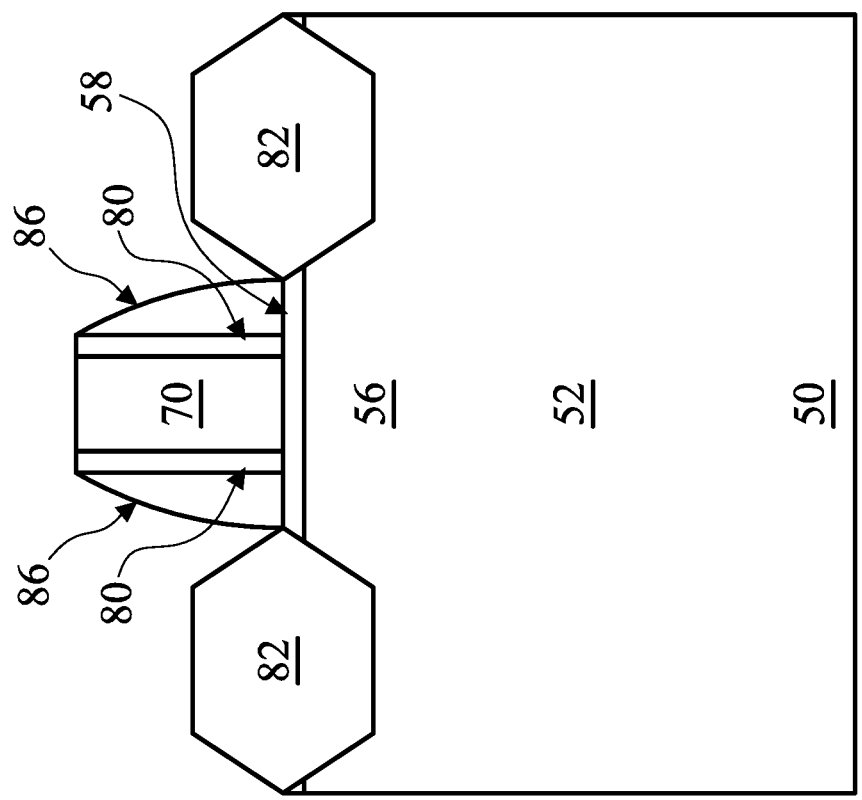

In FIGS. 11A, 11B, and 11C, a planarization process, such as a CMP, may be performed to level the top surface of ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88.

Figure 12A:
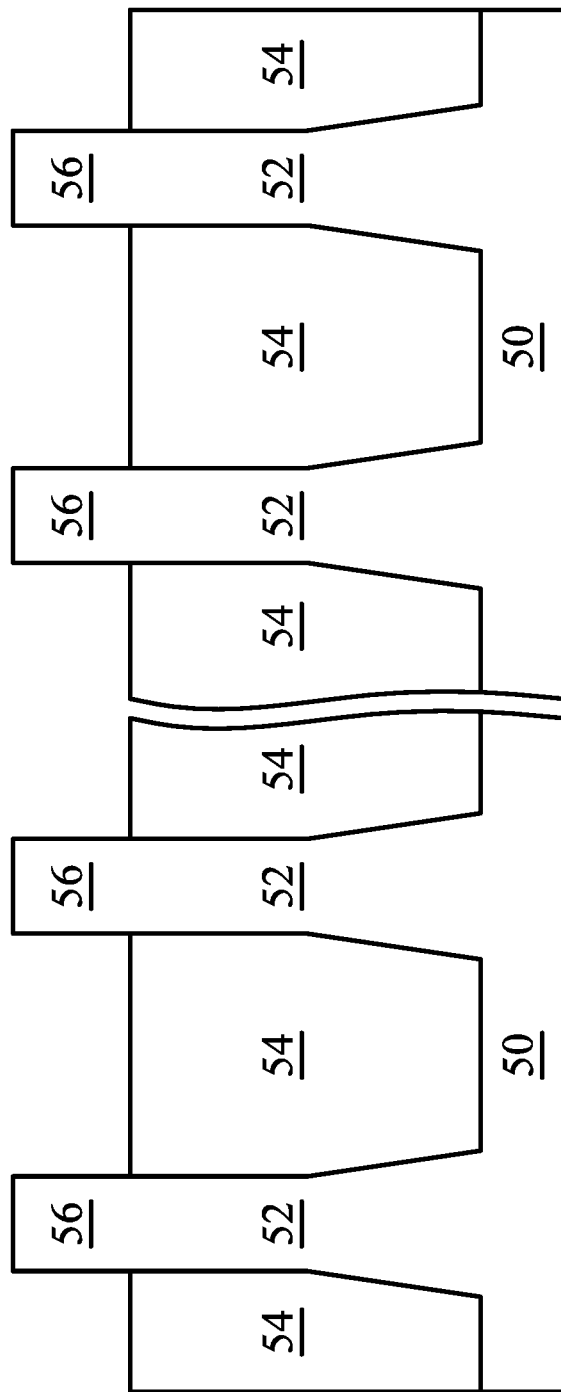
Figure 12C:
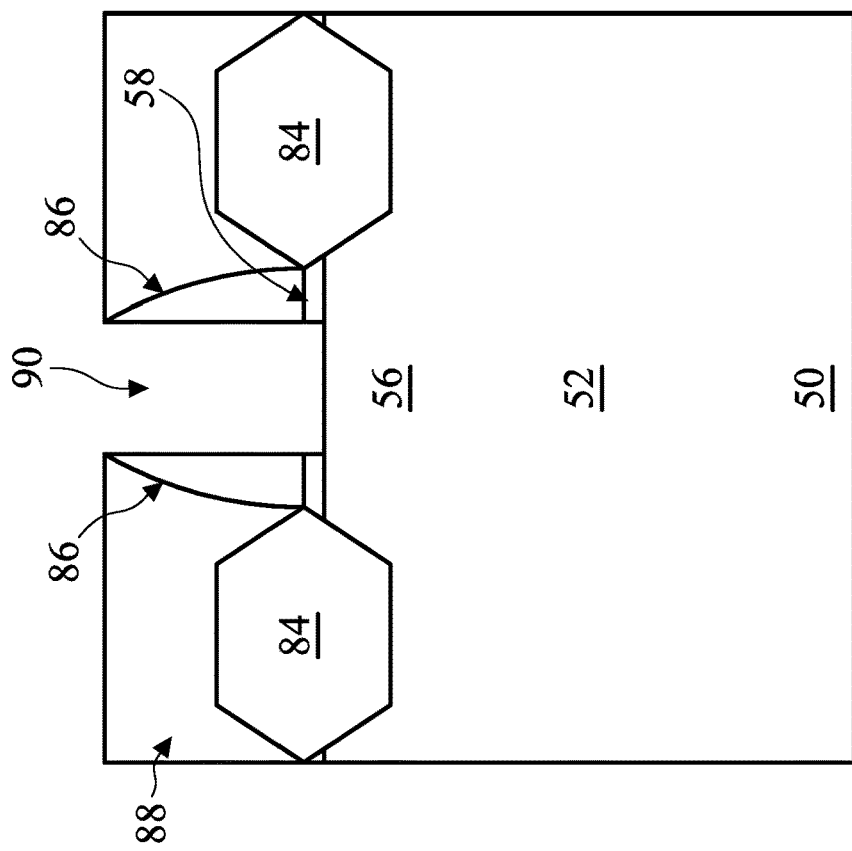
Figure 12B:
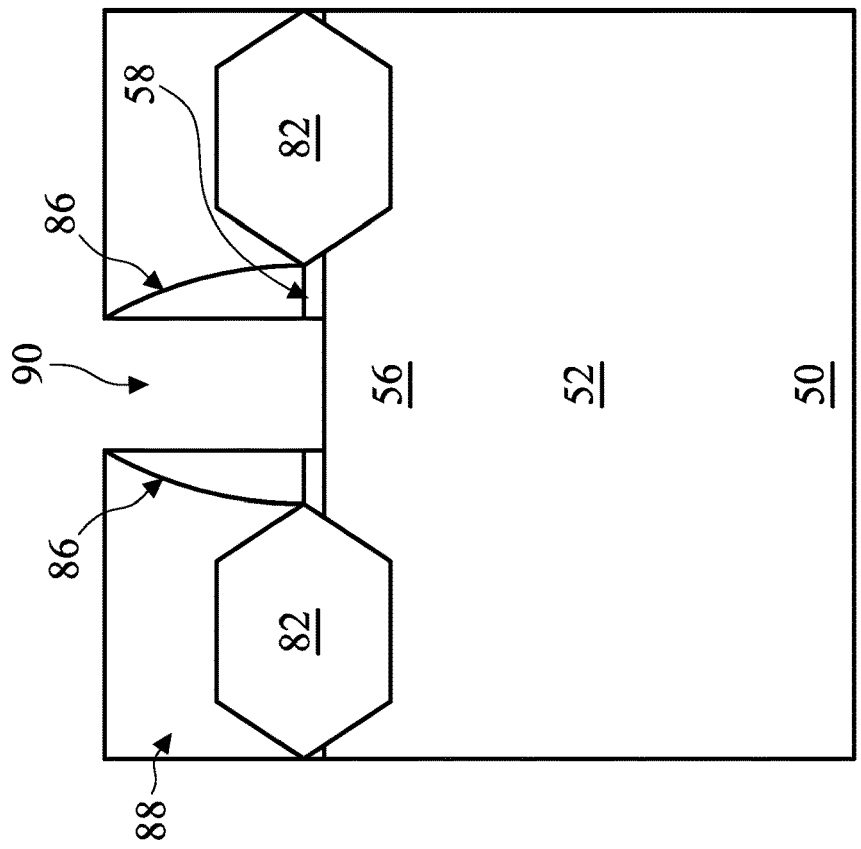

In FIGS. 12A, 12B, and 12C, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

Figure 13A:
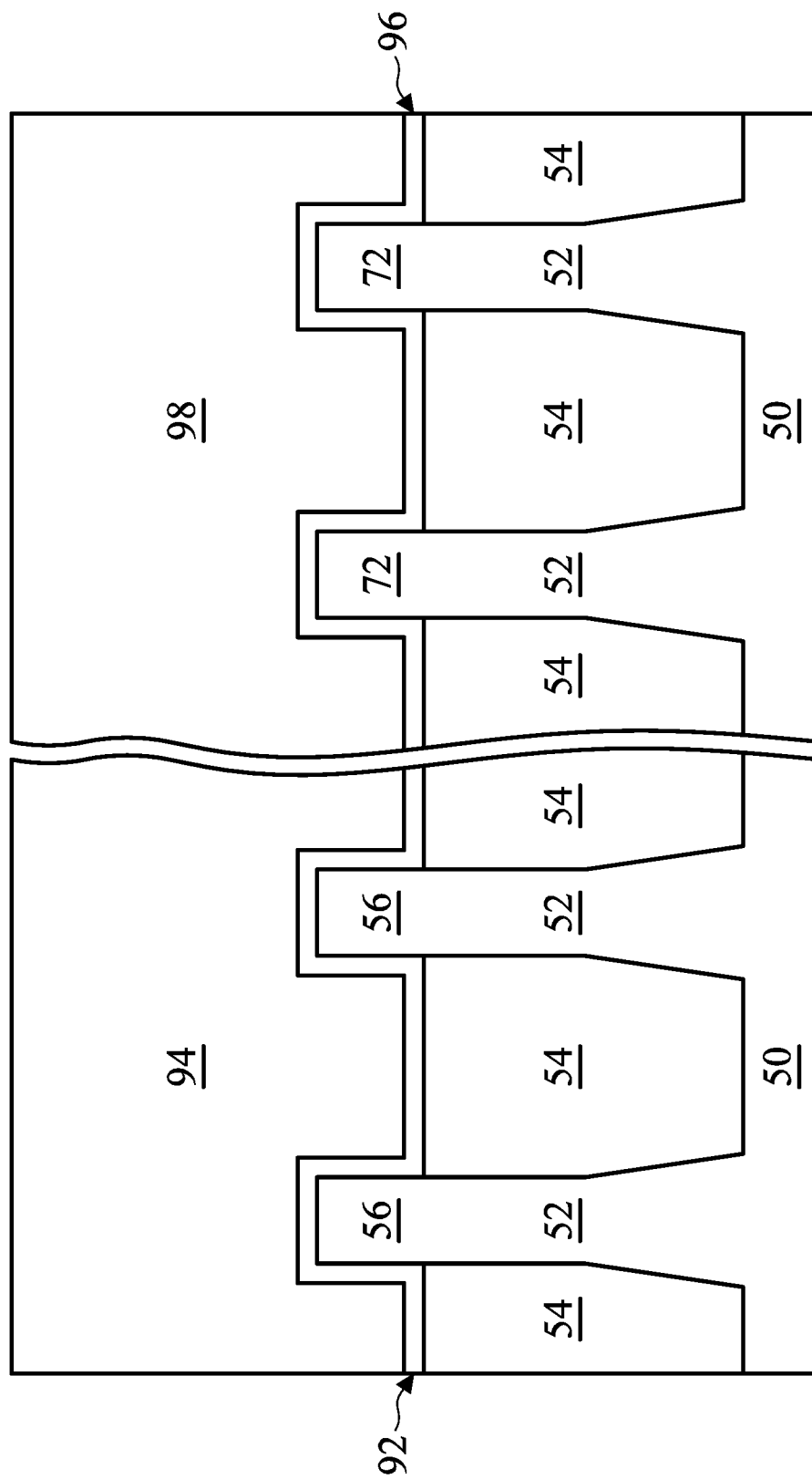
Figure 13C:
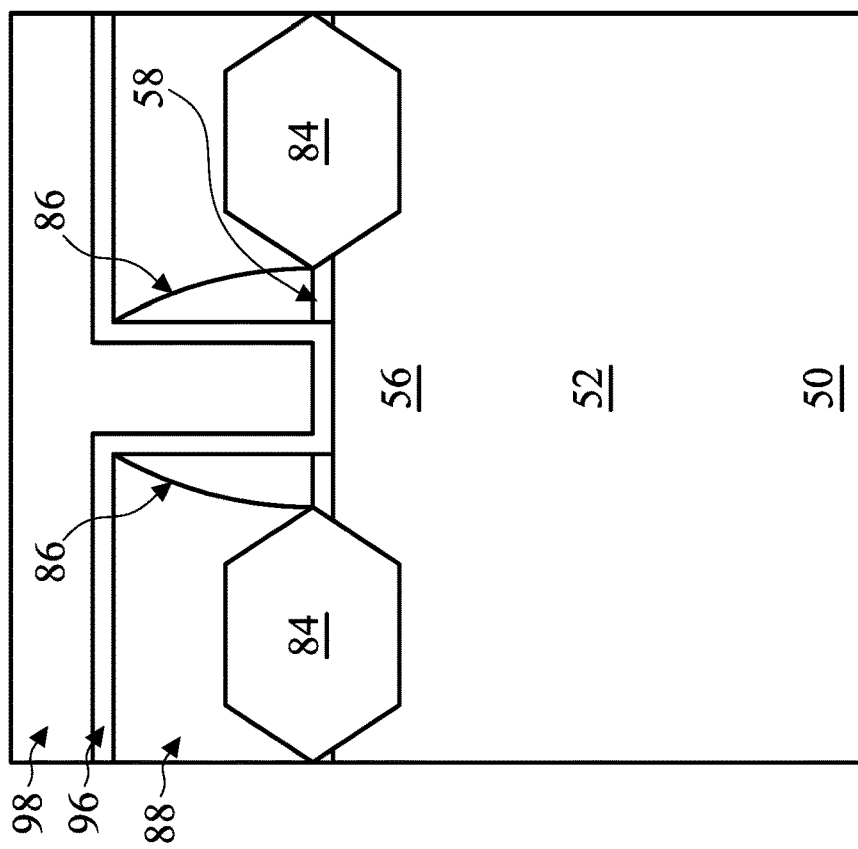
Figure 13B:
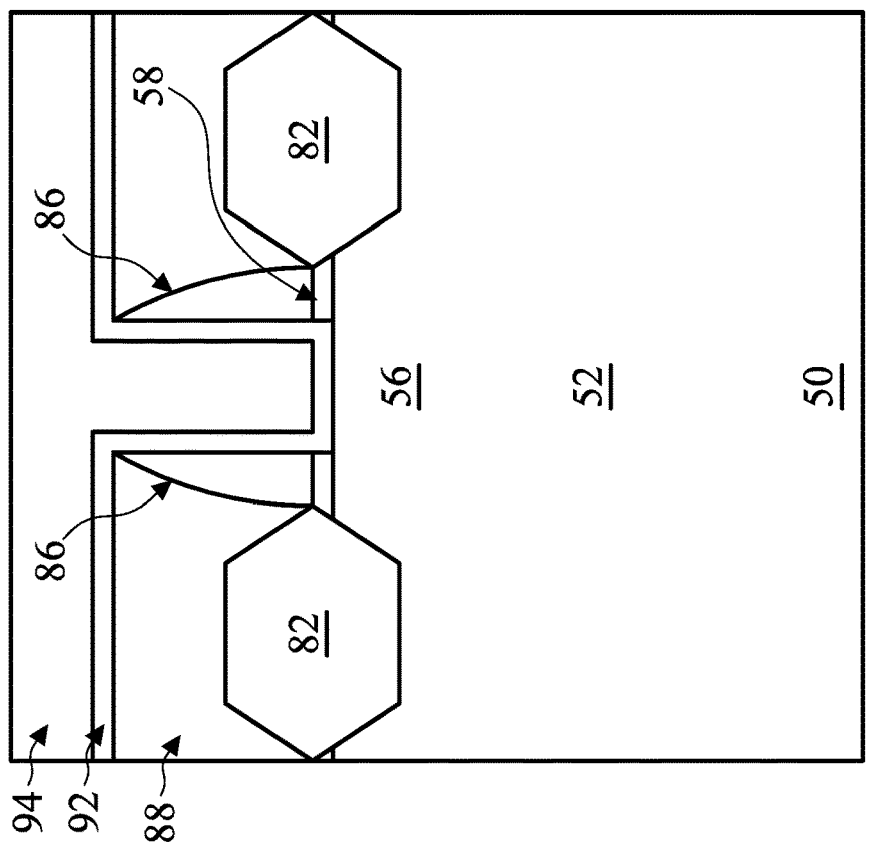

In FIGS. 13A, 13B, and 13C, gate dielectric layers 92 and 96 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, excess metal-containing material is disposed over the recesses 90 and extends along sections of gate dielectric layers 92 and 96 that extend along a top surface of ILD 88. The resulting structure is depicted in FIGS. 13A, 13B, and 13C.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 14A:
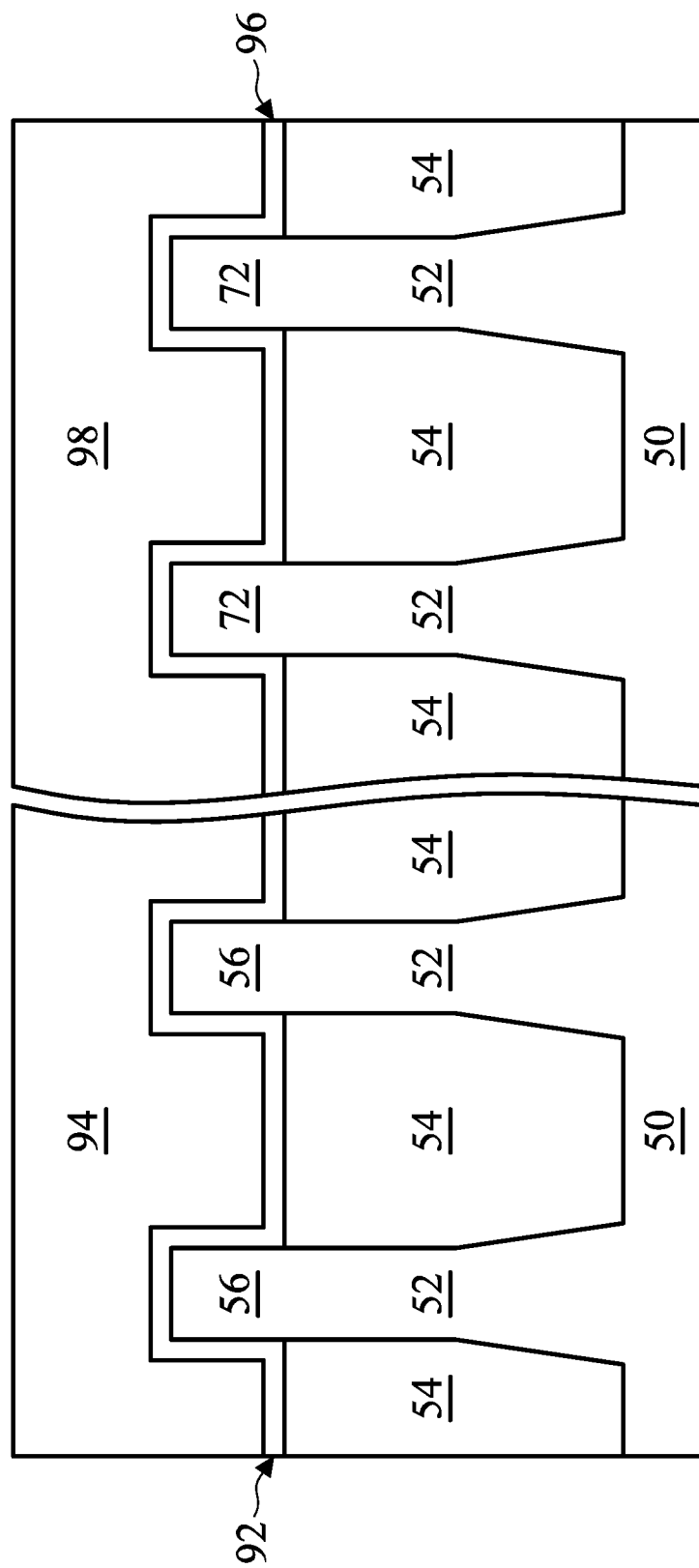

Next, a planarization process, such as a CMP, may be performed to remove the excess portions of gate dielectric layers 92 and 96 and the excess material of gate electrodes 94 and 98. For example a planarization process may be performed to remove any excess portions that are over the top surface of ILD 88. The resulting structure is depicted in FIGS. 14A-C. The resulting remaining portions of material of gate electrodes 94 and 98 and gate dielectric layers 92 and 96 thus form replacement gates of the resulting FinFETs.

In some embodiments, the planarization process may continue until a top portion of gate spacers 86 are removed and an overall height of ILD 88 and gate electrodes 94 and 98 are reduced. For example, before the planarization process, gate spacers may have a height H1 of about 400 Å to about 600 Å, such as about 500 Å. After the planarization process, gate spacers 86 may have a height H1 of about 150 Å to about 200 Å, such as about 180 Å. In some embodiments, the duration of the planarization process may be determined according to a thickness of ILD 88.

Figure 15A:
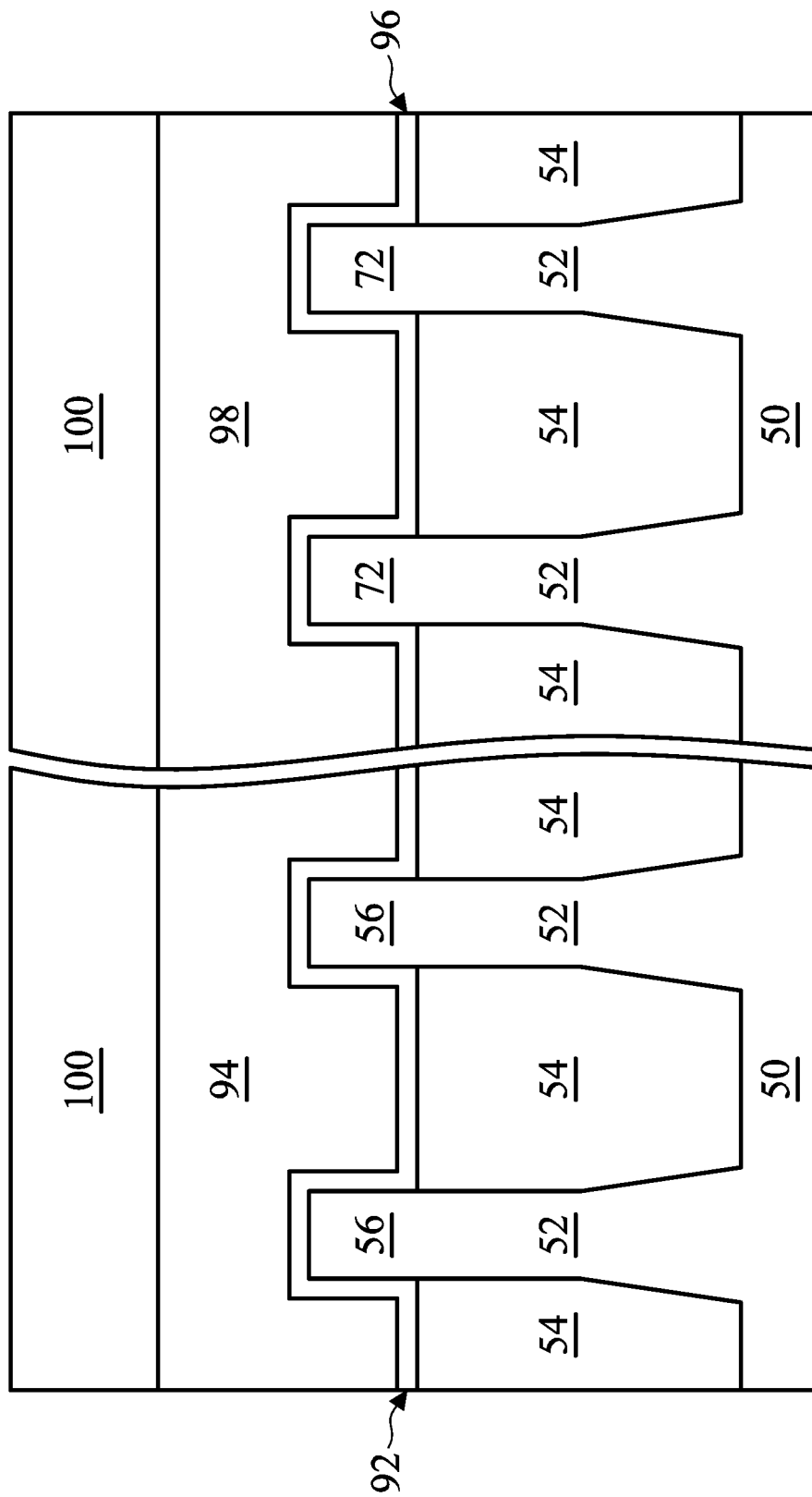
Figure 15C:
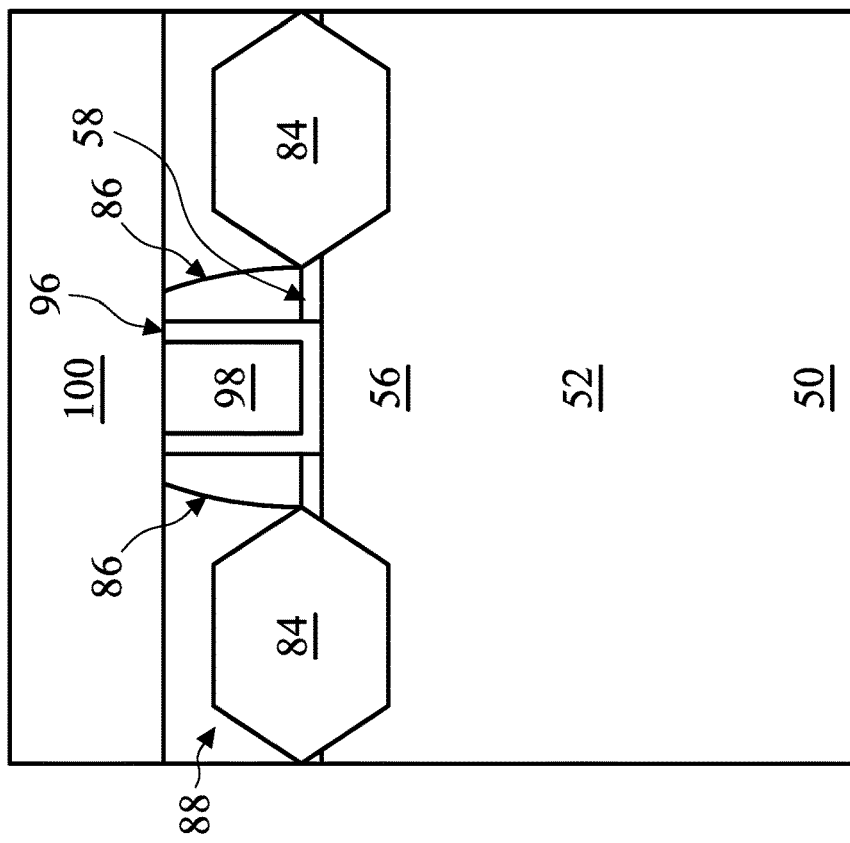
Figure 15B:
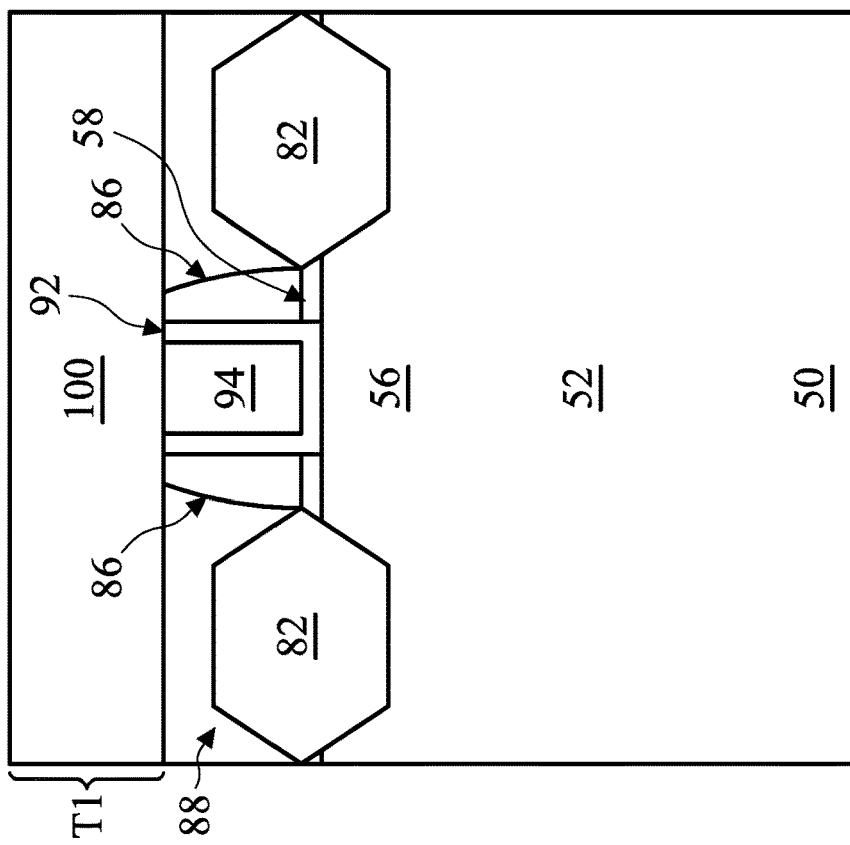

In FIGS. 15A, 15B, and 15C, an ILD 100 is deposited over ILD 88. In some embodiments, the ILD 100 is a film that is formed by a flowable CVD method. In some embodiments, the ILD 100 is formed of a dielectric material such as PSG, BSG, BPSG, USG, or the like, and may be deposited by any suitable method, such as CVD and PECVD. In some embodiments, ILD 100 may have a thickness T1 of about 650 Å to about 750 Å, such as about 700 Å.

FIGS. 16A-C through 26A-C depict intermediate stages in the formation of an electrically conductive connector that connects an epitaxial source/drain region 82/84 to a gate electrode 94/98, and that may connect the connected epitaxial source/drain region 82/84 and gate electrode 94/98 to other components in an electrical circuit. For example, in some applications it may be desirable to utilize in an electrical circuit a transistor in which a source terminal is connected to a gate terminal, or in which a drain terminal is connected to a gate terminal.

As depicted in FIGS. 16A-C to 26A-C, an electrical connector may be formed by first patterning ILD 100 to expose the gate electrode 94/98 and then patterning ILD 88 through the patterned ILD 100 to expose the epitaxial source/drain region 82/84. By first patterning ILD 100 to expose the gate electrode 94/98 and then patterning ILD 88 through the patterned ILD 100 to expose the epitaxial source/drain region 82/84, it may possible to avoid or reduce the use of a plasma etching process(es). If a plasma etching process is used, then the plasma etching process may leave behind residue in the openings created by the plasma etching process. A cleaning process (e.g., an oxygen treatment) may need to be performed to remove the residue created by the plasma etching. However, the oxygen treatment may cause oxidation of ILD 88 and/or ILD 100 in the opening, which may negatively impact the RC constant of the FinFET. By avoiding a plasma etching process, the residue and the subsequent oxidation of the ILD layers from the oxygen treatment may be avoided or minimized. Further, by first patterning the ILD 100 to expose the gate electrode 94/98 and then patterning ILD 88 through the patterned ILD 100 to expose the epitaxial source/drain region 82/84, it may be possible to avoid a process of depositing a sacrificial film over the gate electrode 94/98 to protect the gate electrode 94/98 during a plasma etching process. By avoiding the need to deposit the sacrificial film, manufacturing may be streamlined and costs may be minimized.

Figure 16A:
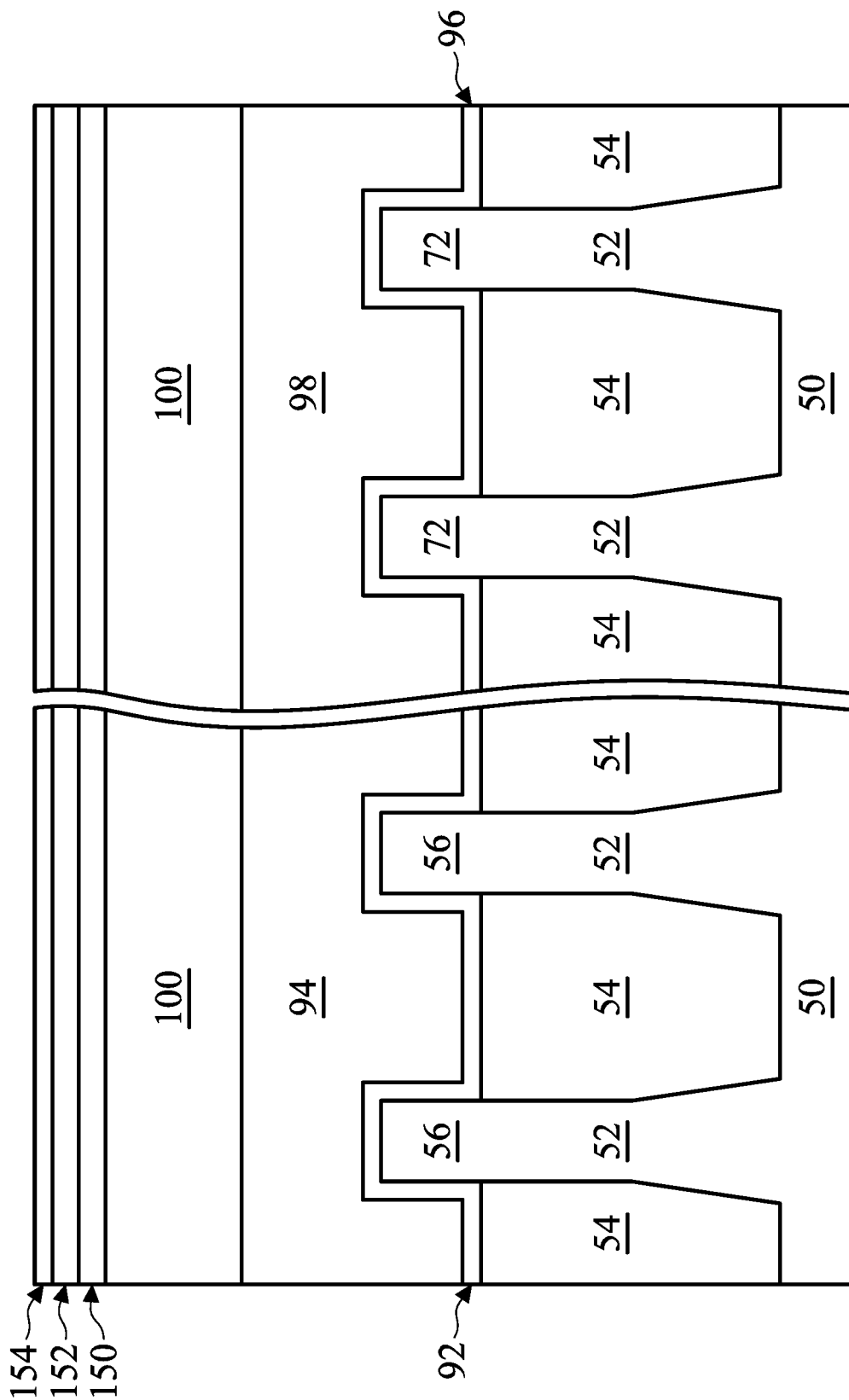
Figure 16C:
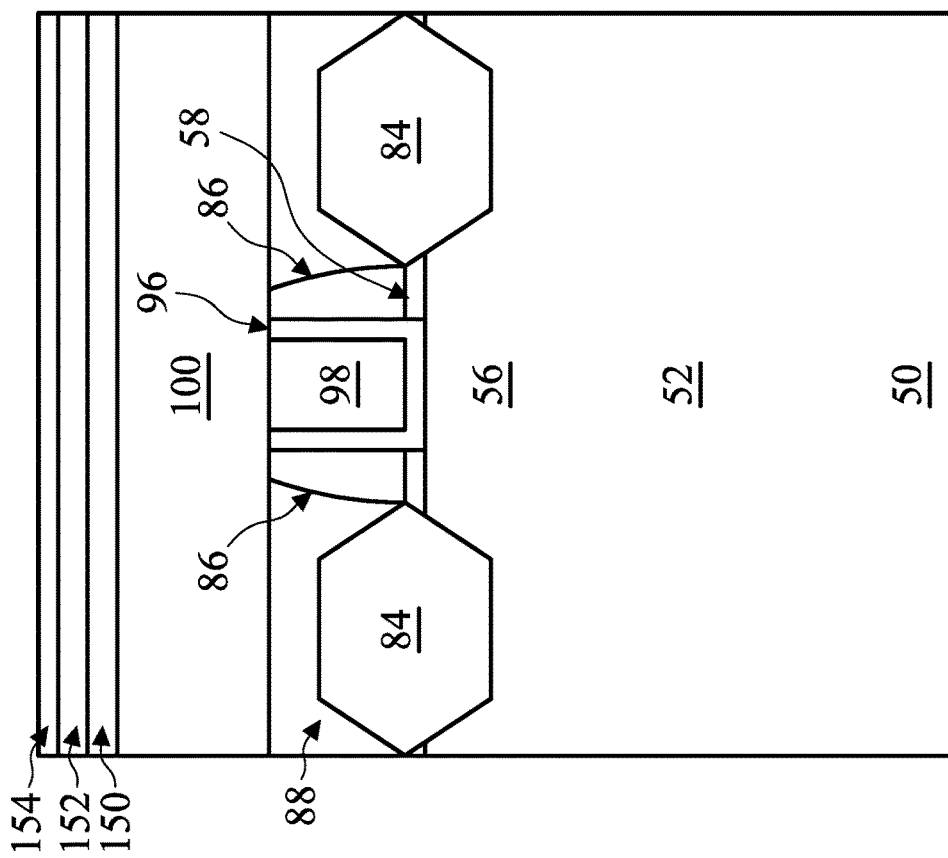
Figure 16B:
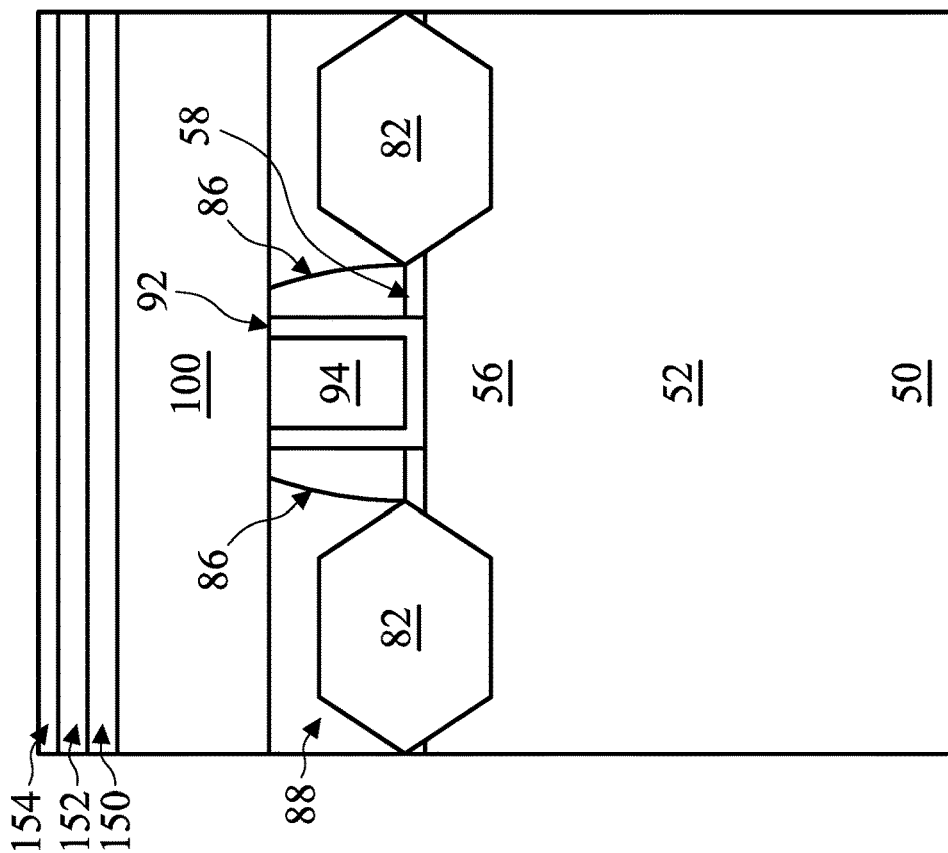

Referring to FIGS. 16A-C, a first step of a first tri-layer photo resist process is depicted. In the first step of the first tri-layer photo resist process, three layers (150, 152, and 154) are deposited over ILD 100 using a suitable process, such as, sputtering, spin-on coating, or the like. In subsequent steps, the three layers (150, 152, and 154) will be patterned to form an opening that exposes ILD 100 over gate electrodes 94/98 and a portion of ILD 100 that overlies an epitaxial source/drain region 82/84 to which the gate electrodes 94/98 will be electrically connected. (See FIGS. 17A, 17B, 17C). The three layers include a bottom anti-reflective coating (BARC) layer 150, an intermediate hard mask layer 152, and a top photoresist layer 154. In other embodiments, other types of patterning masks may be used, which may include fewer or a greater number of layers than the tri-layer photo resist process depicted herein.

Figure 17A:
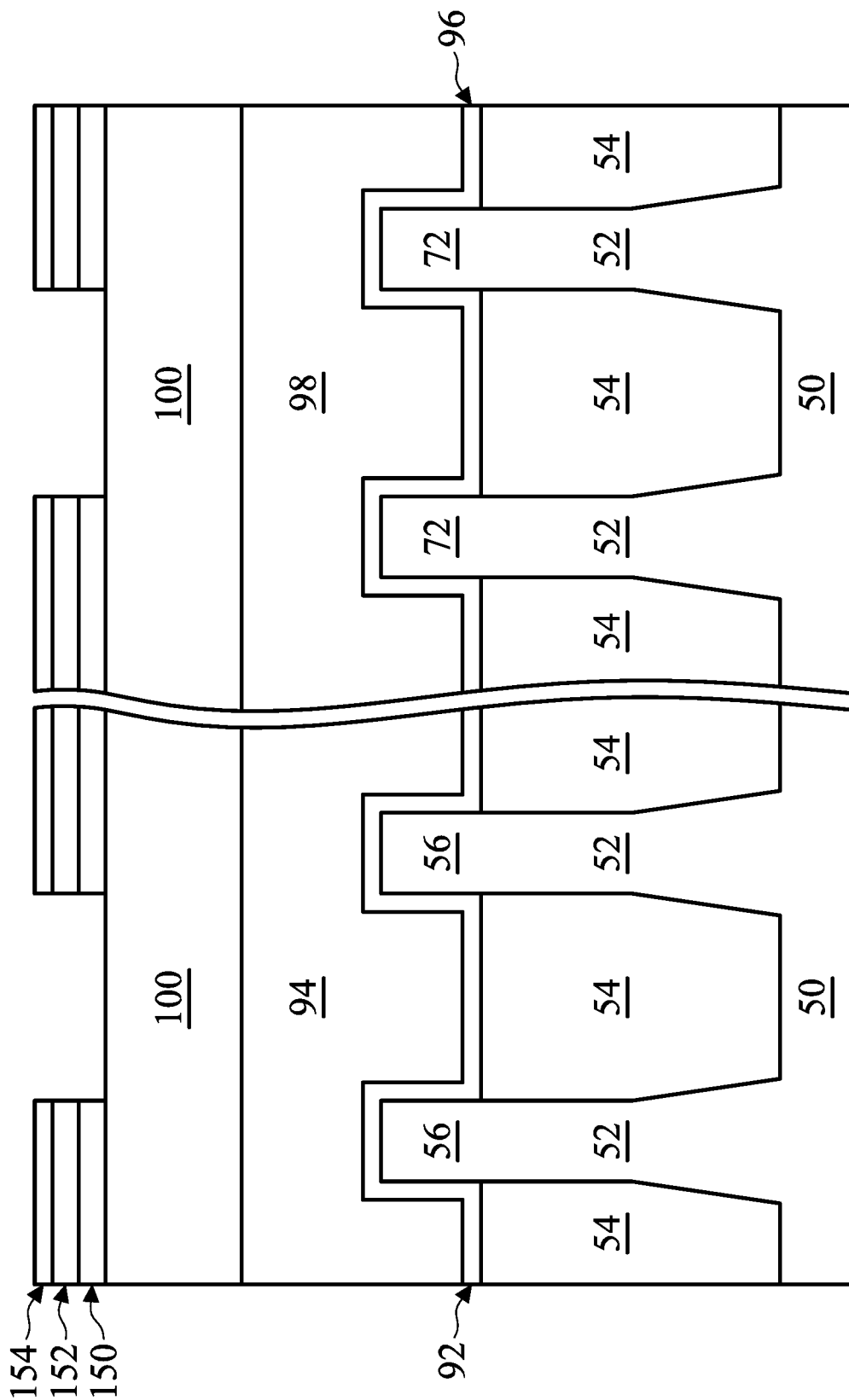
Figure 17C:
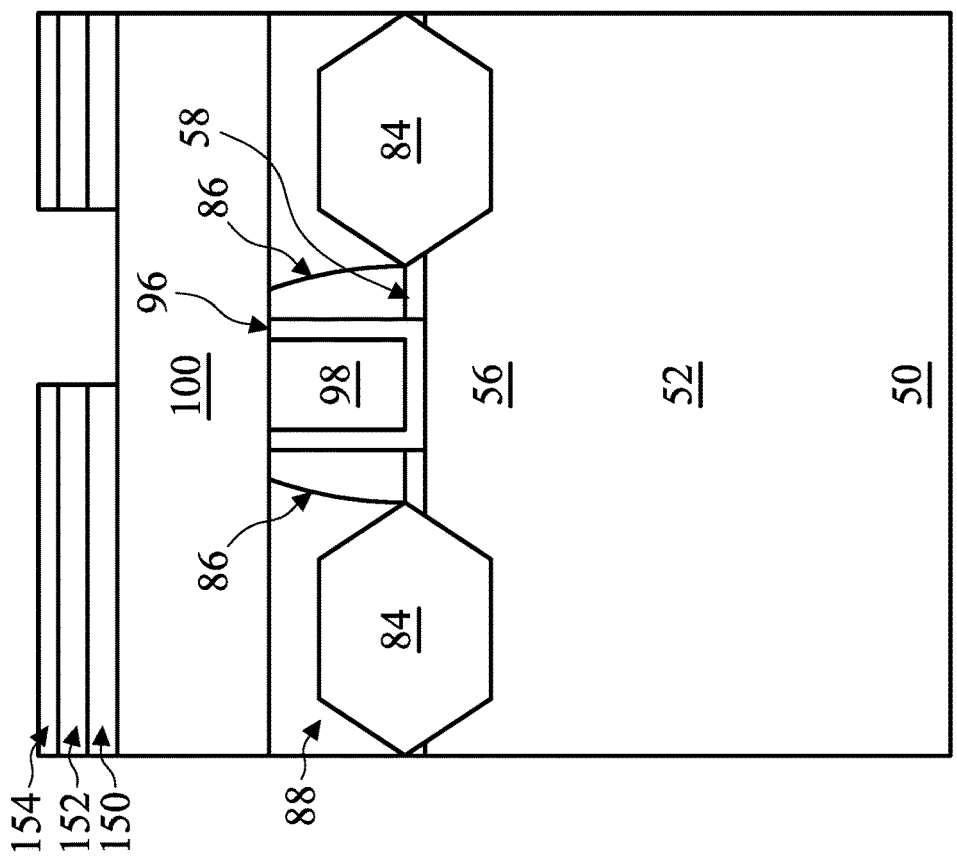
Figure 17B:
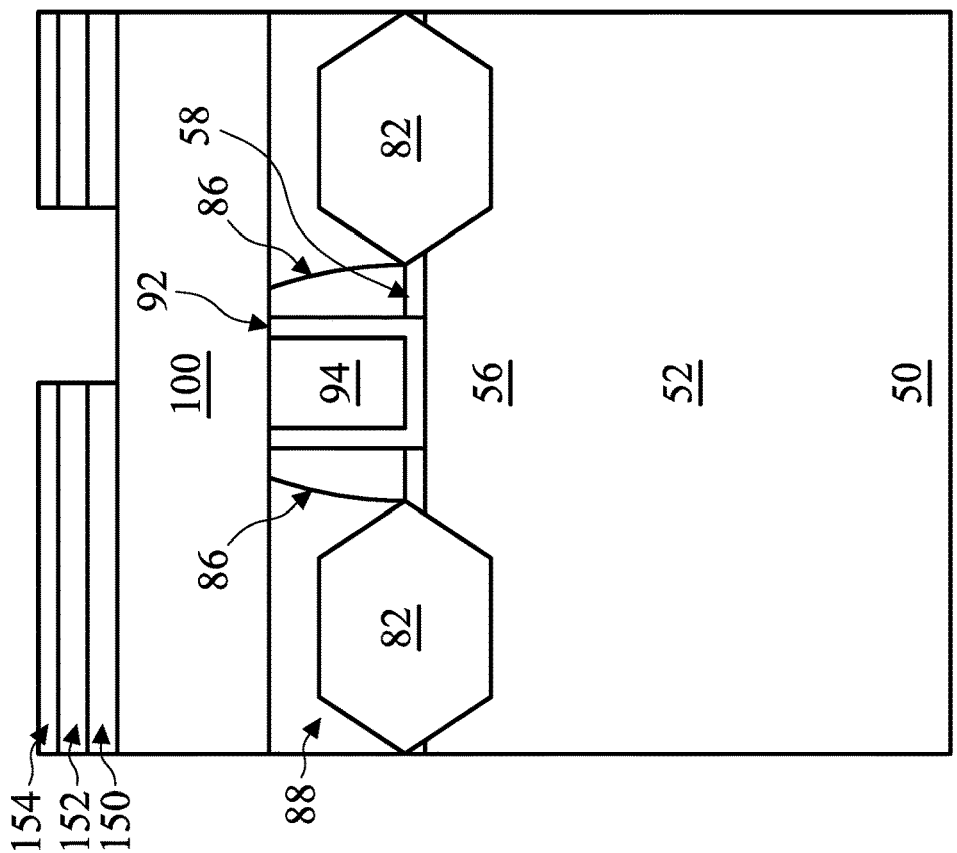

Referring to FIGS. 17A, 17B, and 17C, the top photoresist layer 154 may be patterned to expose one or more portions of ILD 100 that overlies gate electrodes 94/98. The patterning may also expose a section of ILD 100 that overlies an epitaxial source/drain region 82/84 to which the gate electrode 94/98 will be connected. Top photoresist layer 154 may be patterned using any suitable photolithography technique. For example, a photomask (not shown) may be disposed over the top photoresist layer 154, which may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. Exposure of the top photoresist layer 154 may be performed using an immersion lithography system to increase resolution and decrease the minimum achievable pitch. A bake or cure operation may be performed to harden the top photoresist layer 154, and a developer may be used to remove either the exposed or unexposed portions of the top photoresist layer 154 depending on whether a positive or negative resist is used. After the patterning of the top photoresist layer 154, a trimming process may be performed to reduce the width of the top photoresist layer 154. In an embodiment, the trimming process is an anisotropic plasma etch process with process gases including $O_2$, $CO_2$, $N_2/H_2$, $H_2$, the like, a combination thereof, or any other gases suitable for trimming photoresist. After the trimming process, the intermediate hard mask layer 152 and the BARC layer 150 may be patterned (e.g., using an etching process), leaving the pattern illustrated in FIGS. 17A, 17B, and 17C. As part of the patterning process, portions of the top photoresist layer 154 may be consumed. For example, after patterning the intermediate hard mask layer 152 and the BARC layer 150, a thickness of the top photoresist layer 154 may be reduced.

Figure 18A:
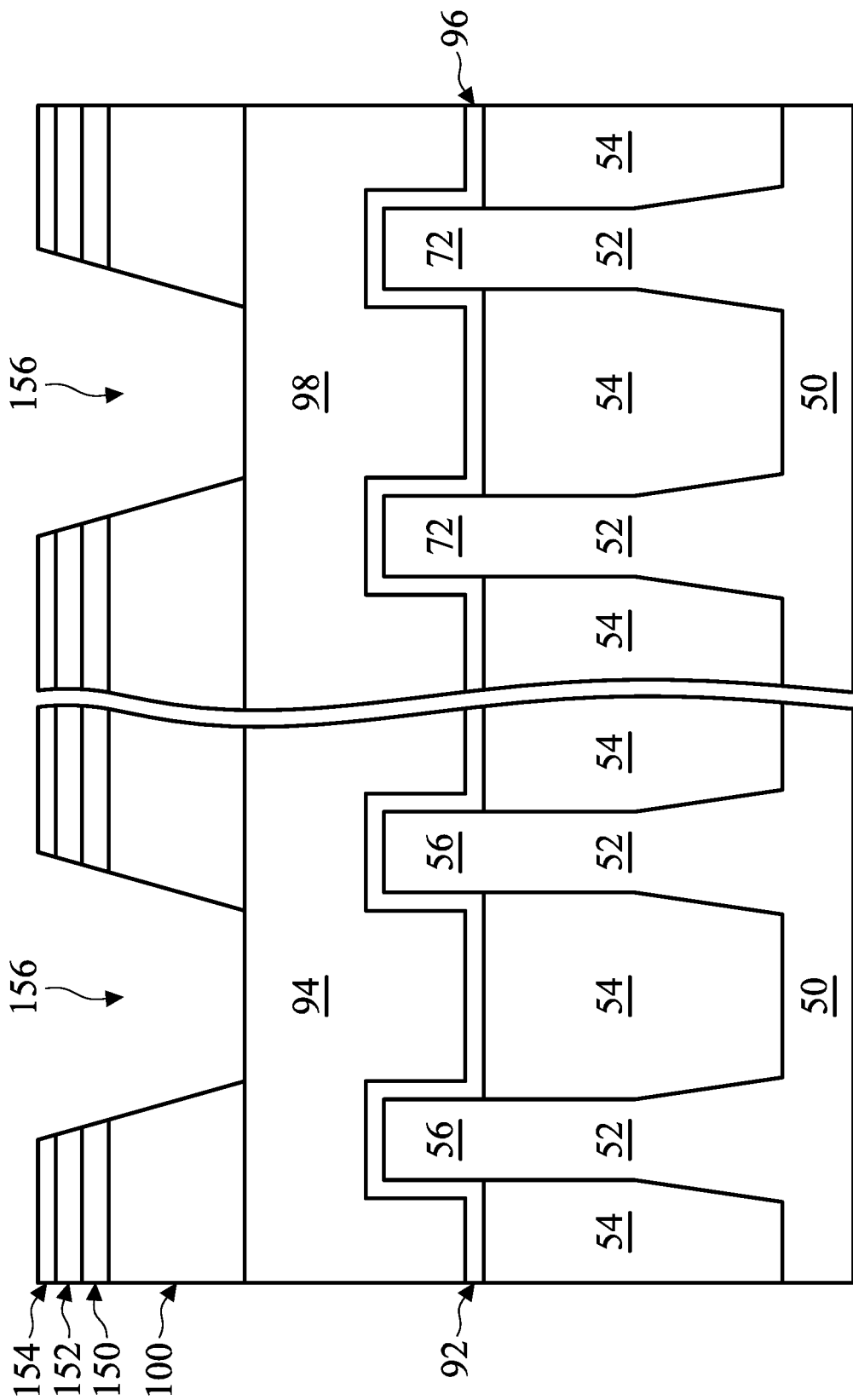

Next, referring to FIGS. 18A, 18B, and 18C, the ILD 100 is patterned using remaining portions of the three layers (layers 150, 152, and 154) as a mask to form openings 156. Openings 156 expose at least a portion of the top surfaces of gate electrodes 94/98. In some embodiments, only a portion of a top surface of a gate electrode 94/98, measured from a direction that extends from a first gate spacer 86 to a second gate spacer 86, may be exposed by openings 156. For example, in some embodiments a portion of a top surface of a gate electrode 94/98 that is closest to an epitaxial source/drain region 82/84 to which the gate electrode 94/98 will be electrically connected will be exposed by an opening 156. In some embodiments, the entire top surface of a gate electrode 94/98 between two adjacent gate spacers 86 may be exposed by an opening 156. As shown in FIGS. 18A, 18B and 18C, openings 156 may also expose an area of ILD 88 that overlies at least a portion of a corresponding epitaxial source/drain region 82/84 to which the gate electrodes 94/98 will be electrically connected.

The patterning of the ILD 100 to form the openings 156 may be performed using any kind of suitable etching technique. In some embodiments, a wet etching process that has a high selectivity between oxides and tungsten may be used. The etching process may continue until an end point is detected. For example, in some embodiments the detection of the gate electrode 94/98 may signal an endpoint of the etching process. In some embodiments it may be desirable to avoid the use of a plasma etching process to avoid the creation of residue in openings 156.

After the etching process, openings 156 may have tapered sidewalls as depicted in FIGS. 18A, 18B, and 18C. In some embodiments, sidewalls of openings 156 may form an angle with a bottom surface of openings 156 of about 93 degrees to about 98 degrees, such as about 95 degrees.

Figure 19A:
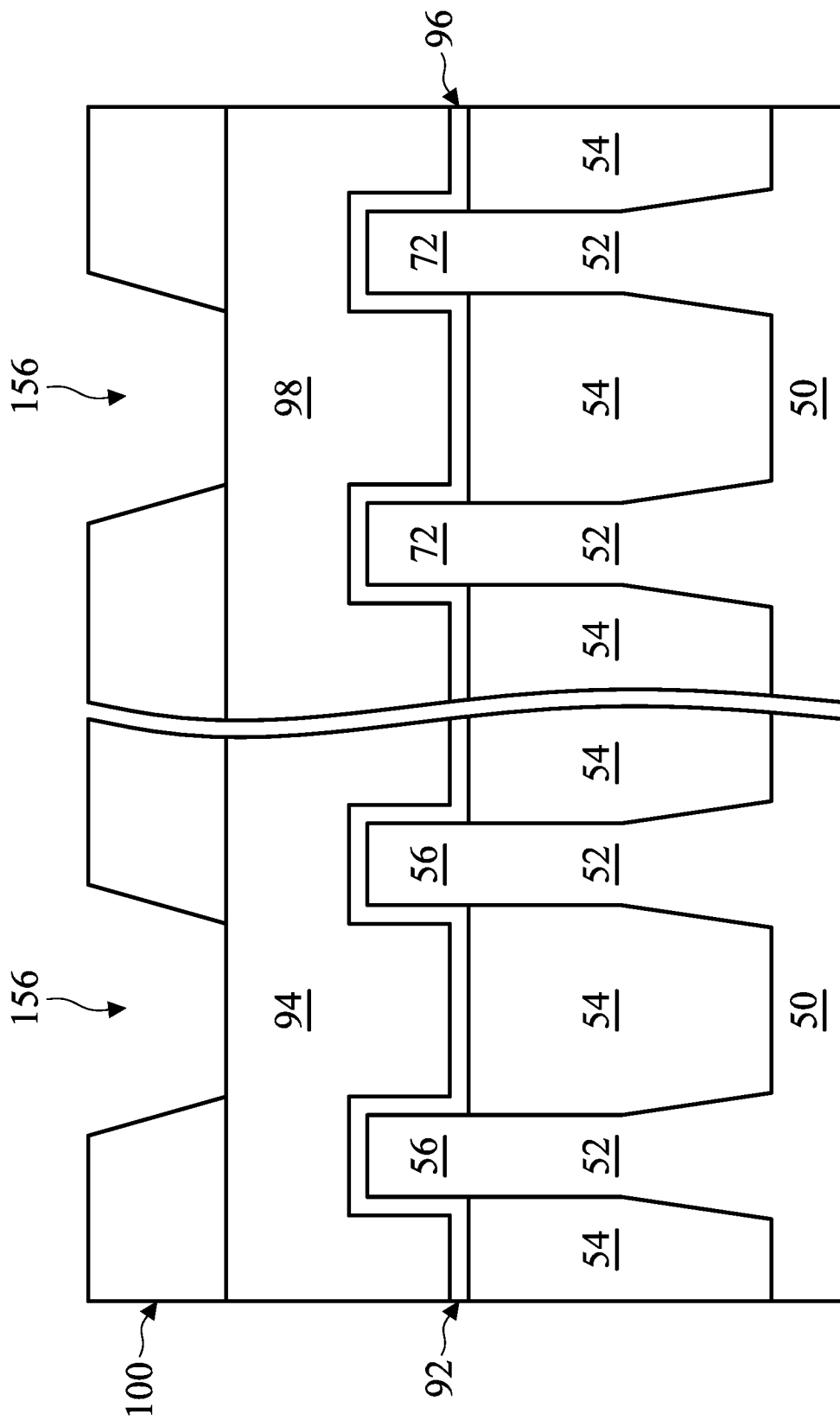
Figure 19C:
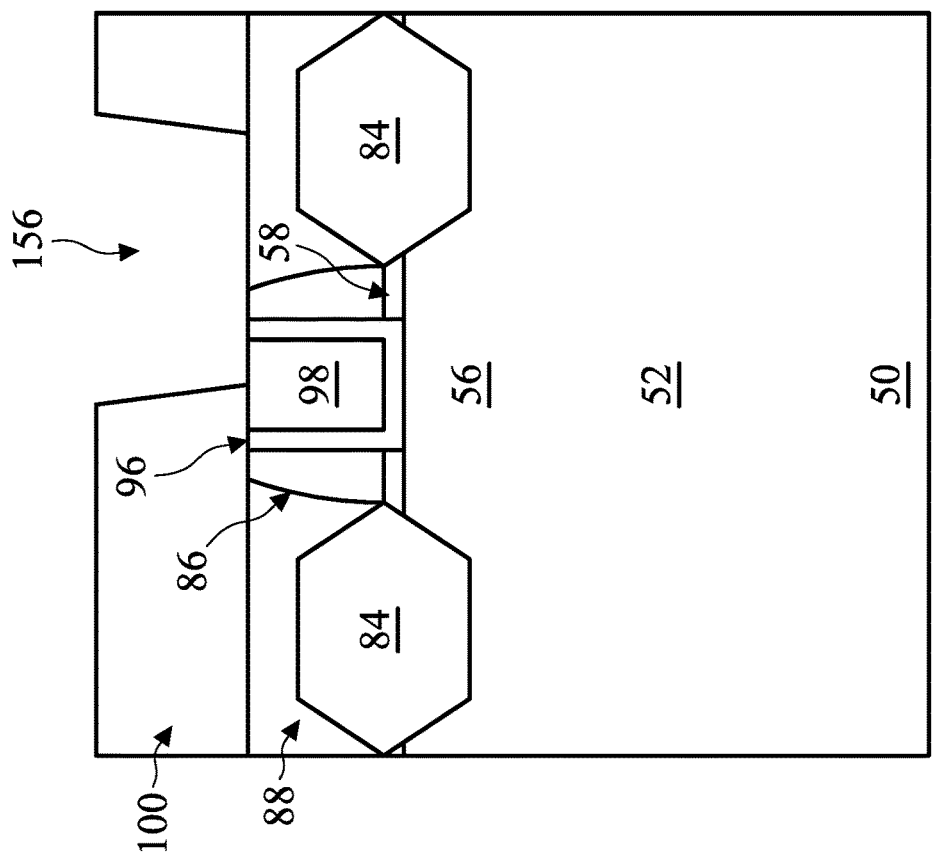
Figure 19B:
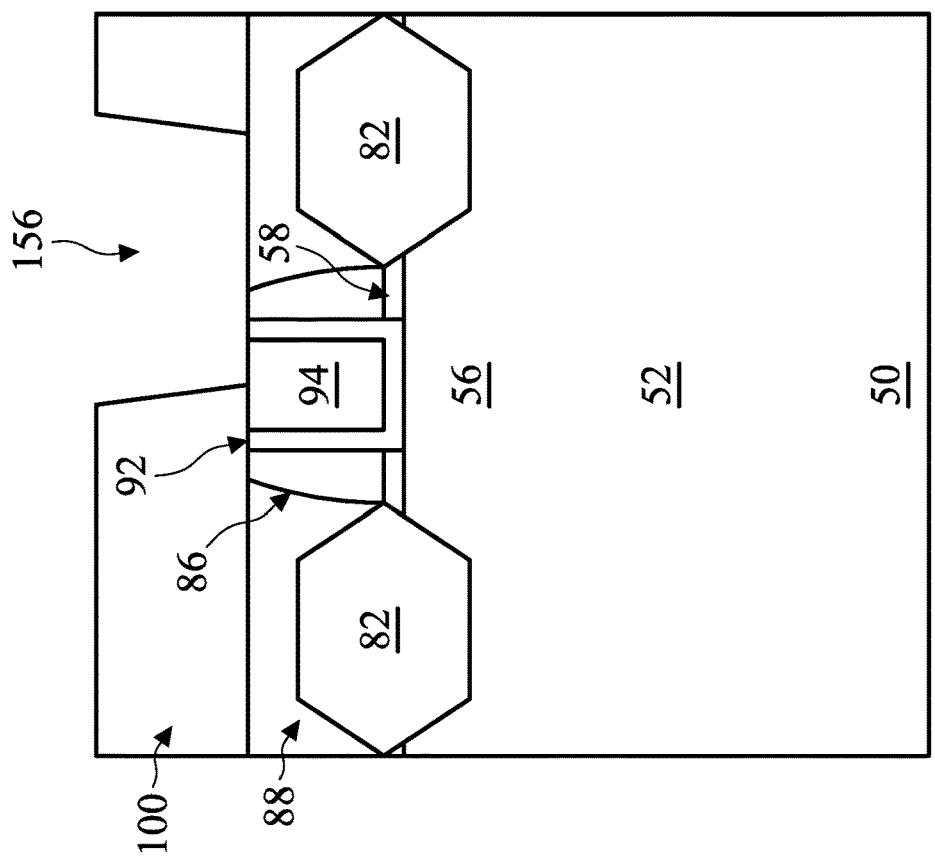

Next, the three layers 150, 152 and 154 of the first tri-layer photoresist process are removed, for example in an ashing process. An optional wet clean may also be applied to remove the three layers 150, 152, and 154. The resulting structure is depicted in FIGS. 19A, 19B, and 19C.

Figure 20A:
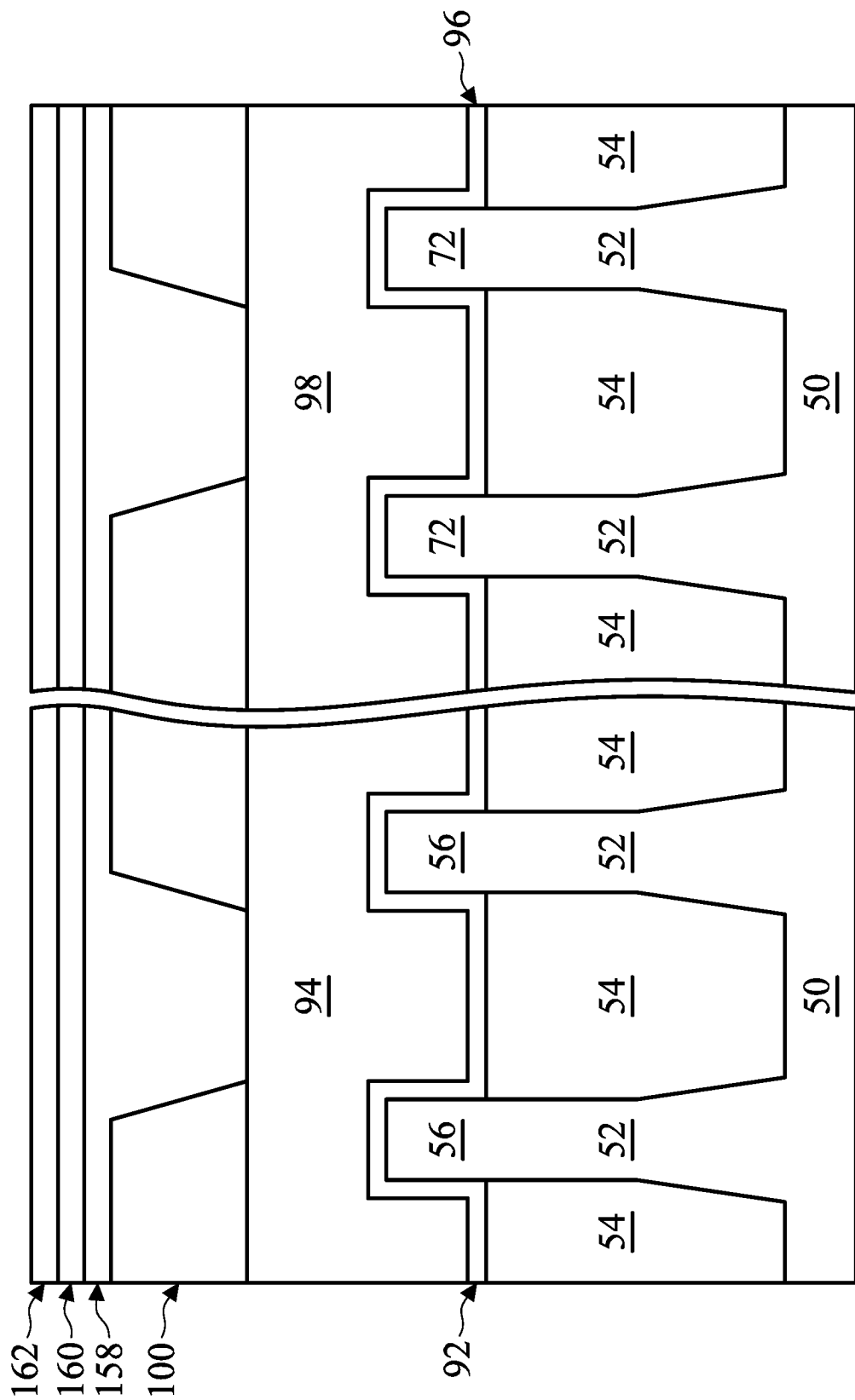
Figure 20C:
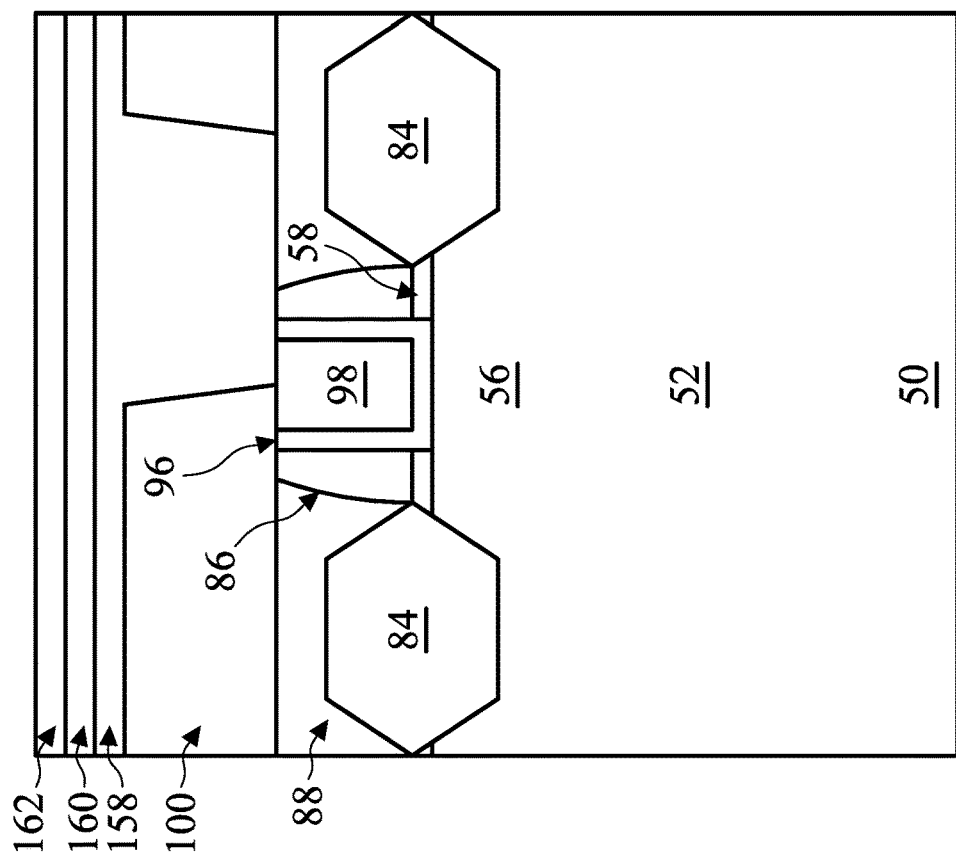
Figure 20B:
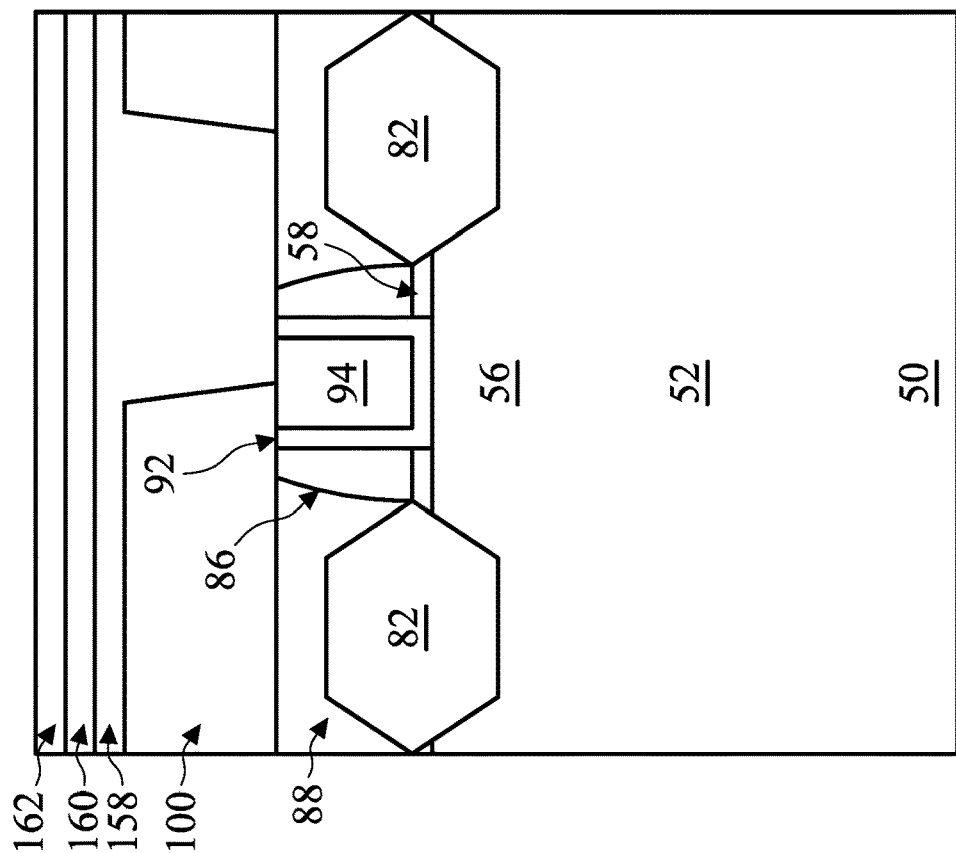

Referring to FIGS. 20A, 20B and 20C, a second tri-layer photoresist process is begun by depositing another three layers (158, 160, and 162) over ILD 100 and over ILD 88/gate electrode 94/98/gate spacer 86 in openings 156. In subsequent steps, the three layers (158, 160, and 162) will be patterned to form an opening that exposes ILD 88 over the portion of the epitaxial source/drain region 82/84 to which the gate electrode 94/98 will be electrically connected. (See FIGS. 21A, 21B, 21C). As discussed in detail above, the three layers include a bottom anti-reflective coating (BARC) layer 158, an intermediate hard mask layer 160, and a top photoresist layer 162. The bottom BARC layer substantially fills openings 156 and creates a substantially planar surface upon which the intermediate hard mask layer 160 and the top photoresist layer 162 may be formed. The three layers 158, 160, and 162 may be deposited using a non-conformal deposition process, such as, sputtering, spin-on coating, or the like. In other embodiments, other types of patterning masks may be used, which may include fewer or a greater number of layers than the tri-layer photo resist process depicted herein.

Figure 21A:
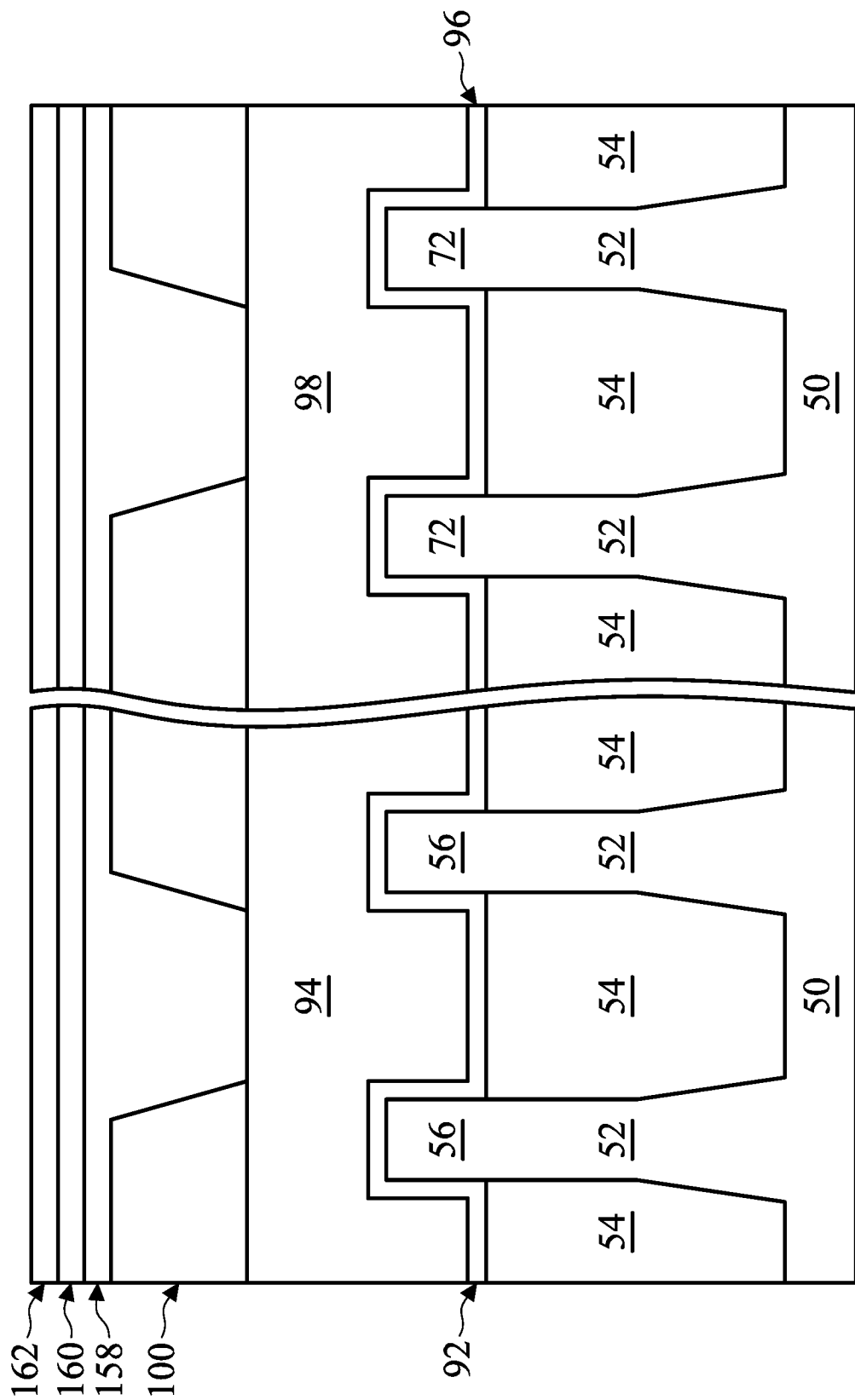
Figure 21C:
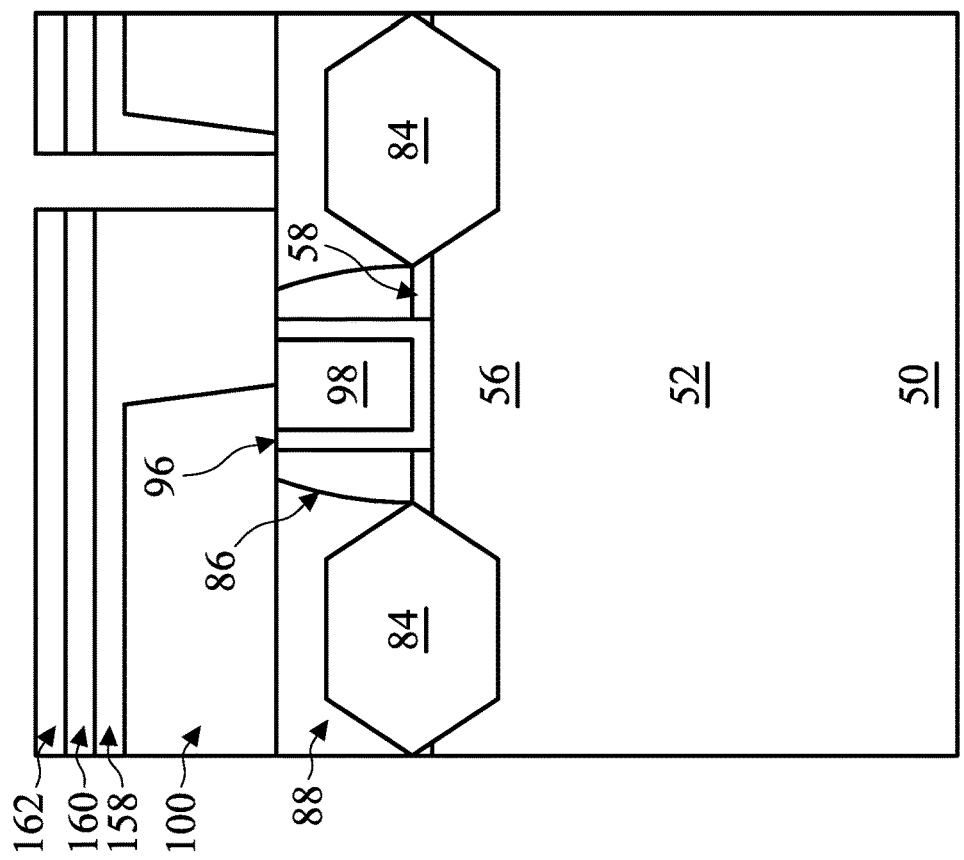
Figure 21B:
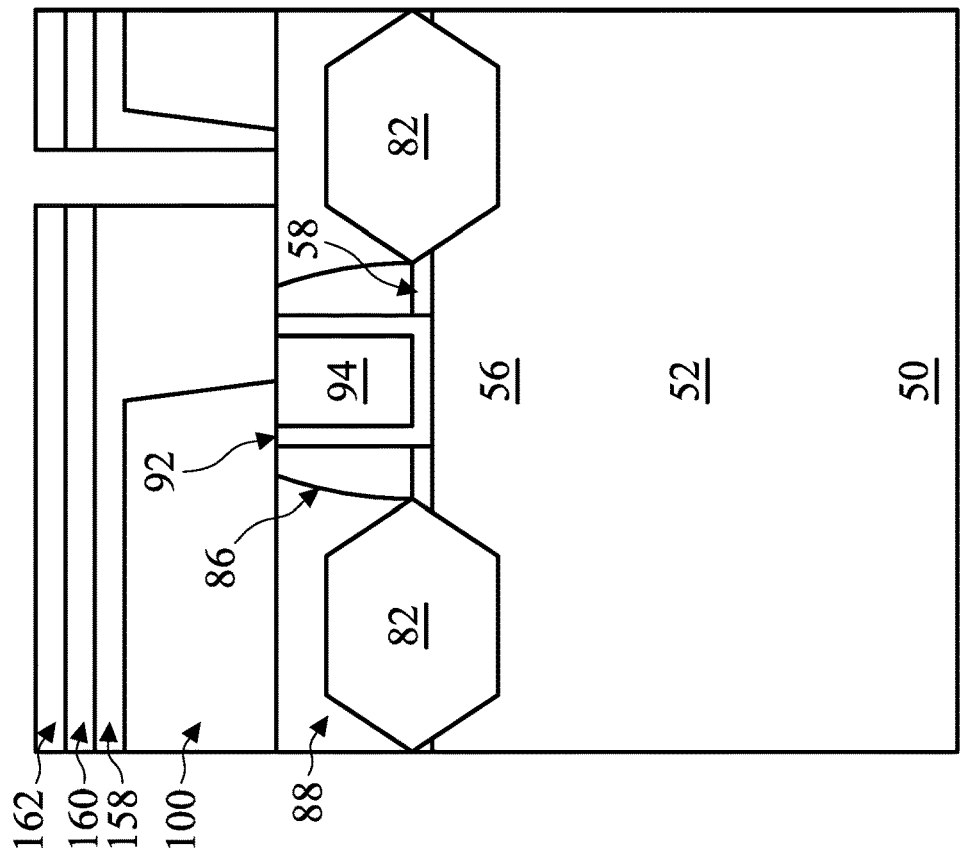

Referring to FIGS. 21A, 21B, and 21C, the top photoresist layer 162 may be patterned to expose one or more portions of ILD 88 that overlies the portion of epitaxial source/drain region 82/84 to which the gate electrode 94/98 will be electrically connected. Top photoresist layer 162 may be patterned using any suitable photolithography technique, such as the techniques described above in connection with the first tri-layer photolithography process. After the patterning of the top photoresist layer 162, the intermediate hardmask layer 160 and the BARC layer 158 may be patterned, leaving the pattern illustrated in FIGS. 21A, 21B, and 21C.

In some embodiments, because of the first tri-layer photolithography process to create openings 156 (see FIGS. 19A-19C), the three layers 158, 160 and 162 of the second tri-layer photoresist process may be patterned in a manner than directly exposes ILD 88 through an opening 156 (shown in FIGS. 19A, 19B, 19C) that was previously created in ILD 100. For example, in some embodiments, after the patterning of the three layers 158, 160 and 162 of the second tri-layer photoresist process, sidewalls of an opening in ILD 100 may extend on at least two sides of openings in the three layers 158, 160 and 162. In some embodiments, layers 158, 160 and 162 may be patterned to expose only ILD 88 and not any portions of ILD 100. In some embodiments, the three layers 158, 160 and 162 of the second tri-layer photoresist process may be patterned in a manner that exposes portions of ILD 100 in addition to ILD 88.

Figure 22A:
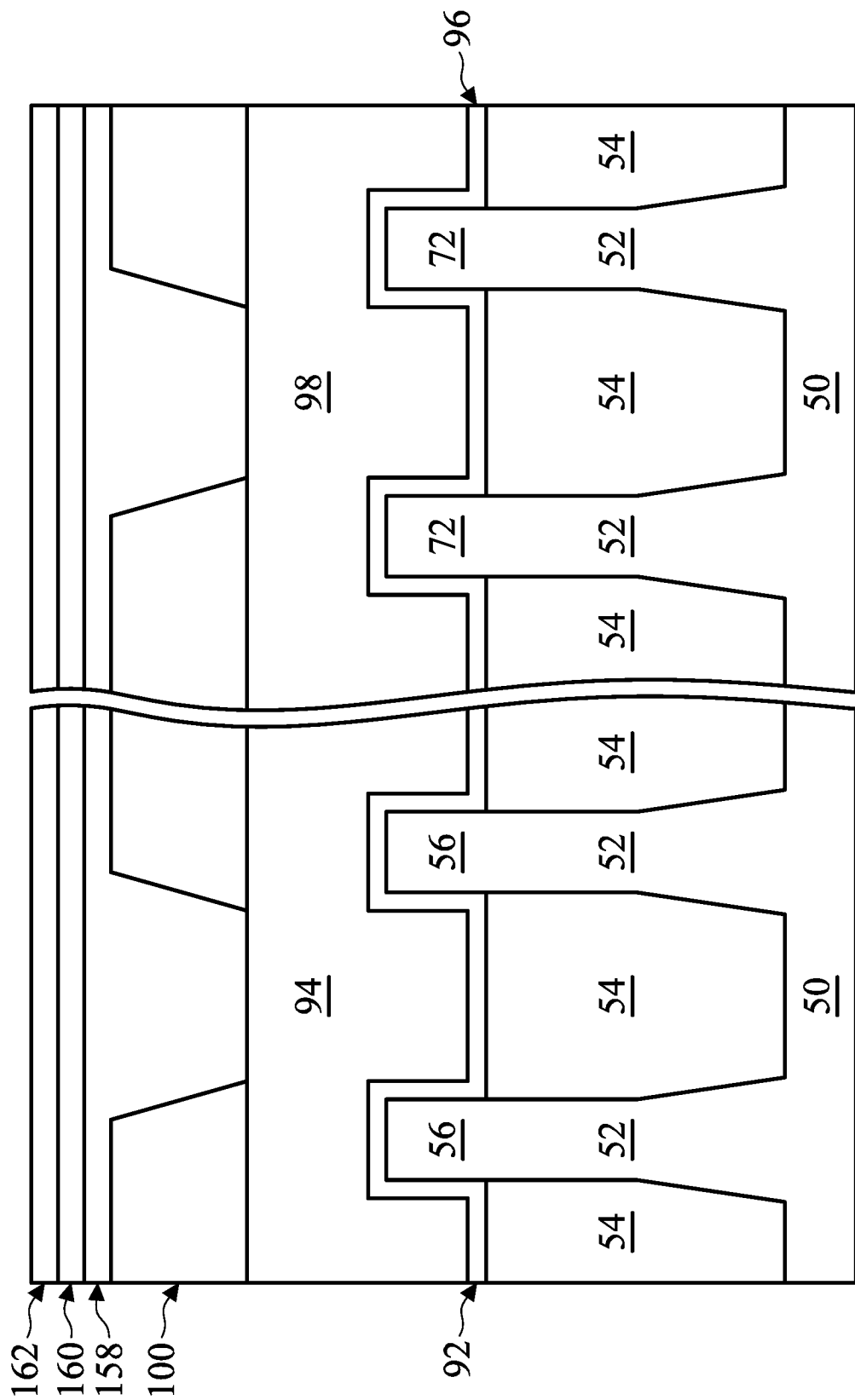
Figure 22B:
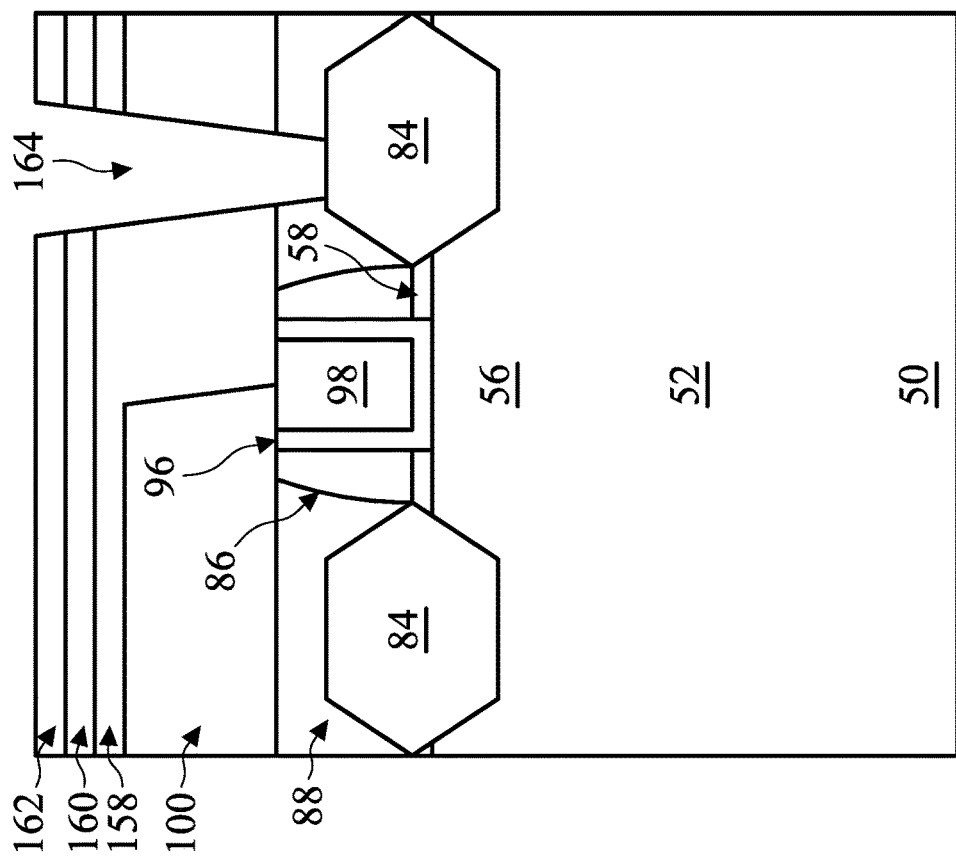
Figure 22C:
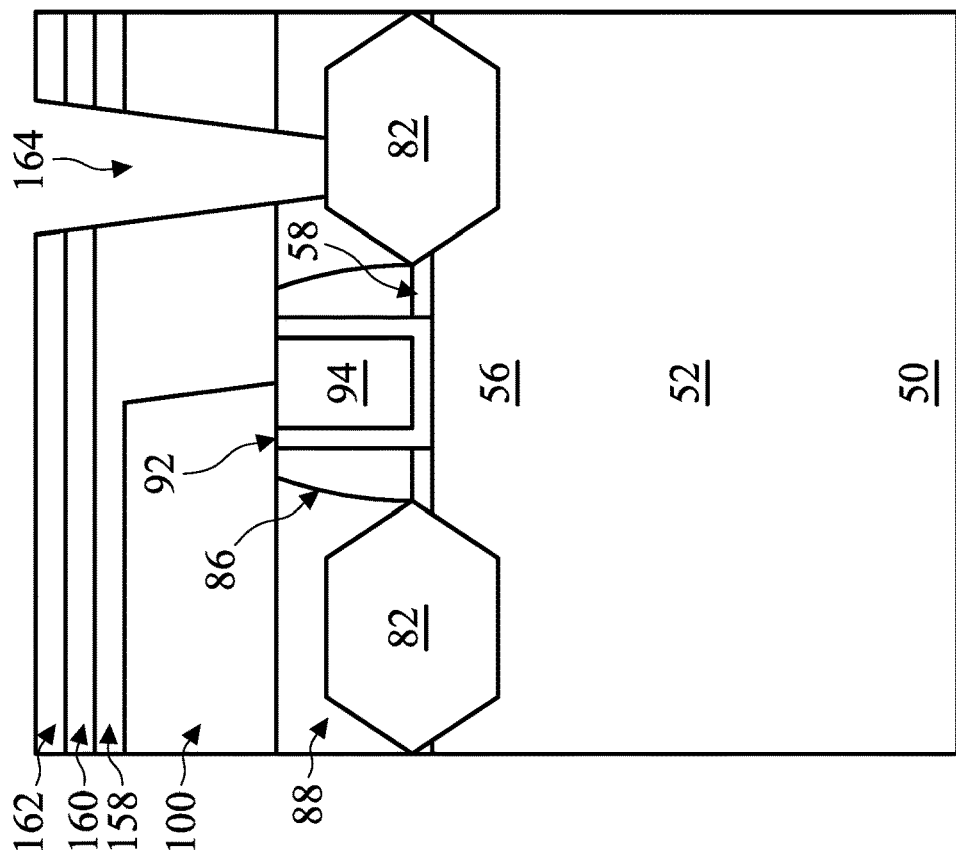

Next, referring to FIGS. 22A, 22B, and 22C, ILD 88 is patterned using layers 158, 160, and 162 as a mask to form openings 164. Openings 164 extend openings 156 in ILD 100 (See FIGS. 19A, 19B, and 19C) that exposes a gate electrode 94/98 to also expose a portion of the epitaxial source/drain region 82/84 to which the gate electrode 94/98 will be electrically connected (See FIGS. 24A-24C). In some embodiments, openings 164 expose only a portion of a top surface of the epitaxial source/drain region 82/84. In some embodiments, a whole top surface of an epitaxial source/drain region 82/84 may be exposed by an opening 164. As shown in FIGS. 22A, 22B and 22C, in some embodiments ILD 88 extends along sidewalls of openings 164. In some embodiments, ILD 88 may extend between an opening 164 and a gate spacer 86. In some embodiments, openings 164 may have tapered sidewalls. In some embodiments, sidewalls of openings 164 may form an angle with a bottom surface of openings 164 of about 90 degrees to about 95 degrees, such as about 92 degrees.

ILD 88 may be patterned using layers 158, 160, and 162 as a mask to form openings 164 using any suitable etching process. In some embodiments, atomic layer etching may be used. In some embodiments, a duration of the etching process for performing the etch may be calculated according to process parameters. In some embodiments, over etching may be used where the etching process continues past the calculated duration, such as an over etching of 33%. In some embodiments it may be desirable to avoid the use of a plasma etching process to avoid the creation of residue in openings 164.

Figure 23A:
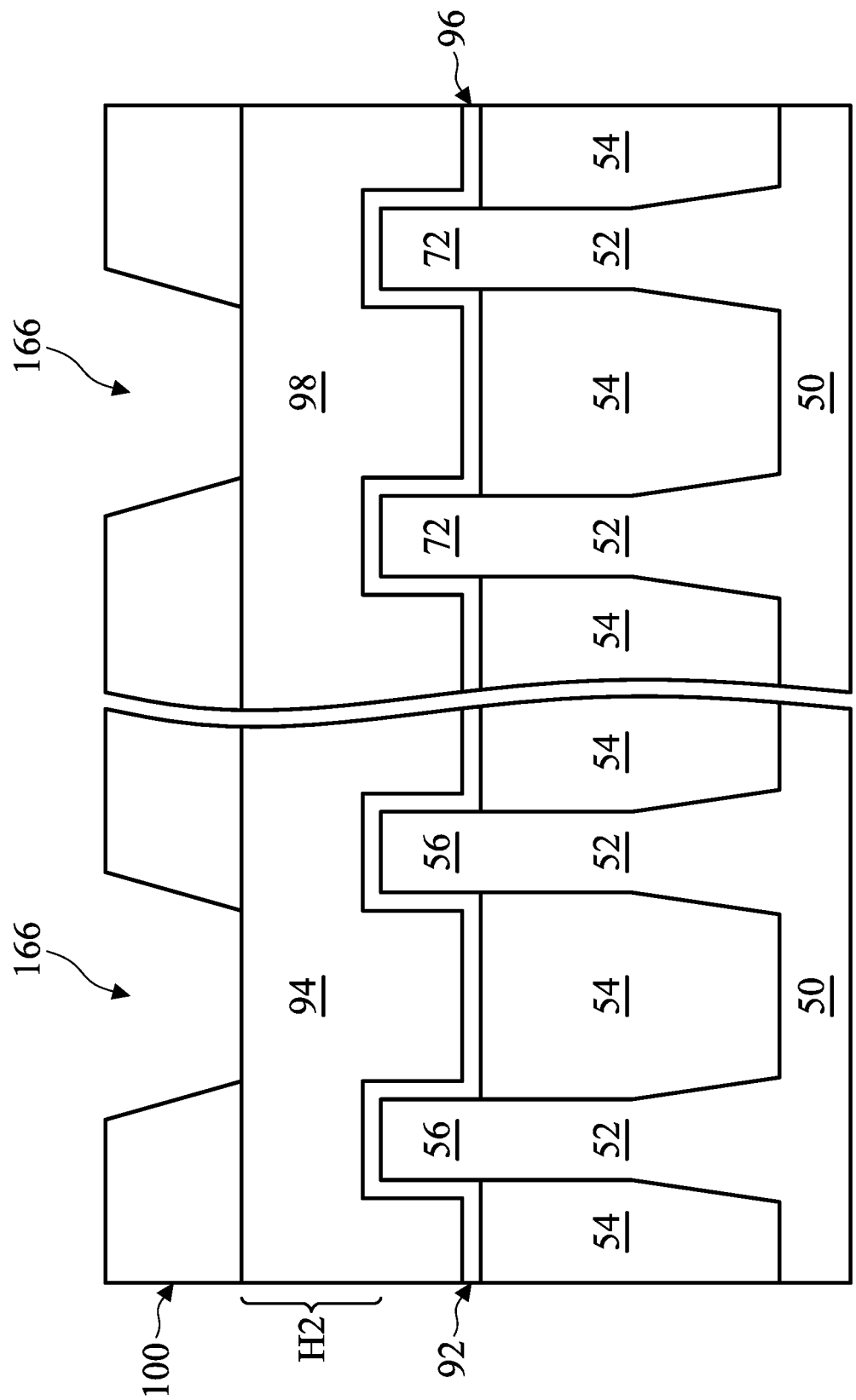
Figure 23C:
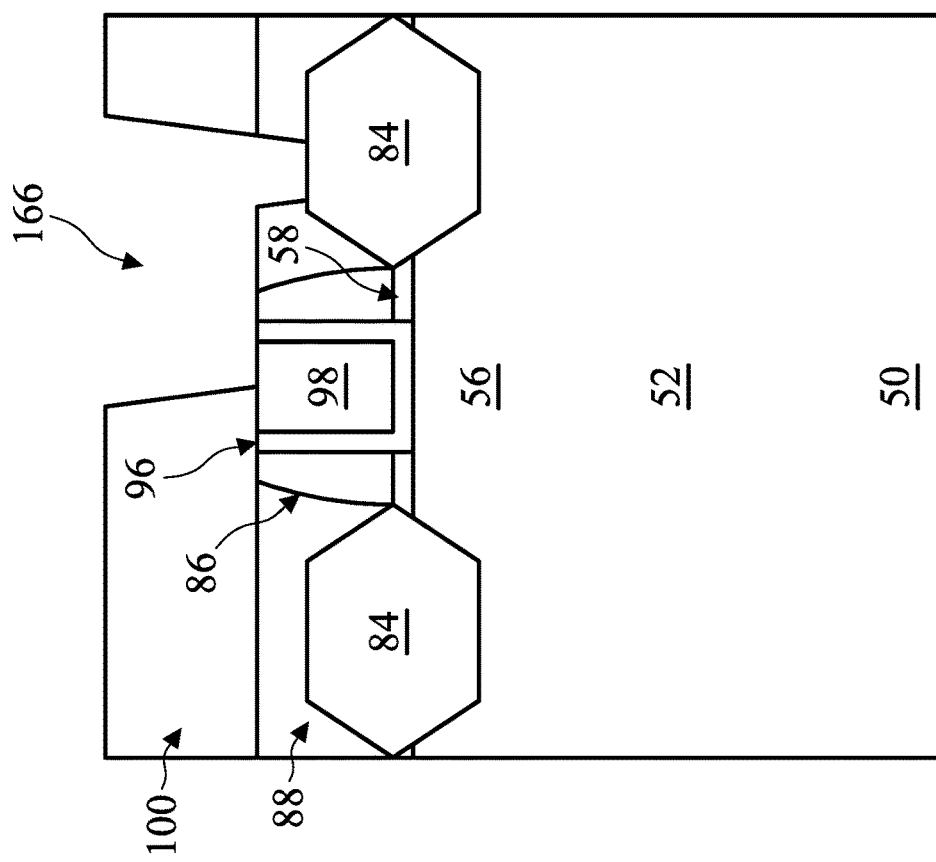
Figure 23B:
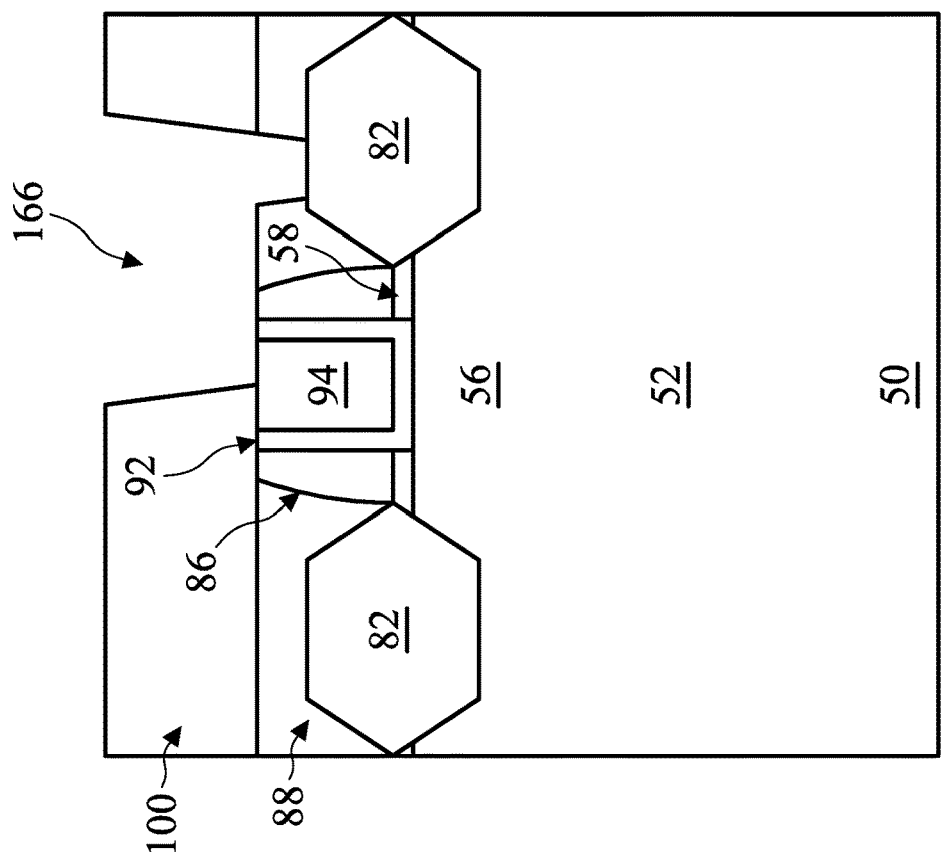

Referring to FIGS. 23A, 23B and 23C, layers 158, 160 and 162 are removed, for example using an ashing process. The resulting structure is depicted in FIGS. 23A, 23B and 23C. ILD 88 and ILD 100 have been patterned to create an opening 166 that exposes at least a portion of a gate electrode 94/98 and at least a portion of an epitaxial source/drain region 82/84. Opening 166 may have a first sidewall that extends along both ILD 100 and ILD 88. Opening 166 may have a second sidewall that extends along only ILD 88 and a third sidewall that extends along only ILD 100. A bottom surface of opening 166 may extend along gate electrode 98/94, ILD 88 and gate dielectric layer 92/96. A section of ILD 88 may extend between the second sidewall of opening 166 and a gate spacer 86. After the creation of opening 166, gate electrodes 94/98 may have a height H2 of 150 Å to 200 Å, such as about 180 Å. After the second patterning process to create opening 166, an angle between a top surface of a gate electrode 94/98 and a sidewall of the gate electrode 94/98 in opening 166 may be substantially perpendicular.

Figure 24A:
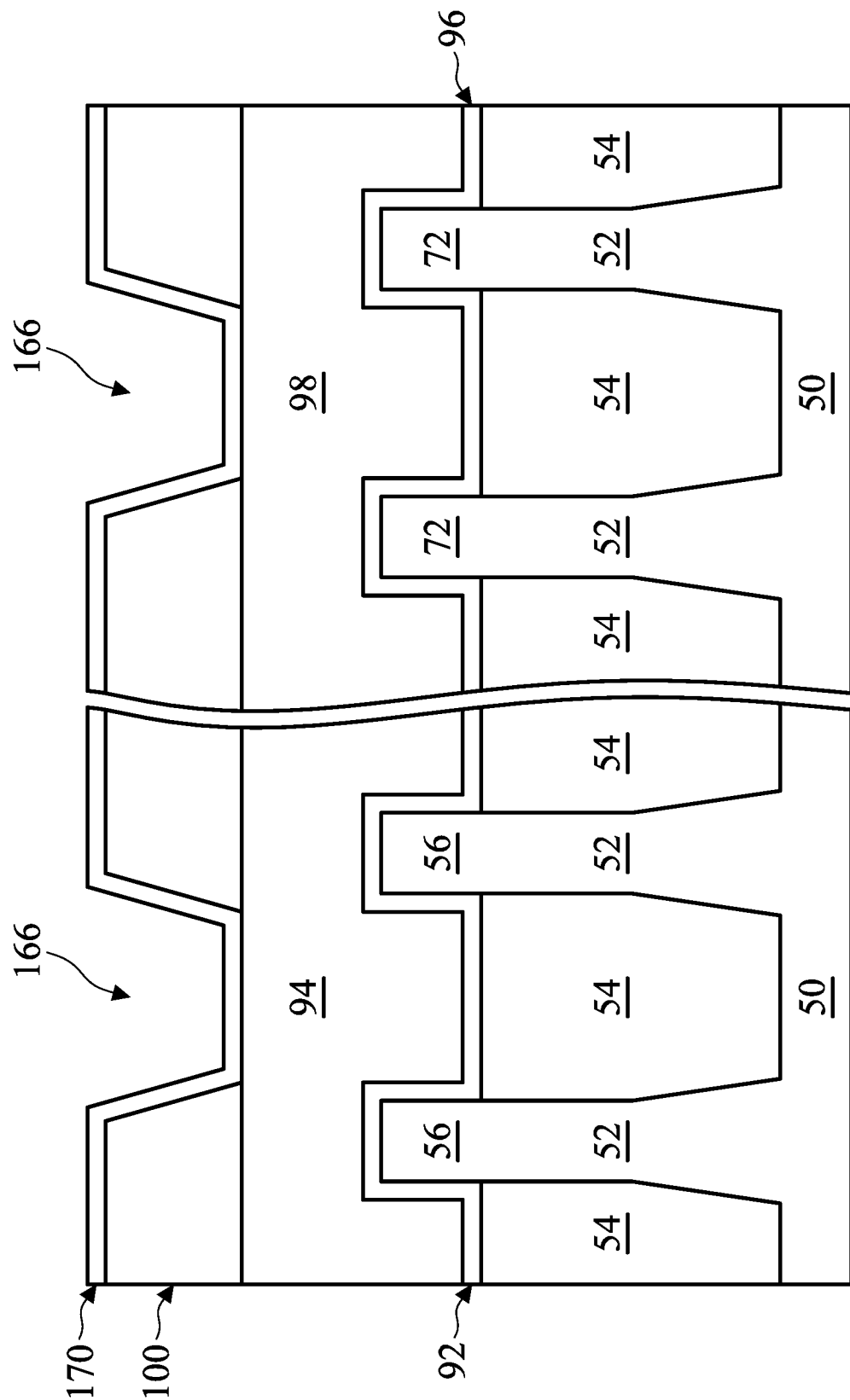
Figure 24C:
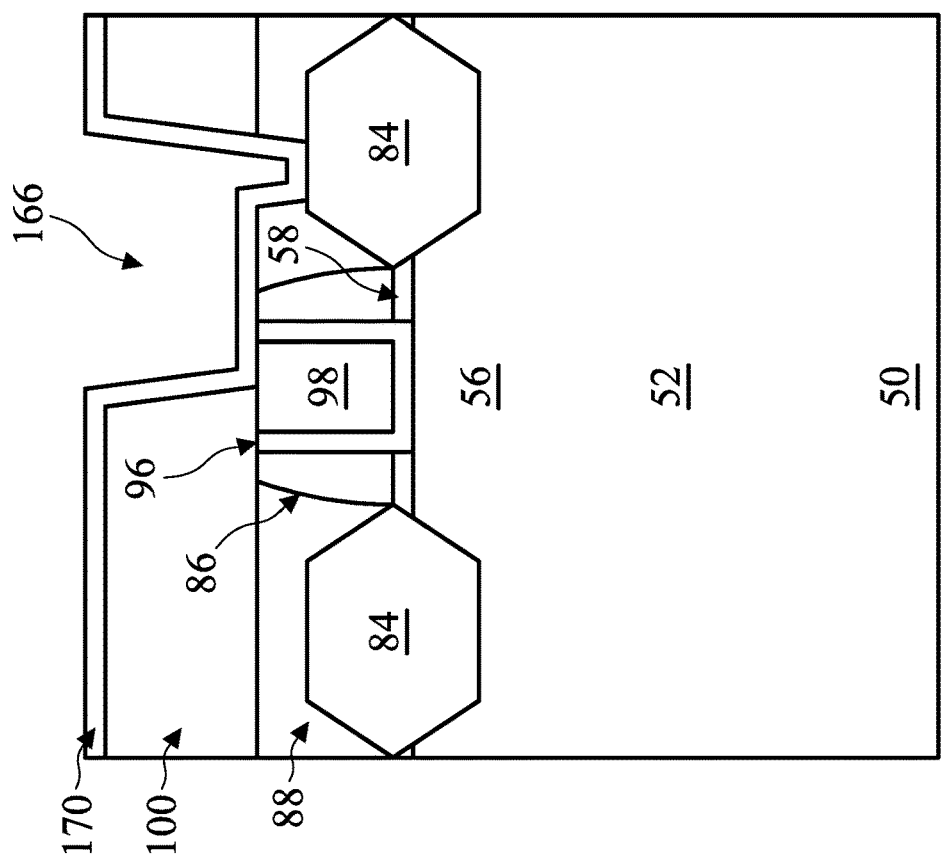
Figure 24B:
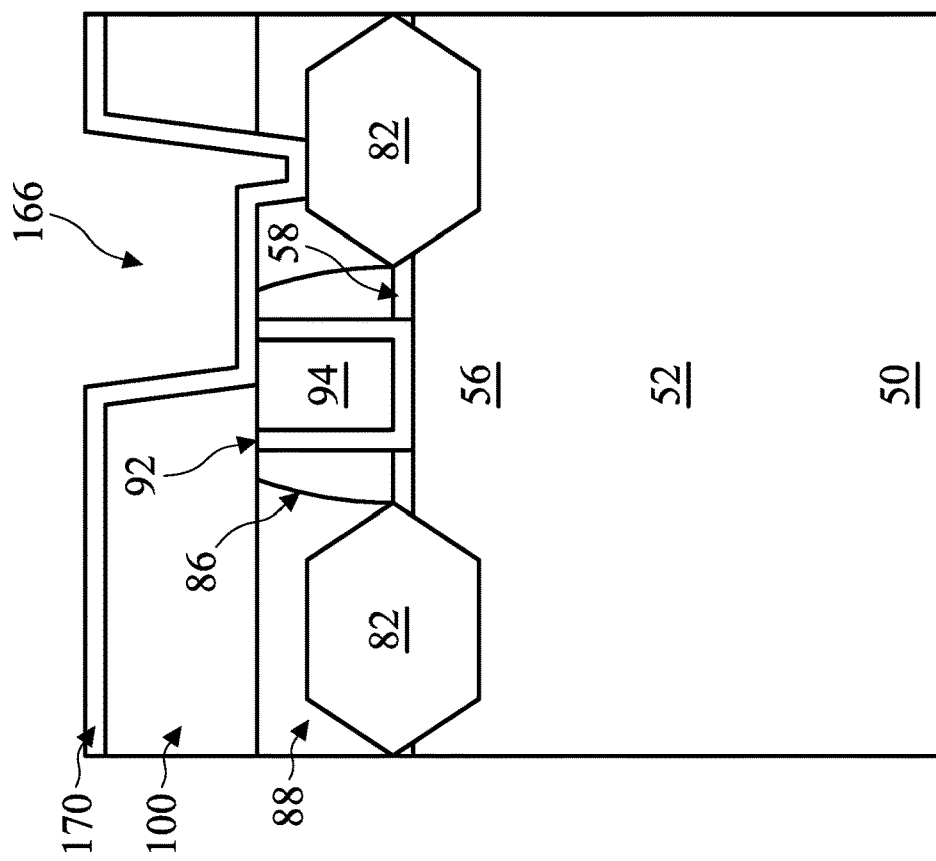

FIGS. 24A-C through 26A-C depict the formation of an electrical connector 174 (See FIGS. 26A-C) that is formed in an opening 166. First, FIGS. 24A-C illustrate the formation of a barrier layer 170 in openings 166. Barrier layer 170 may cover sidewalls and a bottom surface of openings 166. Barrier layer 170 may comprise, for example, titanium nitride, titanium oxide, tantalum nitride, tantalum oxide or the like. Barrier layer 170 may be deposited using any suitable deposition process, such as CVD, PVD, a conformal deposition process, or the like.

Figure 25A:
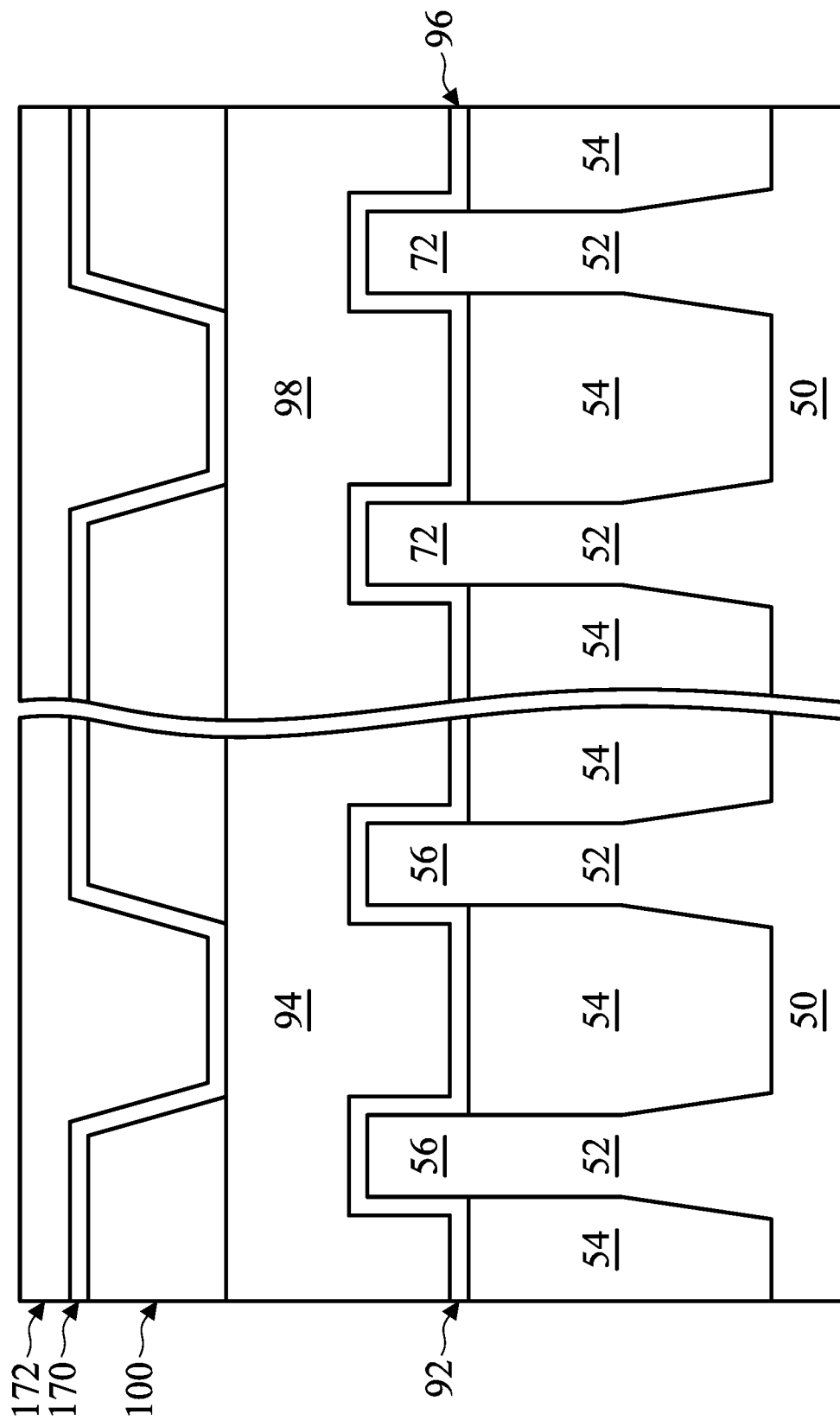
Figure 25C:
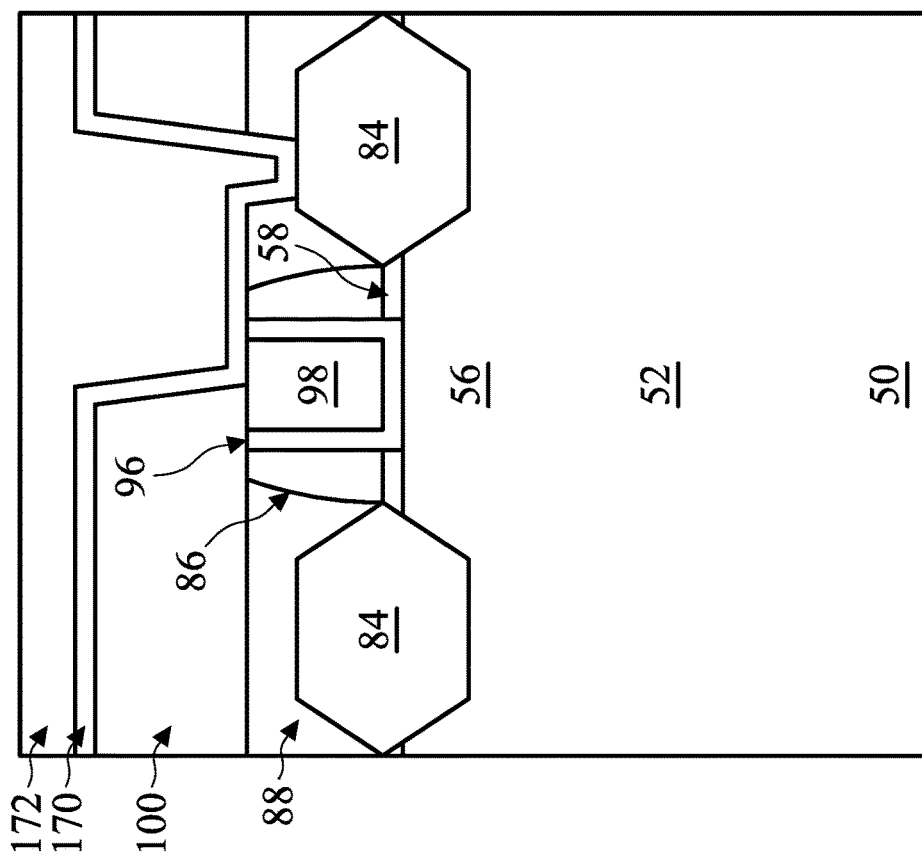
Figure 25B:
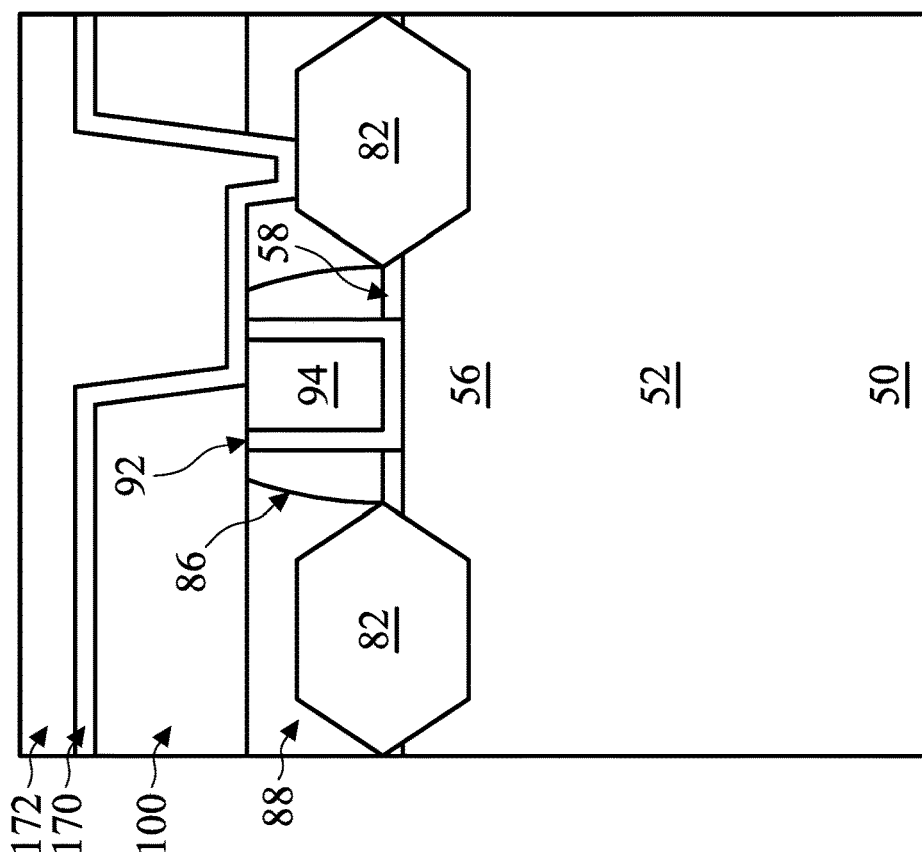
Figure 26A:
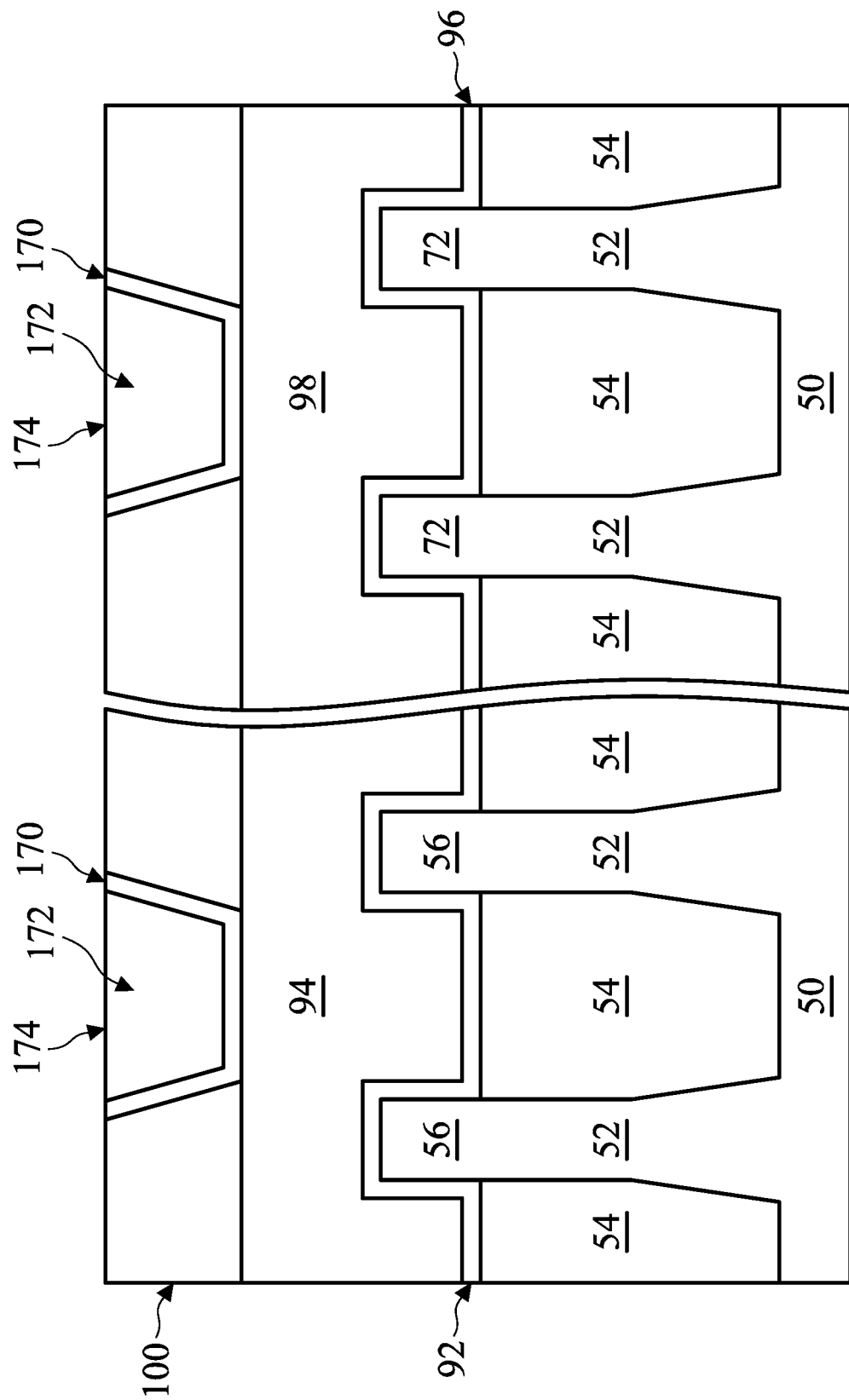
Figure 26C:
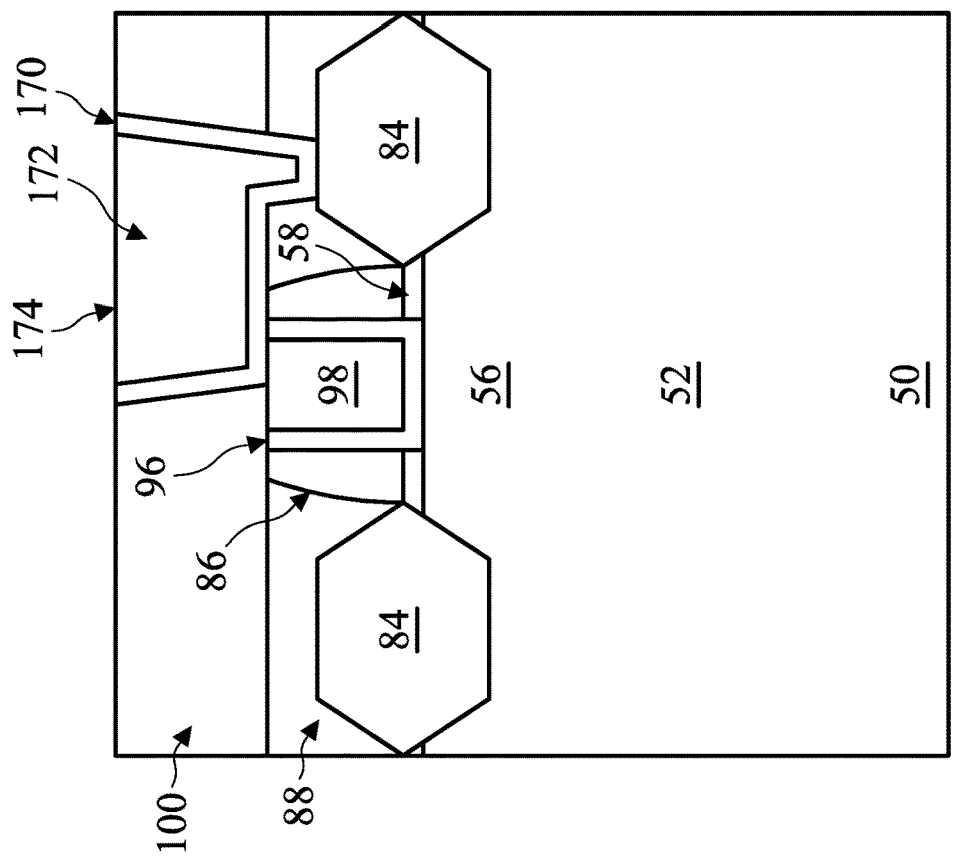
Figure 26B:
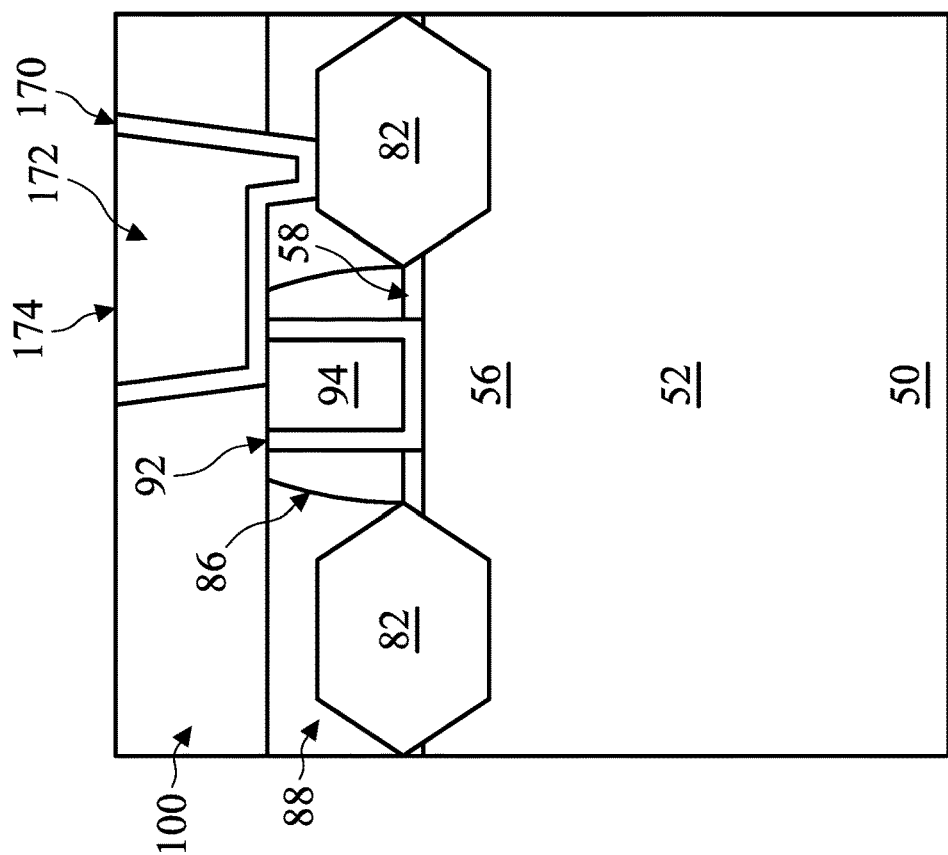

FIGS. 25A-C illustrate the filling of openings 166 with a metallic material 172 such as copper, a copper alloy, tungsten, aluminum, or another suitable conductor. The deposition of the metallic material 172 may overflow opening 166 and extend along a top surface of ILD 100. Subsequently, as illustrated by FIGS. 26A-26C, a planarization (e.g., CMP or etch back) maybe used to remove overflow portions. The resulting structure is depicted in FIGS. 26A-26C.

As shown in FIGS. 26A-26C, electrical connector 174 may have a profile that conforms to the profile of opening 166 (shown in FIGS. 23A-23C). Electrical connector 174 may physically contact gate electrode 94/98 and an epitaxial source/drain region 82/84, thereby forming an electrical connection between gate electrode 94/98 and epitaxial source/drain region 82/84.

Although not explicitly shown, a person having ordinary skill in the art will readily understand that further processing steps may be performed on the structure in FIGS. 26A, 26B, and 26C. In subsequent processing, additional ILD or Inter-Metal Dielectrics (IMD) layers may be deposited over ILD 100. Interconnects may be formed in overlying ILD or IMD layers to contact electrical connector 174, which may allow electrical connector 174 to electrically connect to other components in a same package or in a different package.

As described above, an electrical connector is formed that electrically connects an epitaxial source/drain region to a gate electrode. In some embodiments, a second dielectric layer is patterned to expose the gate electrode, and then a first dielectric layer is patterned through an opening created in the second dielectric layer to expose the epitaxial source/drain region. By patterning the second dielectric layer to expose the gate electrode, and then patterning the first dielectric layer to expose the epitaxial source/drain region, it may possible to avoid the use of a plasma etching process. If a plasma etching process is used, then the plasma etching process may leave behind residue in the openings created by the plasma etching process. An oxygen treatment may need to be performed to remove the residue created by the plasma etching. However, the oxygen treatment may cause oxidation of the first dielectric layer and/or the second dielectric layer in the opening, which may negatively impact the RC constant of the finFET. By avoiding a plasma etching process, the residue and the subsequent oxidation of the ILD layers from the oxygen treatment may be avoided or minimized. Further, by first patterning the second dielectric layer to expose the gate electrode and then patterning the first dielectric layer to expose the epitaxial source/drain region, it may be possible to avoid a process of depositing a sacrificial film over the gate electrode to protect the gate electrode during the plasma etching process. By avoiding the need to deposit the sacrificial film, manufacturing may be streamlined and costs may be minimized.

According to some embodiments, a method is provided. The method includes forming a first dielectric layer over a transistor. The method also includes forming a second dielectric layer over the first dielectric layer. The method also includes forming a first opening in the second dielectric layer to expose at least a portion of a gate electrode of the transistor. The method also includes forming a second opening in the first dielectric layer to expose at least a portion of a source/drain region of the transistor. The second opening is connected to the first opening, and the first opening is formed before the second opening. The method also includes forming an electrical connector in the first opening and the second opening.

According to some embodiments, a method is provided. The method includes forming fin field effect transistor (finFET). The finFET includes a gate structure and a plurality of source/drain regions. The method also includes forming a first dielectric layer over the finFET. The method also includes planarizing a top surface of the first dielectric layer and a top surface of the gate structure. The method also includes forming a second dielectric layer over the first dielectric layer and the gate structure. The method also includes etching the second dielectric layer to form a first opening that exposes at least a portion of a gate electrode of the gate structure and a section of the first dielectric layer that overlies one of the plurality of source/drain regions. The method also includes etching the first dielectric layer through the first opening to expose at least a portion of the one of the plurality of source/drain regions. The method also includes forming an electrical connector in the first dielectric layer and the second dielectric layer, the electrical connector contacting the gate electrode and the portion of the one of the plurality of source/drain regions.

According to some embodiments a device is provided. The device includes a transistor including a gate structure and a plurality of source/drain regions. The device also includes a first dielectric layer extending along the gate structure and the plurality of source/drain regions. The device also includes a second dielectric layer overlying the first dielectric layer. The device also includes an electrical connector disposed in the first dielectric layer and in the second dielectric layer, the electrical connector contacting the gate structure and one of the plurality of source/drain regions. The first dielectric layer extends between an interface of the electrical connector and the one of the plurality of source/drain regions and an interface of the electrical connector and the gate structure, and an angle formed by the interface of the electrical connector and the gate structure and a sidewall of a gate electrode of the gate structure is substantially perpendicular.

A device is provided in accordance with some embodiments. The device includes a transistor comprising a gate electrode and a first source/drain region next to the gate electrode, the gate electrode being disposed over a first substrate. The device also includes a first dielectric layer extending along the first source/drain region. The device also includes a second dielectric layer overlying the first dielectric layer. The device also includes a contact disposed in the first dielectric layer and in the second dielectric layer, the contact contacting the gate electrode and the first source/drain region. A first portion of the first dielectric layer extends between the contact and the gate electrode. The contact extends along a sidewall of the first portion of the first dielectric layer and a first surface of the first portion of the first dielectric layer, the first surface of the first portion being farthest from the first substrate.

A device is provided in accordance with some embodiments. The device includes a transistor comprising a gate structure and a plurality of source/drain regions. The device also includes a first dielectric layer extending along the gate structure and the plurality of source/drain regions. The device also includes a second dielectric layer overlying the first dielectric layer. The device also includes an electrical connector disposed in the first dielectric layer and in the second dielectric layer, the electrical connector contacting the gate structure and a first source/drain region of the plurality of source/drain regions. The first dielectric layer extends between a first interface and a second interface, the first interface being an interface of the electrical connector and the first source/drain region, and the second interface being an interface of the electrical connector and the gate structure. An angle formed by the second interface and a sidewall of a gate electrode of the gate structure is substantially perpendicular.

A device is provided in accordance with some embodiments. The device includes a transistor comprising a gate structure and a plurality of source/drain regions. The device also includes a plurality of dielectric layers overlying the transistor. The device also includes an electrical connector extending through the plurality of dielectric layers, the electrical connector contacting a gate electrode of the gate structure and a first source/drain region of the plurality of source/drain regions. A first portion of the plurality of dielectric layers extends between the electrical connector and the gate structure, and between the first source/drain region and the gate structure. The first portion of the plurality of dielectric layers contacts the electrical connector on a first surface of the first portion and a second surface of the first portion, the first surface of the first portion being non-planar with the second surface of the first portion. A shape of the first portion, in a cross-sectional view, is defined by the gate structure, the first source/drain region, and the electrical connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a gate structure formed over a substrate;
    a gate spacer adjacent the gate structure;
    a first source/drain region next to the gate structure;
    a dielectric layer extending from the gate structure to the first source/drain region, the dielectric layer separating the gate spacer from the substrate;
    a first dielectric layer extending along the gate structure, wherein top surfaces of the gate structure, the gate spacer, and the first dielectric layer are planar and coplanar;
    a second dielectric layer over the first dielectric layer; and
    an electrical connector disposed in the first dielectric layer and the second dielectric layer, wherein the electrical connector contacts the gate structure and the first source/drain region, wherein the first dielectric layer extends between the electrical connector and the gate structure, wherein the first dielectric layer contacts the gate spacer, the electrical connector, and the first source/drain region, and wherein a corner of the electrical connector is laterally above the top of the gate structure.

2. The device according to claim 1, wherein the second dielectric layer contacts the top surface of the gate structure.

3. The device according to claim 2, wherein the electrical connector contacts the top surface of the first dielectric layer.

4. The device according to claim 1, wherein a height of the electrical connector is greater in the second dielectric layer than in the first dielectric layer.

5. The device according to claim 1, wherein a height of the second dielectric layer is in a range of 650 Å to 750 Å.

6. The device according to claim 1, wherein a height of the gate structure is in a range of 150 Å to 200 Å.

7. The device according to claim 1, wherein a ratio of a height of the second dielectric layer to a height of the gate structure is in a range of 3.25 to 5.

8. The device according to claim 1, wherein the gate structure comprises a gate electrode, and a top surface of the gate electrode is perpendicular to an interface of the gate spacer and the gate electrode.

9. A device, comprising:
    a transistor comprising a gate structure, a spacer extending along the gate structure, and a first source/drain region disposed at least in part in a substrate;
    a dielectric layer separating the spacer from the substrate, the dielectric layer extending from the gate structure to the first source/drain region;
    a first dielectric layer, wherein the first dielectric layer is level with a surface of the gate structure that is farthest from the substrate;
    a second dielectric layer overlying the first dielectric layer; and
    an electrical connector extending through the first dielectric layer and the second dielectric layer, wherein a height of the electrical connector is greater in the second dielectric layer than in the first dielectric layer, and wherein the electrical connector contacts the first source/drain region and the gate structure.

10. The device according to claim 9, wherein a width of the electrical connector is greater in the second dielectric layer than in the first dielectric layer.

11. The device according to claim 9, wherein a height of the gate structure is in a range of 150 Å to 200 Å.

12. The device according to claim 9, wherein a first sidewall of the electrical connector extends from the gate structure to a surface of the second dielectric layer that is farthest from the substrate, and a second sidewall of the electrical connector extends from the first source/drain region to a surface of the first dielectric layer.

13. The device according to claim 9, wherein the electrical connector contacts only a portion of the surface of the gate structure that is farthest from the substrate.

14. The device according to claim 9, wherein a sidewall of the electrical connector extends from the first source/drain region to a surface of the second dielectric layer that is farthest from the substrate.

15. A device, comprising:
 a first source/drain region formed in a substrate;
 a gate structure disposed over the substrate beside the first source/drain region, wherein a plurality of spacers extends along the gate structure;
 one or more first dielectric layers contacting the first source/drain region, the gate structure, the substrate, and the plurality of spacers, wherein the plurality of spacers is spaced apart from the substrate;
 one or more dielectric layers disposed over the first source/drain region; and
 an electrical connector extending through the one or more dielectric layers, wherein the electrical connector contacts the first source/drain region and the electrical connector extends over the gate structure and extends over a first dielectric layer of the one or more dielectric layers, wherein a top surface of the gate structure is level between a first spacer of the plurality of spacers and a second spacer of the plurality of spacers, the first spacer is closest to the first source/drain region, and the top surface of the gate structure is perpendicular to an interface of the first spacer and the gate structure, wherein a lateral edge of the first source/drain region is aligned with a lateral edge of the first spacer in a direction perpendicular to a major surface of the substrate, and wherein a top surface of the first spacer is level and extends from the first dielectric layer to the gate structure.

16. The device according to claim 15, wherein a portion of the one or more dielectric layers extends between a portion of the electrical connector that contacts the first source/drain region and the first spacer.

17. The device according to claim 16, wherein a surface of the portion of the one or more dielectric layers is level between the portion of the electrical connector that contacts the first source/drain region and the first spacer, and wherein the surface of the portion of the one or more dielectric layers is farthest from the substrate.

18. The device according to claim 15, wherein the one or more dielectric layers comprises a second dielectric layer, an interface of the first dielectric layer and the second dielectric layer is level with the top surface of the gate structure, and a corner of the electrical connector contacts an interface of the gate structure and the second dielectric layer.

19. The device according to claim 18, wherein a height of the plurality of spacers is in a range of 150 Å to 200 Å.

20. The device according to claim 19, wherein a ratio of a height 9150 of the second dielectric layer to the height of the plurality of spacers is in a range of 3.25 to 5.

\* \* \* \* \*